United States Patent
Omura

(10) Patent No.: US 7,781,280 B2
(45) Date of Patent: Aug. 24, 2010

(54) SEMICONDUCTOR DEVICE WITH CAPACITOR AND FUSE AND ITS MANUFACTURE METHOD

(75) Inventor: Masayoshi Omura, Hamamatsu (JP)

(73) Assignee: Yamaha Corporation, Shizuoka-ken (JP)

(*) Notice: Subject to any disclaimer, the term of this patent is extended or adjusted under 35 U.S.C. 154(b) by 0 days.

(21) Appl. No.: 11/797,483

(22) Filed: May 3, 2007

(65) Prior Publication Data

US 2007/0207579 A1    Sep. 6, 2007

Related U.S. Application Data

(63) Continuation of application No. 10/971,674, filed on Oct. 25, 2004.

(30) Foreign Application Priority Data

Oct. 24, 2003  (JP)  ............... 2003-364829
Oct. 13, 2004  (JP)  ............... 2004-298403

(51) Int. Cl.
*H01L 21/8249* (2006.01)

(52) U.S. Cl. .............. 438/215; 438/200; 438/210; 438/239; 438/250; 438/281; 438/333; 438/467; 438/601

(58) Field of Classification Search ............ 438/132, 438/200, 210, 215, 239, 243, 250, 253, 281, 438/333, 467, 601, FOR. 220, FOR. 430
See application file for complete search history.

(56) References Cited

U.S. PATENT DOCUMENTS

| 4,876,220 | A | 10/1989 | Mohsen et al. |
| 6,130,469 | A | 10/2000 | Bracchitta et al. |
| 6,804,159 | B2 | 10/2004 | Kamiya et al. |

| 2002/0003280 | A1 | 1/2002 | Kohyama |
| 2002/0033710 | A1* | 3/2002 | Kim .................. 324/765 |

FOREIGN PATENT DOCUMENTS

| JP | 60-261154 | 12/1985 |
| JP | 62-238658 | 10/1987 |
| JP | 02-290078 | 11/1990 |
| JP | 3-52254 | 3/1991 |

(Continued)

OTHER PUBLICATIONS

Korean Office Action issued Apr. 27, 2006.

*Primary Examiner*—N Drew Richards
*Assistant Examiner*—JoAnnie A Garcia
(74) *Attorney, Agent, or Firm*—Dickstein Shapiro LLP

(57) ABSTRACT

An upper electrode of a capacitor has a two-layer structure of first and second upper electrodes. A gate electrode of a MOS field effect transistor and a fuse are formed by patterning conductive layers used to form the lower electrode, first upper electrode and second upper electrode of the capacitor. In forming a capacitor and a fuse on a semiconductor substrate by a conventional method, at least three etching masks are selectively used to pattern respective layers to form the capacitor and fuse before wiring connection. The number of etching masks can be reduced in manufacturing a semiconductor device having capacitors, fuses and MOS field effect transistors so that the number of processes can be reduced and it becomes easy to improve the productivity and reduce the manufacture cost.

5 Claims, 34 Drawing Sheets

FOREIGN PATENT DOCUMENTS

| | | |
|---|---|---|
| JP | 04-365351 | 12/1992 |
| JP | 06-283665 | 10/1994 |
| JP | 07-130861 | 5/1995 |
| JP | 08-274257 | 10/1996 |
| JP | 11-195753 | 7/1999 |
| JP | 11-307640 | 11/1999 |
| JP | 3092790 | 7/2000 |
| JP | 2000-349166 | 12/2000 |
| JP | 2003-209174 | 7/2003 |

\* cited by examiner

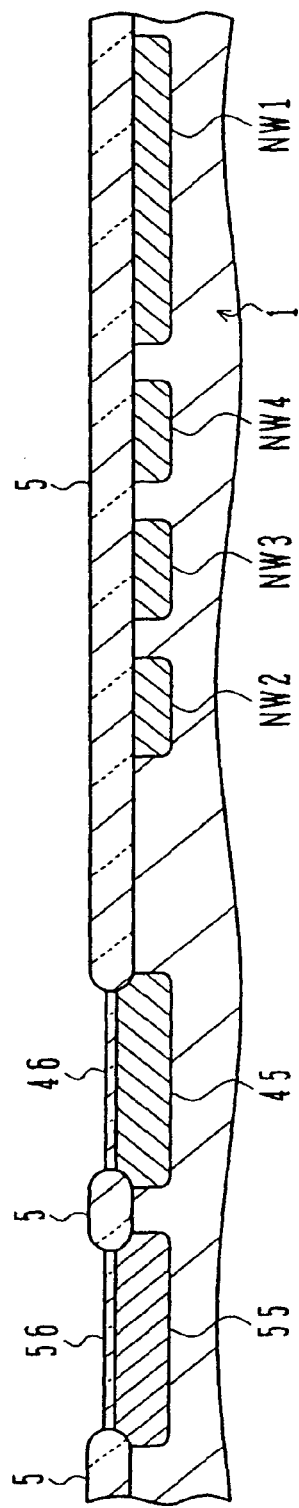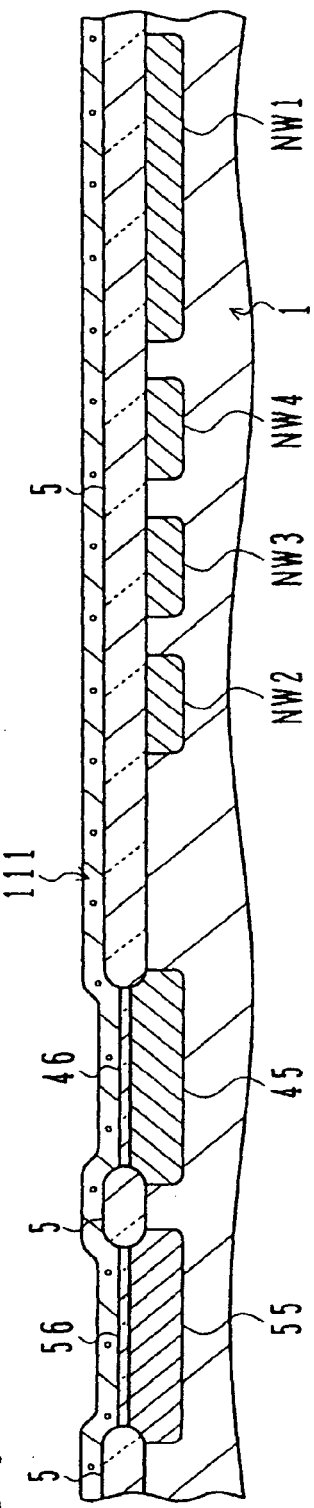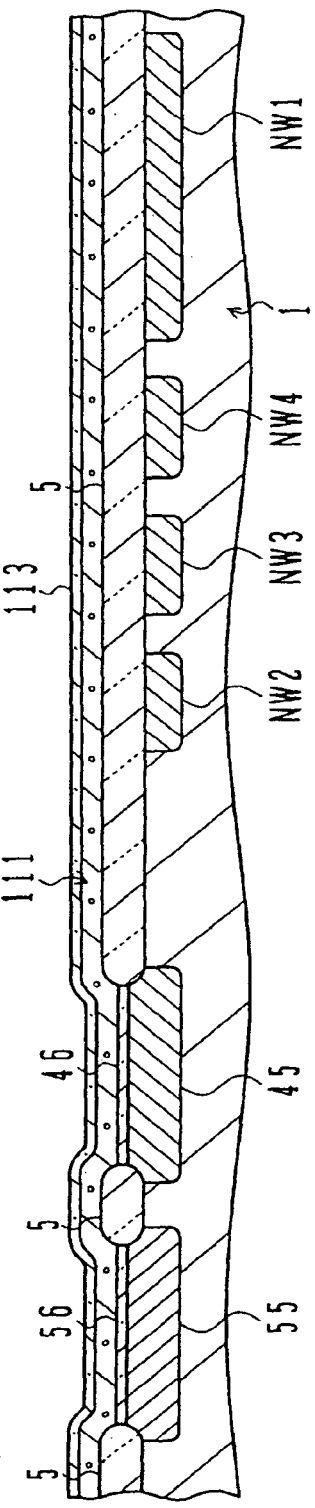

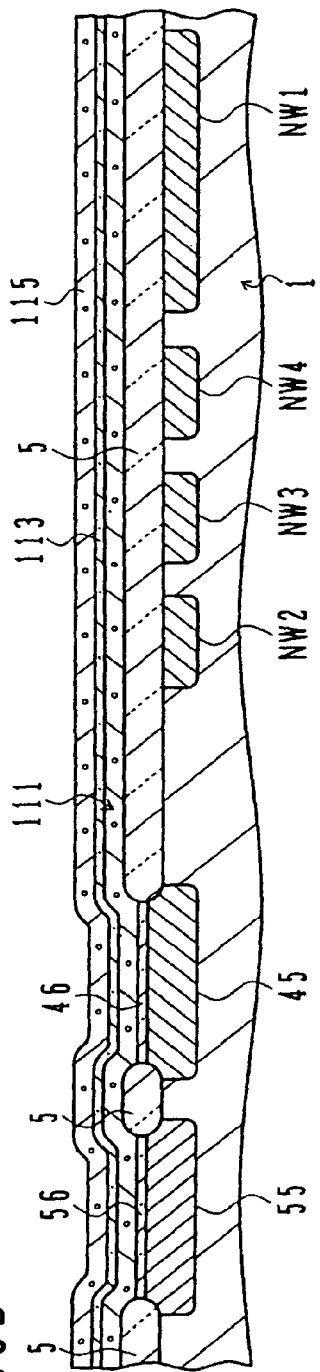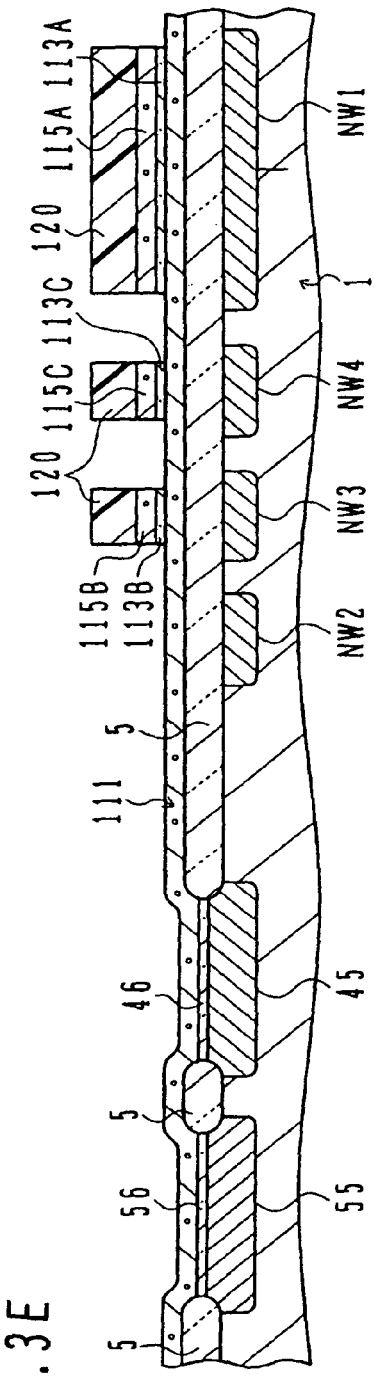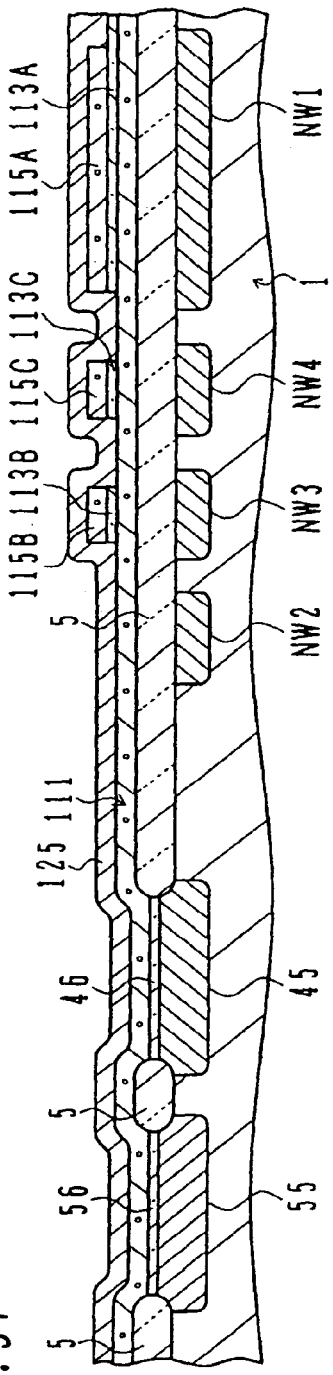

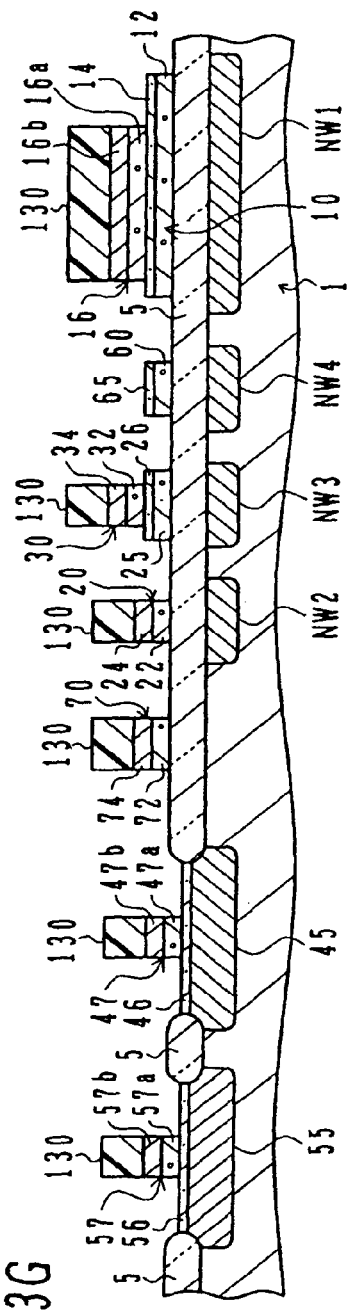
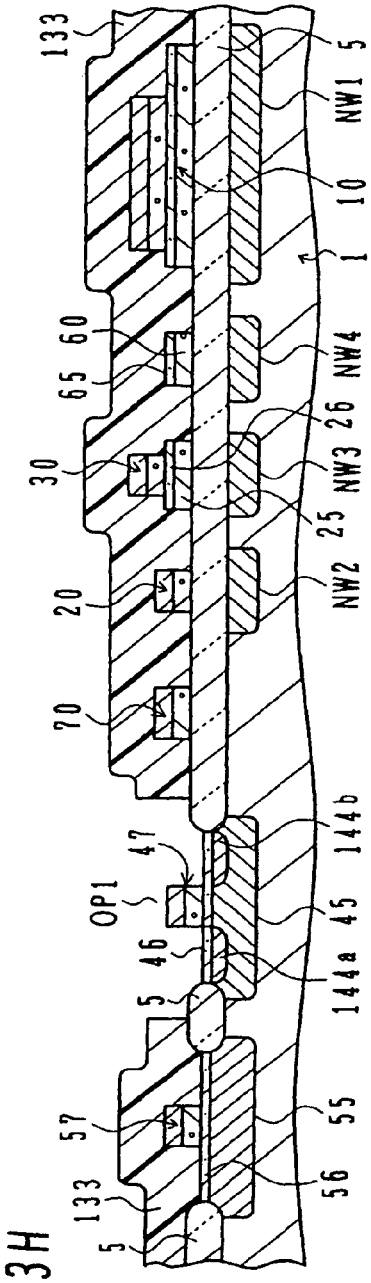
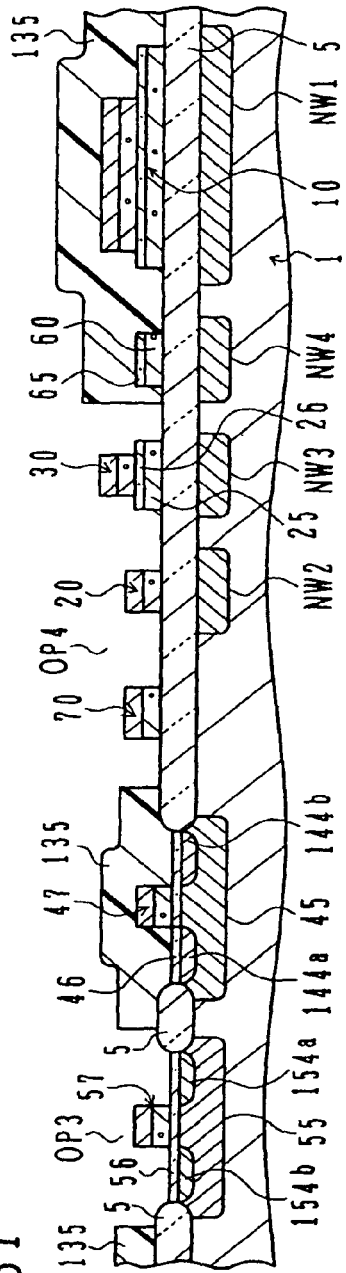
FIG.3G
FIG.3H
FIG.3I

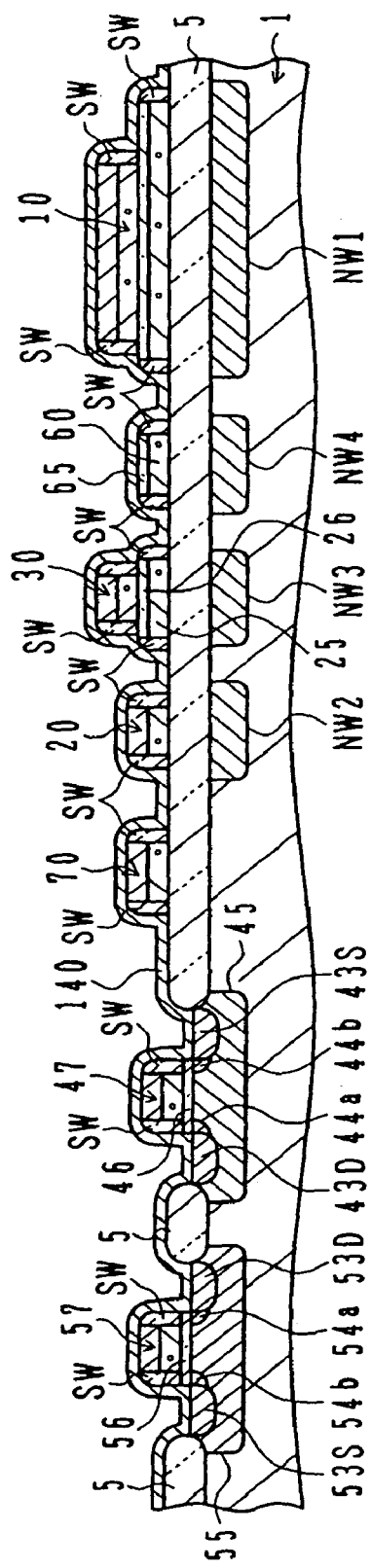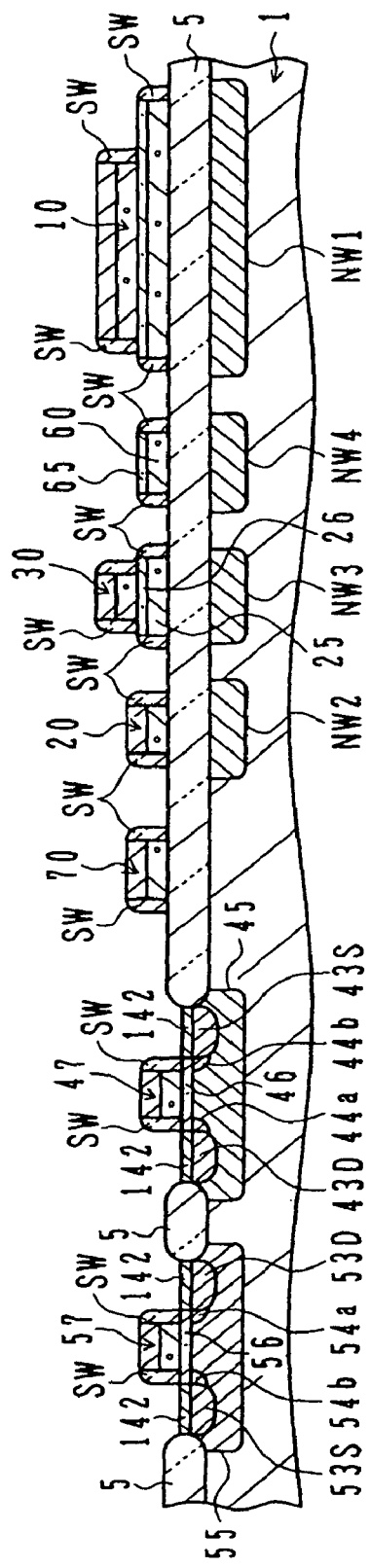

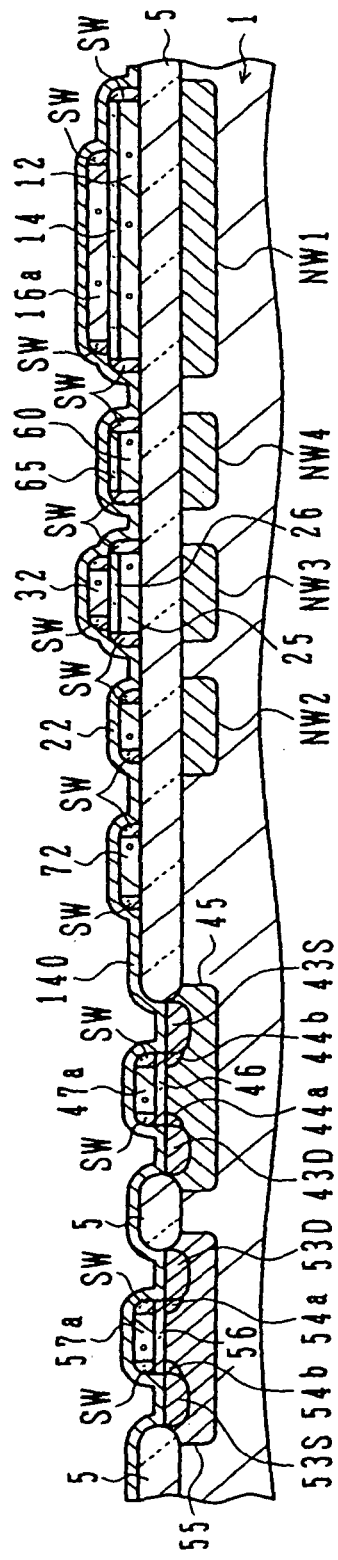
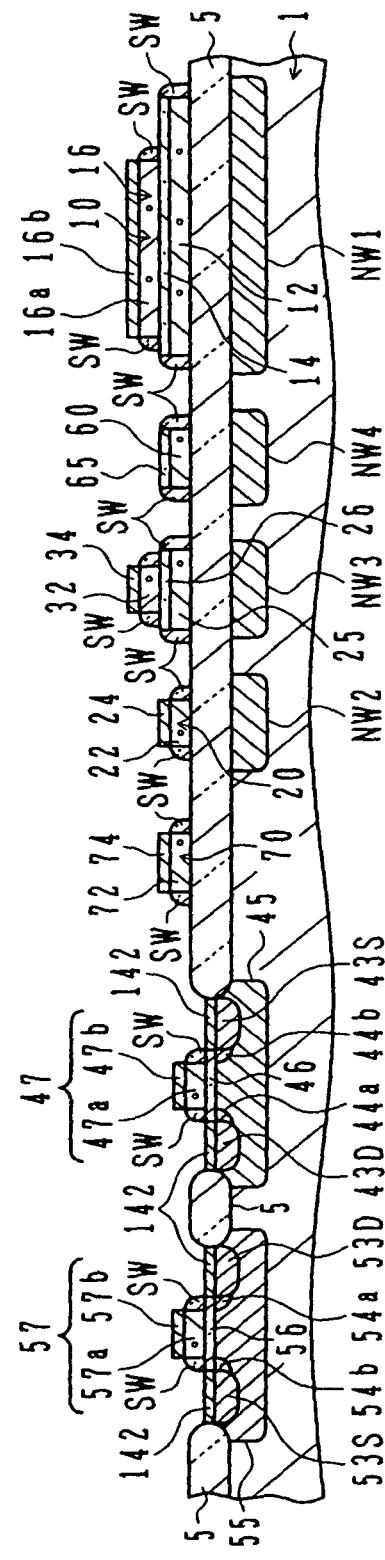
FIG.12A
FIG.12B

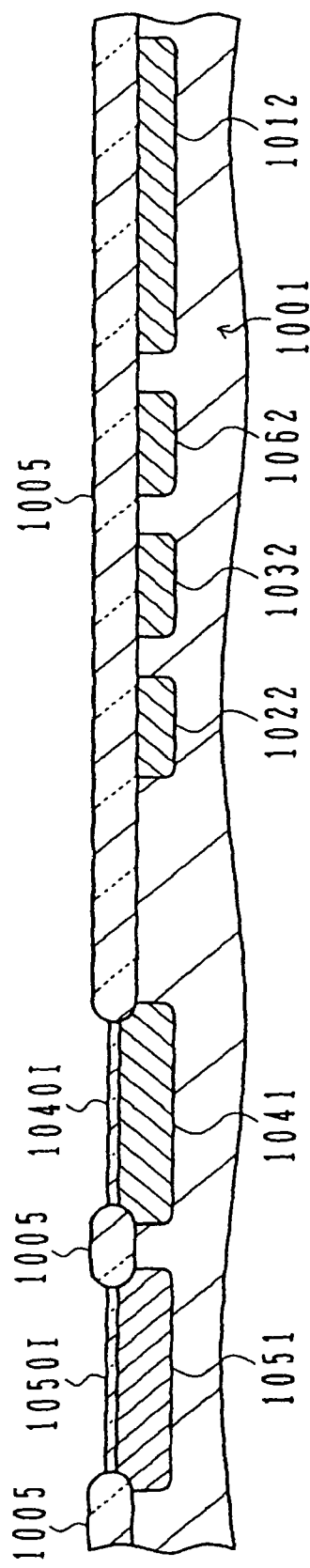
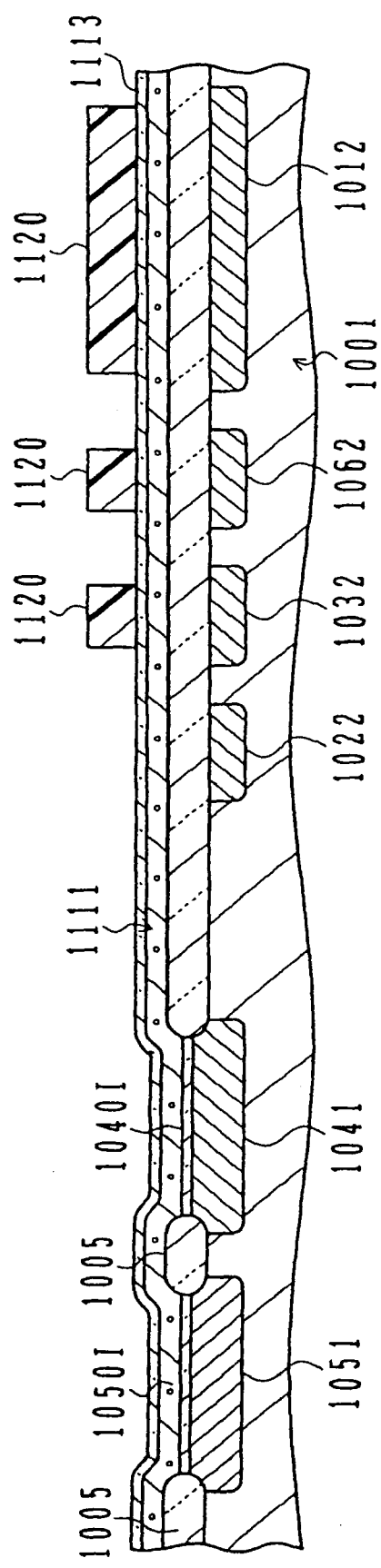
FIG.15A
FIG.15B

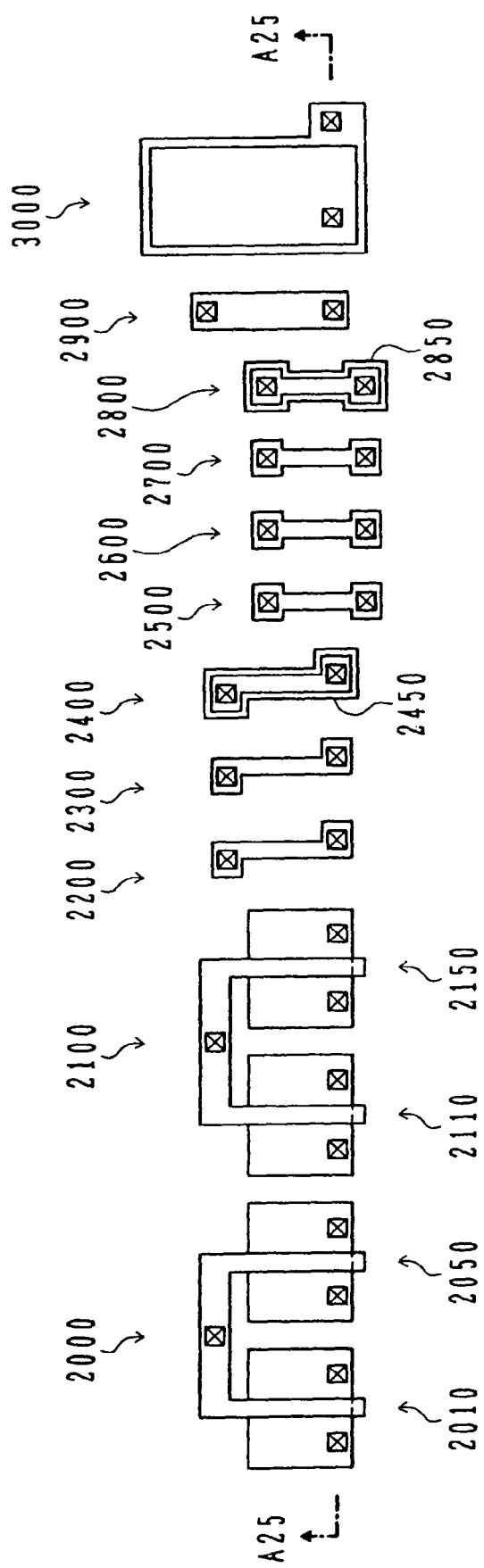

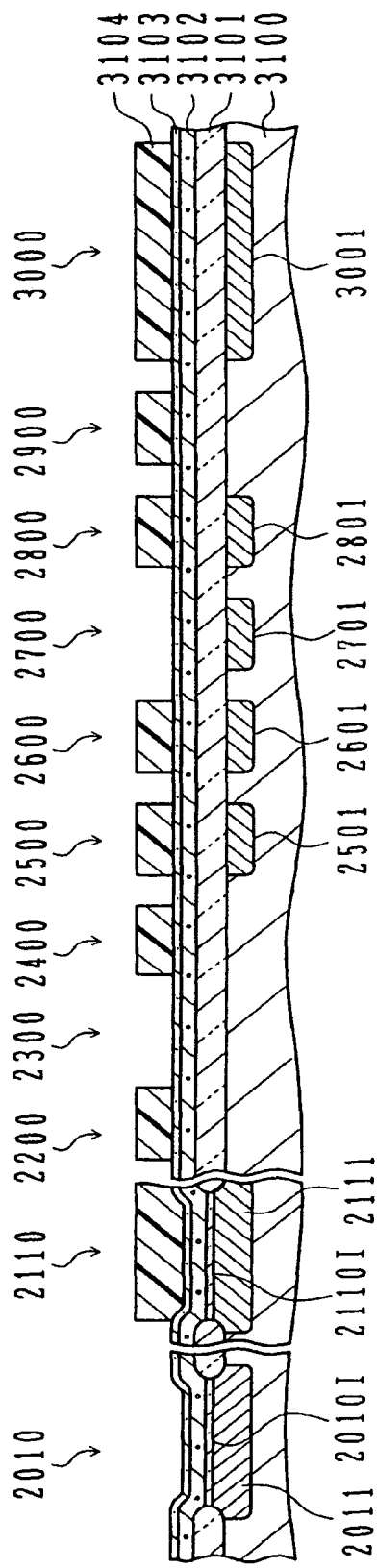
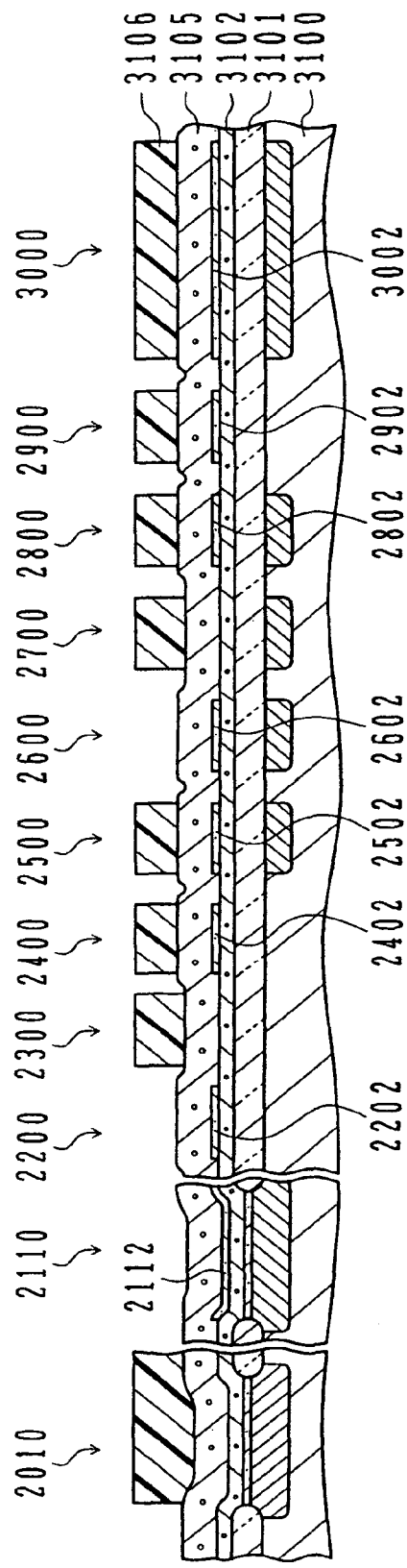
FIG.26A
FIG.26B

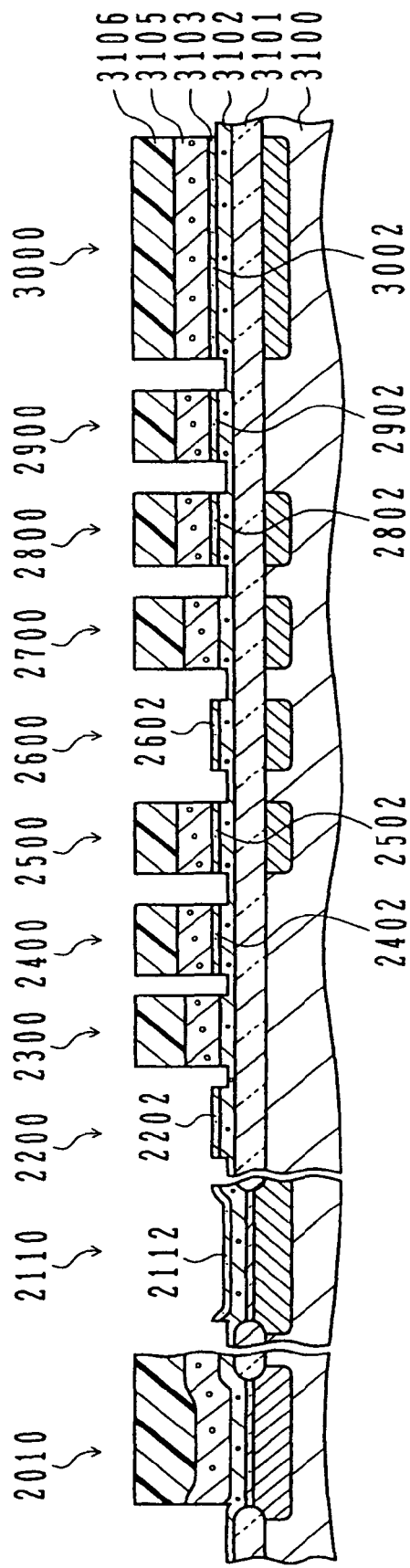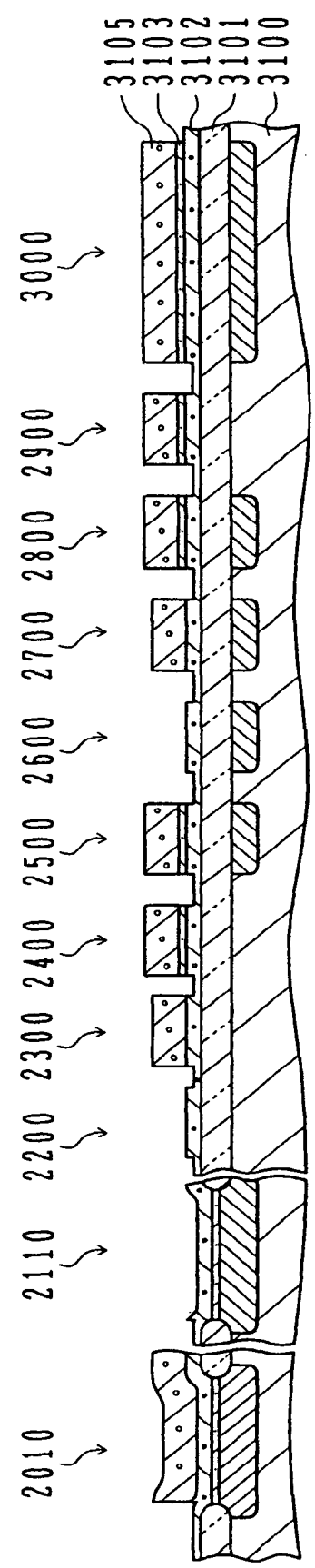
FIG. 26C
FIG. 26D

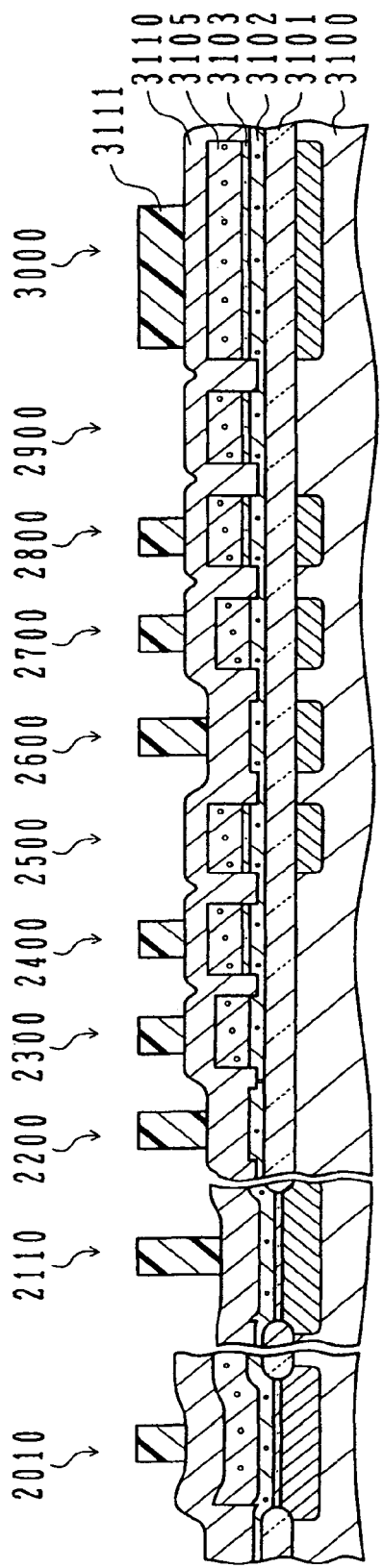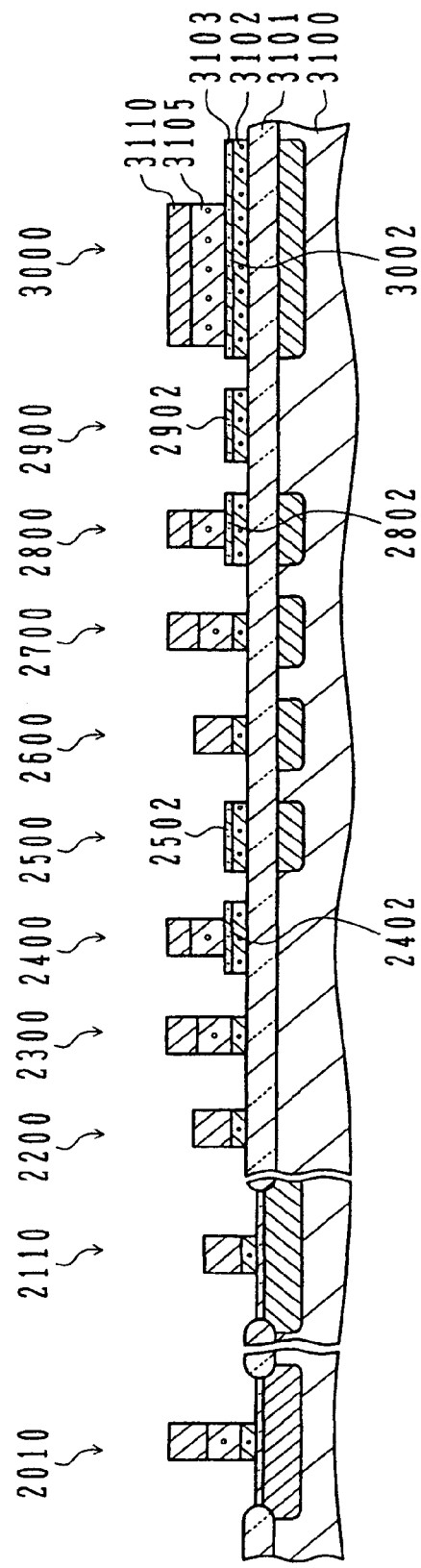
FIG.26E
FIG.26F

SEMICONDUCTOR DEVICE WITH CAPACITOR AND FUSE AND ITS MANUFACTURE METHOD

CROSS REFERENCE TO RELATED APPLICATION

This application is continuation of U.S. patent application Ser. No. 10/971,674, filed Oct. 25, 2004, claiming priority on Japanese Patent Applications No. 2003-364829 filed on Oct. 24, 2003 and No. 2004-298403 filed on Oct. 13, 2004, the entire contents of which are incorporated herein by reference.

BACKGROUND OF THE INVENTION

A) Field of the Invention

The present invention relates to a semiconductor device and its manufacture method, and more particularly to a semiconductor device having at least capacitors and fuses and its manufacture method.

B) Description of the Related Art

A semiconductor device having a desired circuit can be manufactured by forming, on one surface of a semiconductor substrate, active components such as metal-oxide-semiconductor (MOS) field effect transistors (FETs) (hereinafter abbreviated to "MOSFET") and passive components such as capacitors, resistors and fuses, and connecting these components by wiring lines.

Each circuit component is formed, for example, by depositing a mask having a predetermined pattern on a conductive film formed on a semiconductor substrate and etching and removing the conductive film not covered with the mask. Many processes are required to form circuit components of a single layer structure and a multi-layer structure.

It is desired to reduce the number of manufacture processes in order to improve the productivity and reduce the manufacture cost of semiconductor devices integrating various circuits. The number of processes has been reduced by commonly using some of processes of manufacturing a variety type of circuit components.

For example, Japanese Patent Laid-open publication No. SHO-60-261154 describes a semiconductor device wherein the gate electrode of a MOSFET and a fuse are formed by one patterning process.

Japanese Patent Laid-open publication No. HEI-2-290078 describes a semiconductor device wherein the lower electrode of a capacitor, a fuse and a wiring line are made of the same conductive layer.

Japanese Patent Laid-open publication No. HEI-6-283665 describes a self-protective decoupling capacitor wherein the upper electrode and a fuse are formed by one patterning process.

Japanese Patent Laid-open publication No. HEI-7-130861 describes a semiconductor integrated circuit device wherein the gate electrode of MOSFET and a fuse are formed by one patterning process.

Japanese Patent Laid-open publication No. HEI-8-274257 describes a semiconductor device wherein the upper and lower electrodes of a capacitor, a resistor and the gate electrode of MOSFET are formed by one patterning process. In this example, the upper electrode of the capacitor has the two-layer structure and one patterning process is executed as a pre-process of forming the upper electrode of the two-layer structure.

Japanese Patent Laid-open publication No. HEI-11-195753 describes a semiconductor device wherein a MOS transistor and a capacitor are formed being coupled together unable to be separated, and the upper electrode (opposing electrode) or lower electrode of the capacitor and the resistor or fuse are formed by one patterning process.

Japanese Patent No. 3092790 discloses a method of forming a capacitor, a resistor and the gate electrode of MOSFET by two photolithography processes. With this method, after a conductive layer as the lower electrode of a capacitor is formed, a capacitor dielectric film is formed and patterned. Thereafter, a conductive layer as the upper electrode of the capacitor is formed. This conductive layer is made of two layers, a polysilicon layer and a metal silicide layer. An etching mask for leaving the upper electrode is formed and the conductive layer as the upper electrode is etched. This etching continues even after a portion of the capacitor dielectric film is exposed, to thereby pattern the conductive layer as the lower electrode.

The capacitor can therefore be formed by two lithography processes, the process of patterning the capacitor dielectric film and the process of patterning the upper electrode. The resistor is made of the same conductive layer as that of the lower electrode of the capacitor.

Japanese Patent Laid-open Publications Nos. SHO-60-261154, SHO-62-238658, HEI-4-365351, HEI-6-283665 and HEI-7-130861 disclose a fuse having a two-layer structure of polysilicon and metal silicide. This structure can lower the resistance of the fuse and prevent unexpected fuse breakdown.

Capacitors, MOSFETs and fuses are used together in various circuits such as a memory circuit, a voltage or current trimming circuit, and a defect relieving circuit (so-called redundancy circuit) capable of maintaining the circuit function even some portion has a defect.

A capacitor has at lease three layers, a lower electrode, a capacitor dielectric film and an upper electrode, excepting that a semiconductor substrate is used as the lower electrode. The numbers of layers of a MOSFET gate and a fuse are at least one.

Conventionally, a capacitor having at least three layers and a fuse having at least one layer have been formed by using at least three etching masks to pattern each layer, excluding the wiring process between the capacitor and fuse.

The number of processes can be reduced by reducing the number of etching masks used for semiconductor device manufacture. By reducing the number of processes, it becomes easy to improve the productivity and manufacture cost of semiconductor devices.

SUMMARY OF THE INVENTION

An object of this invention is to provide a semiconductor device having capacitors, MOSFETs and fuses capable of being manufactured by a small number of processes even if there are a plurality type of fuses having the same line width and different breakdown characteristics, and its manufacture method.

Another object of the present invention is to provide a semiconductor device having capacitors and fuses capable of being manufactured without using an additional photolithography process, and its manufacture method.

According to one aspect of the invention, there is provided a semiconductor device comprising: a semiconductor substrate having an element isolation insulating film and a gate insulating film for MOS field effect transistors, respectively formed on one surface of the semiconductor substrate; a capacitor formed on the element isolation insulating film, the capacitor having a lamination structure stacking a lower electrode, a capacitor insulating film and an upper electrode in this order on the element isolation insulating film, and the upper electrode including a first upper electrode formed on the capacitor insulating film and made of a same material as a material of the lower electrode and a second upper electrode formed on the first upper electrode and made of a material different from the material of the first upper electrode; a MOS field effect transistor having a gate electrode formed on the gate insulating film, the gate electrode including a first gate electrode made of the same material as the material of the lower electrode and a second gate electrode formed on the first gate electrode and made of a same material as a material of the second upper electrode, a thickness of the first gate electrode being approximately equal to a thickness of the lower electrode, and a thickness of the second gate electrode being approximately equal to a thickness of the second upper electrode; and a first fuse formed on the element isolation insulating film, the first fuse including a first soluble layer made of the same material as the material of the lower electrode and a second soluble layer formed on the first soluble layer and made of the same material as the material of the second upper electrode, a thickness of the first soluble layer being approximately equal to the thickness of the lower electrode, and a thickness of the second soluble layer being approximately equal to the thickness of the second upper electrode.

According to another aspect of the present invention, there is provided a semiconductor device comprising: a semiconductor substrate having an element isolation insulating film and a gate insulating film for MOS field effect transistors, respectively formed on one surface of the semiconductor substrate; a capacitor formed on the element isolation insulating film, the capacitor having a lamination structure stacking a lower electrode, a capacitor insulating film and an upper electrode in this order on the element isolation insulating film, and the upper electrode including a first upper electrode formed on the capacitor insulating film and made of a same material as a material of the lower electrode and a second upper electrode formed on the first upper electrode and made of a material different from the material of the first upper electrode; a MOS field effect transistor having a gate electrode formed on the gate insulating film, the gate electrode including a first gate electrode made of the same material as the material of the lower electrode and a second gate electrode formed on the first gate electrode and made of a same material as a material of the second upper electrode, a thickness of the first gate electrode being approximately equal to a thickness of the lower electrode, and a thickness of the second gate electrode being approximately equal to a thickness of the second upper electrode; an underlying layer formed on the surface of the semiconductor substrate with an insulating film being interposed therebetween, the underlying layer including a first underlying layer made of the same material as the material of the lower electrode and a second underlying layer formed on the first underlying layer and made of a same material as a material of the capacitor insulating film, a thickness of the first underlying layer being approximately equal to a thickness of the lower electrode, and a thickness of the second underlying layer being approximately equal to a thickness of the capacitor insulating film; and a first fuse formed on the underlying layer, the first fuse including a first soluble layer made of a same material as a material of the first upper electrode and a second soluble layer formed on the first soluble layer and made of a same material as a material of the second upper electrode, a thickness of the first soluble layer being approximately equal to a thickness of the first upper electrode, and a thickness of the second soluble layer being approximately equal to a thickness of the second upper electrode.

According to another aspect of the present invention, there is provided a method of manufacturing a semiconductor device having at least a capacitor, a fuse and a MOS field effect transistor formed on one surface of a semiconductor substrate, the method comprising: a preparing step of preparing the semiconductor substrate having an element isolation insulating film and a gate insulating film for the MOS field effect transistor formed on the surface of the semiconductor substrate, the semiconductor substrate including a first conductive layer covering the element isolation insulating film and the gate insulating film, a dielectric layer and a second conductive layer made of a same material as a material of the first conductive layer, stacked in a recited order; a first patterning step of patterning the dielectric layer and the second conductive layer into a predetermined pattern by using one etching mask, wherein the dielectric layer in an area where the capacitor is to be formed, is left to be a capacitor insulating film of the capacitor, the second conductive layer on the capacitor insulating film is left without etching and the dielectric layer in an area where a first fuse is to be formed, is removed; a conductive layer forming step of forming a third conductive layer covering the first conductive layer, the dielectric layer and the second conductive layer, the third conductive layer being made of metal or metal silicide being different from a material of the first conductive layer; and a second patterning step of etching each layer over the element isolation insulating film into a predetermined pattern by using one etching mask and utilizing the dielectric layer and the element isolation insulating film as an etching stopper, wherein the second conductive layer on the capacitor insulating film is patterned to be a first upper electrode of the capacitor, the third conductive layer on the first upper electrode is patterned to be a second upper electrode of the capacitor, the first conductive layer under the capacitor insulating film is left to be a lower electrode of the capacitor, the first conductive layer in an area where the first fuse is to be formed, is left to be a first soluble layer of the first fuse, and the third conductive layer on the first soluble layer is left to be a second soluble layer of the first fuse.

According to another aspect of the present invention, there is provided a method of manufacturing a semiconductor device having at least a capacitor, a fuse and a MOS field effect transistor formed on one surface of a semiconductor substrate, the method comprising: a preparing step of preparing the semiconductor substrate having an element isolation insulating film and a gate insulating film for the MOS field effect transistor formed on the surface of the semiconductor substrate, the semiconductor substrate including a first conductive layer covering the element isolation insulating film and the gate insulating film, a dielectric layer and a second conductive layer made of a same material as a material of the first conductive layer, stacked in a recited order; a first patterning step of patterning the dielectric layer and the second conductive layer into a predetermined pattern by using one etching mask, wherein the dielectric layer in an area where the capacitor is to be formed, is left to be a capacitor insulating film of the capacitor, the second conductive layer on the capacitor insulating film in an area where a first fuse is to be formed, is left without etching and the second conductive layer in the area where the first fuse is to be formed, is left without etching; a conductive layer forming step of forming a third conductive layer covering the first conductive layer, the dielectric layer and the second conductive layer, the third conductive layer being made of metal or metal silicide being different from a material of the first conductive layer; and a second patterning step of etching each layer over the element isolation insulating film into a predetermined pattern by using one etching mask and utilizing the dielectric layer and the element isolation insulating layer as an etching stopper, wherein the second conductive layer on the capacitor insulating film is patterned to be a first upper electrode of the capacitor, the third conductive layer on the first upper electrode is patterned to be a second upper electrode of the capacitor, the first conductive layer under the capacitor insulating film is left to be a lower electrode of the capacitor, the second conductive layer in the area where the first fuse is to be formed, is patterned to be a first soluble layer of the first fuse, and the third conductive layer on the first soluble layer is left to be a second soluble layer of the first fuse.

A semiconductor device having capacitors, MOSFETs and fuses can be manufactured by a small number of processes, even if a plurality type of fuses having different breakdown characteristics are integrated by using the same line width of the fuses. A semiconductor device having a desired circuit can be provided inexpensively.

According to another aspect of the present invention, there is provided a semiconductor device comprising: an insulating film formed in a partial area of a surface of a semiconductor substrate; a capacitor disposed in the partial area of the insulating film, the capacitor including a lower electrode, a capacitor dielectric film, a first upper electrode made of silicon, and a second upper electrode made of material having a resistivity lower than the first upper electrode, respectively stacked in a recited order from a semiconductor substrate side; and a first fuse disposed in a partial area of the insulating film, the first fuse having a lamination structure of a lower layer, a middle layer and an upper layer stacked in a recited order from the semiconductor substrate side, wherein the lower layer is made of a same material as a material of the lower electrode and has a same thickness as a thickness of the lower electrode, the middle layer is made of a same material as a material of the first upper electrode and has a same thickness as a thickness of the first upper electrode, and the upper layer is made of a same material as a material of the second upper electrode and has a same thickness as a thickness of the second upper electrode.

According to another aspect of the present invention, there is provided a semiconductor device comprising: an insulating film formed in a partial area of a surface of a semiconductor substrate; a capacitor disposed in the partial area of the insulating film, the capacitor including a lower electrode, a capacitor dielectric film, a first upper electrode made of silicon, and a second upper electrode made of material having a resistivity lower than the first upper electrode, respectively stacked in a recited order from a semiconductor substrate side; a platform disposed in a partial area of the insulating film, the platform having a lamination structure of a lower layer and an upper layer stacked in a recited order from the semiconductor substrate side, wherein the lower layer is made of the same material as the material of the lower electrode and has the same thickness as the thickness of the lower electrode, and the upper layer is made of a same material as a material of the capacitor dielectric film and has a same thickness as a thickness of the capacitor dielectric film; and a second fuse disposed on the platform and having a lamination structure of a lower layer and an upper layer stacked thereupon, wherein the lower layer is made of the same material as the material of the first upper electrode and has the same thickness as the thickness of the first upper electrode, and the upper layer is made of the same material as the material of the second upper electrode and the same thickness as the thickness of the second upper electrode.

According to another aspect of the present invention, there is provided a method of manufacturing a semiconductor device having a capacitor and a first fuse formed on an insulating film formed on a surface of a semiconductor substrate, the capacitor having a lower electrode, a capacitor dielectric film, a first upper electrode and a second upper electrode stacked in a recited order, the method comprising steps of: (a) forming an insulating film in a partial area of a surface of a semiconductor substrate; (b) forming a first conductive layer on the semiconductor substrate, the first conductive layer covering the insulating film; (c) forming a first dielectric layer on the first conductive layer; (d) patterning the first dielectric layer to leave the capacitor dielectric film made of the first dielectric layer in a partial area of the insulating film; (e) forming a second conductive layer of silicon on the first conductive layer, the second conductive layer covering the capacitor dielectric film; (f) forming a third conductive layer on the second conductive layer, the third conductive layer being made of material having a resistivity lower than the second conductive layer; (g) covering a surface area of the third conductive layer with a resist pattern, the surface area including an area inside of the capacitor dielectric film and an area where the first fuse is to be formed; (h) etching the third and second conductive layers by using the resist pattern as a mask, and after the capacitor dielectric film is partially exposed, etching the first conductive layer by using the resist pattern and the capacitor dielectric film as a mask, whereby the lower electrode made of the first conductive layer is left under the capacitor dielectric film, the first upper electrode made of the second conductive layer and the second upper electrode made of the third conductive layer are left in a partial area of the capacitor dielectric film, and the first fuse made of the first, second and third conductive layers is left on the insulating film in an area spaced apart from the capacitor dielectric film; and (i) removing the resist pattern.

According to another aspect of the present invention, there is provided a method of manufacturing a semiconductor device having a capacitor and a second fuse formed on an insulating film formed on a surface of a semiconductor substrate, the capacitor having a lower electrode, a capacitor dielectric film, a first upper electrode and a second upper electrode stacked in a recited order, the method comprising steps of: (p) forming an insulating film in a partial area of a surface of a semiconductor substrate; (q) forming a first conductive layer on the semiconductor substrate, the first conductive layer covering the insulating film; (r) forming a first dielectric layer on the first conductive layer; (s) patterning the first dielectric layer to leave the capacitor dielectric film made of the first dielectric layer in a partial area of the insulating film and a fifth film made of the first dielectric layer in an inner area of an area where the second fuse is to be formed; (t) forming a second conductive layer made of silicon on the first conductive layer, the second conductive layer covering the capacitor dielectric film and the fifth film; (u) forming a third conductive layer on the second conductive layer, the third conductive layer being made of material having a resistivity lower than the second conductive layer; (v) covering a surface area of the third conductive layer with a resist pattern, the surface area including an area inside of the capacitor dielectric film and an area where the second fuse is to be formed; (w) etching the third and second conductive layers by using the resist pattern as a mask, and after the capacitor dielectric film and the fifth film are partially exposed, etching the first conductive layer by using the resist pattern, the capacitor dielectric film and the fifth film as a mask, whereby the lower electrode made of the first conductive layer is left under the capacitor dielectric film, the first upper electrode made of the first conductive layer and the second upper electrode made of the third conductive layer are left in a partial area of the capacitor dielectric film, and the second fuse made of the second and third conductive layers is left on the fifth film; and (x) removing the resist pattern.

The lower layer of the first fuse and the lower electrode of the capacitor are deposited and patterned at the same time. The middle layer of the first fuse and the first upper electrode of the capacitor are deposited and patterned at the same time. Furthermore, the upper layer of the first fuse and the second upper electrode of the capacitor are deposited and patterned at the same time. Accordingly, the first fuse can be formed without increase of the number of processes.

The lower layer of the second fuse and the first upper electrode of the capacitor are deposited and patterned at the same time. The upper layer of the second fuse and the second upper electrode of the capacitor are deposited and patterned at the same time. Accordingly, the second fuse can be formed without increase of the number of processes.

In this specification, a "soluble layer" is a conductive layer constituting a fuse, and is broken when an excessive current flows therethrough.

In this specification, an element isolation insulating film and a gate insulating film are collectively called in some cases "an insulating film formed on one surface of a semiconductor substrate".

In this specification, the "same material" means the materials having the same composition when neglecting different contents of inevitably mixed materials to be cased by film forming methods, such as hydrogen and carbon and neglecting different contents of elements used as donor or acceptor during impurity doping.

BRIEF DESCRIPTION OF THE DRAWINGS

FIGS. 3A to 3L are cross sectional views of a substrate during manufacture, illustrating the manufacture processes for the semiconductor device shown in FIGS. 1 and 2.

FIG. 11A is a schematic cross sectional view illustrating some processes of forming a metal silicide film on the source and drain regions of MOSFET, and FIG. 11B is a schematic cross sectional view illustrating some other processes of forming a metal silicide film on the source and drain regions of MOSFET.

FIG. 12A is a schematic cross sectional view illustrating some processes of forming a metal silicide film on the source and drain regions of MOSFET, and at the same time forming another electrode or layer, and FIG. 12B is a schematic cross sectional view illustrating some other processes of forming a metal silicide film on the source and drain regions of MOSFET, and at the same time forming another electrode or layer.

FIGS. 15A to 15F are cross sectional views of a semiconductor device during manufacture, illustrating the semiconductor device manufacture method according to the third embodiment.

FIG. 24 is a plan view of a semiconductor device according to a ninth embodiment.

FIGS. 26A to 26F are cross sectional views of the semiconductor device of the ninth embodiment during manufacture.

DESCRIPTION OF THE PREFERRED EMBODIMENTS

Figure 1:
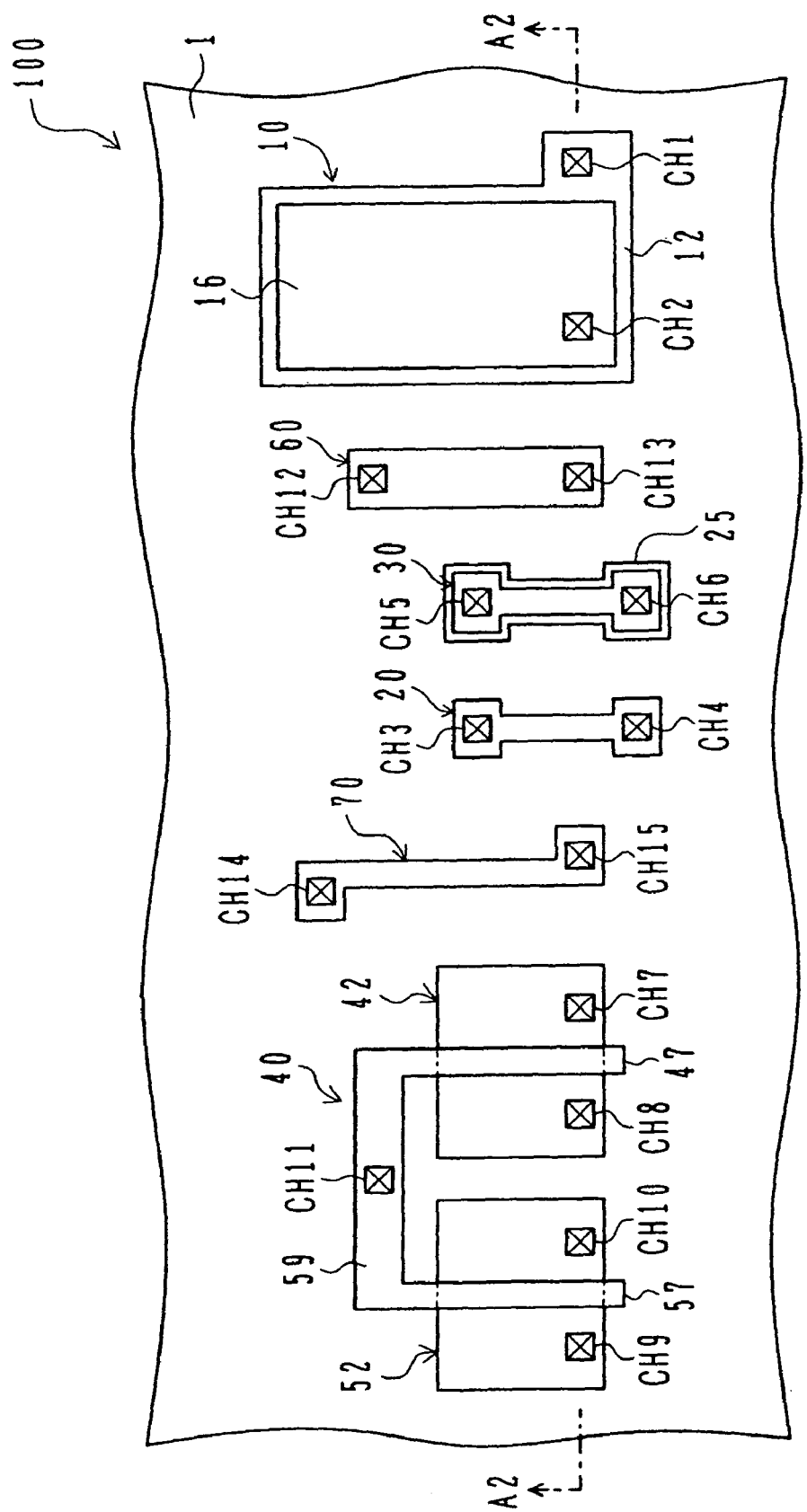
FIG. 1 is a schematic diagram showing a plan layout of a capacitor, first and second fuses, complementary MOSFETs, a resistor and a wiring line, respectively of a semiconductor device according to an embodiment.

FIG. 1 is a schematic diagram showing the plan layout of a capacitor 10, a first fuse 20, a second fuse 30, complementary MOSFETs 40, a resistor 60 and a wiring line 70, respectively of a semiconductor device 100 according to the first embodiment.

These circuit elements and wiring line are disposed on one surface of a p-type semiconductor substrate 1, and an interlayer insulating film (not shown) covers these components. On the interlayer insulating film, upper wiring lines (not shown) are formed.

The capacitor 10 has a lower electrode 12, an upper electrode 16 smaller than the lower electrode 12, and a capacitor insulating film (not shown) disposed between the lower electrode 12 and upper electrode 16.

The first fuse 20 and second fuse 30 are disposed slightly spaced apart from the capacitor 10.

Slightly spaced apart from the first fuse 20, the complementary MOSFETs 40 are disposed. The complementary MOSFETs 40 are constituted of a p-channel MOSFET 42 and an n-channel MOSFET 52 which are connected by a wiring line 59.

The resistor 60 has a single layer structure and is disposed, for example, between the capacitor 10 and second fuse 30.

The wiring line 70 has a two-layer structure and is disposed between the first fuse 20 and complementary MOSFETs 40.

The interlayer insulating film not shown in FIG. 1 covers the capacitor 10, first fuse 20, second fuse 30, p-channel MOSFET 42, n-channel MOSFET 52, resistor 60 and wiring line 70. One or more contact holes for each circuit element and wiring line are formed through the interlayer insulating film, and a contact plug (not shown) is buried in each contact hole. In FIG. 1, fifteen contact holes CH1 to CH15 are shown illustratively.

The specific structure of each of the above-described circuit elements and wiring line will be described with reference to FIG. 2.

Figure 2:
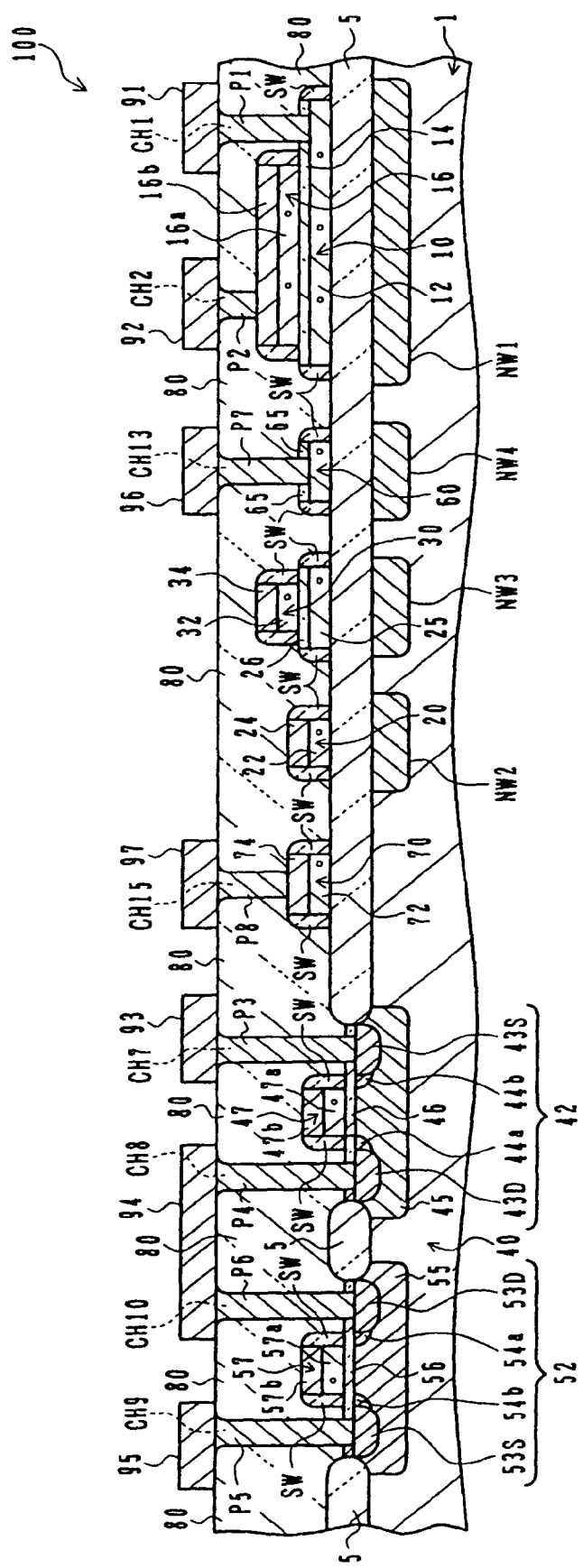
FIG. 2 is a schematic cross sectional view of the semiconductor device shown in FIG. 1 cut along line II-II of FIG. 1.

FIG. 2 is a schematic cross sectional view of the semiconductor device 100 taken along line A2-A2. In FIG. 2, the interlayer insulating film 80 omitted in FIG. 1 and upper wiring lines 91 to 97 disposed on the interlayer insulating film 80 are shown.

As shown in FIG. 2, on the surface of the p-type semiconductor substrate 1, an element isolation insulating film 5 is formed defining active regions. A gate insulating film 46 is formed on the active region of the p-channel MOSFET 42, and a gate insulating film 56 is formed on the active region of the n-channel MOSFET 52. The element isolation insulating film 5, gate insulating films 46 and 56 are made of, for example, silicon oxide.

The capacitor 10 has the lower electrode 12, capacitor insulating film 14 and upper electrode 16. The lower electrode 12 is made of, e.g., n-type polysilicon and formed on the element separation insulating film 5. The capacitor insulating film 14 formed on the lower electrode is made of a dielectric layer constituted of silicon oxide, silicon nitride, tantalum oxide or the like. The upper electrode 16 is disposed on the capacitor insulating film 14. The upper electrode 16 is made of two layers, a first upper electrode 16a formed on the capacitor insulating film 14 and a second upper electrode 16b formed on the first upper electrode. For example, the first upper electrode is made of n-type polysilicon and the second upper electrode is made of metal or metal silicide.

Contact plugs P1 and P2 are buried in the contact hole CH1 for the lower electrode 12 and the contact hole CH2 for the upper electrode 16 shown in FIG. 2, respectively.

The lower electrode 12 is connected to an upper wiring line 91 formed on the interlayer insulating film 80 via the contact plug P1 buried in the contact hole CH1. The upper electrode 16 is connected to the upper wiring line 92 formed on the interlayer insulating film 80 via the contact plug P2 buried in the contact hole CH2.

The first fuse 20 has a two-layer structure of a first soluble layer 22 formed on the element isolation insulating film 5 and a second soluble layer 24 formed on the first soluble layer. The first soluble layer 22 is made of the same material as that of the lower electrode, e.g., n-type polysilicon, and has a thickness approximately equal to that of the lower electrode 12. The second soluble layer 24 is made of the same material as that of the second upper electrode 16b, e.g., metal or metal silicide, and has a thickness approximately equal to that of the second upper electrode 16b.

The second fuse 30 has a two-layer structure of a first soluble layer 32 formed on an underlying layer (platform layer) and a second soluble layer 34 formed on the first soluble layer. The first soluble layer 32 is made of the same material as that of the first upper electrode 16a, e.g., n-type polysilicon, and has a thickness approximately equal to that of the first upper electrode 16a. The second soluble layer 34 is made of the same material as that of the second upper electrode 16b, e.g., metal or metal silicide, and has a thickness approximately equal to that of the second upper electrode 16b.

The underlying layer (platform layer) of the second fuse 30 has a two-layer structure of a first underlying layer 25 and a second underlying layer 26 formed on the first underlying layer. For example, the first underlying layer is made of the same material as that of the lower electrode 12, e.g., n-type polysilicon, and the second underlying layer is made of the same material (dielectric material) as that of the capacitor insulating film 14. The first underlying layer 25 has a thickness approximately equal to that of the lower electrode 12 and the second underlying layer 26 has a thickness approximately equal to that of the capacitor insulating film 14.

The p-channel MOSFET 42 constituting the complementary MOSFETs 40 has a lightly doped drain (LDD) structure. The gate electrode 47 is disposed on the gate insulating film 46, and under the gate insulating film, a drain region 43D, an LDD drain region 44a, a channel region, an LDD source region 44b and a source region 43S are disposed in this order from the n-channel MOSFET 52 side.

The drain region 43D and source region 43S are made of $p^+$-type impurity doped regions formed in predetermined regions of an n-type well 45 under the gate insulating film 46.

The LDD drain region 44a and LDD source region 44b are made of $p^-$type impurity doped regions formed in predetermined regions of the n-type well 45. The junction depth of the LDD drain region 44a is shallower than the junction depth of the drain region 43D, and the junction depth of the LDD source region 44b is shallower than the junction depth of the source region 43S. A p-type impurity concentration of the p⁻type impurity doped region is lower than that of the p⁺-type impurity doped region.

The channel region is constituted of a region in the n-type well 45 between the LDD drain and source regions 44a and 44b. A gate electrode 47 is positioned above the channel region.

The gate electrode 47 has a two-layer structure of a first gate electrode 47a formed on the insulating film 46 and a second gate electrode 47b formed on the first gate electrode.

The first gate electrode 47a is made of the same material as that of the lower electrode 12, e.g., n-type polysilicon, and has a thickness approximately equal to that of the lower electrode 12.

The second gate electrode 47b is made of the same material as that of the second upper electrode 16b, e.g., metal or metal silicide, and has a thickness approximately equal to that of the second upper electrode 16b.

On the sidewalls of the gate electrode 47, sidewall spacers SW are left which were used for ion implantation for forming the drain region 43D and source region 43S. The LDD drain region 44a and LDD source region 44b are positioned under the sidewall spacers SW.

Contact plugs P3 and P4 are buried in the contact hole CH7 for the source region 43S and the contact hole CH8 for the drain region 43D shown in FIG. 2, respectively.

The source region 43S is connected to an upper wiring line 93 formed on the interlayer insulating film 80 via the contact plug P3 buried in the contact hole CH7. The drain region 43D is connected to an upper wiring line 94 formed on the interlayer insulating film 80 via the contact plug P4 buried in the contact hole CH8.

The n-channel MOSFET 52 constituting the complementary MOSFETs 40 has a lightly doped drain (LDD) structure, similar to the n-channel MOSFET 42. The gate electrode 57 is disposed on the gate insulating film 56, and under the gate insulating film 56, a drain region 53D, an LDD drain region 54a, a channel region, an LDD source region 54b and a source region 53S are disposed in this order from the p-channel MOSFET 42 side.

The drain region 53D and source region 53S are made of n⁺-type impurity doped regions formed in predetermined regions of a p-type well 55 under the gate insulating film 56.

The LDD drain region 54a and LDD source region 54b are made of n⁺type impurity doped regions formed in predetermined regions of the p-type well 55. The junction depth of the LDD drain region 54a is shallower than the junction depth of the drain region 53D, and the junction depth of the LDD source region 54b is shallower than the junction depth of the source region 53S. An n-type impurity concentration of the n⁻type impurity doped region is lower than that of the n⁺-type impurity doped region.

The channel region is constituted of a region in the p-type well 55 between the LDD drain and source regions 54a and 54b. A gate electrode 57 is positioned above the channel region.

The gate electrode 57 has a two-layer structure of a first gate electrode 57a formed on the insulating film 56 and a second gate electrode 57b formed on the first gate electrode.

The first gate electrode 57a is made of the same material as that of the lower electrode 12, e.g., polysilicon, and has a thickness approximately equal to that of the lower electrode 12.

The second gate electrode 57b is made of the same material as that of the second upper electrode 16b, e.g., metal or metal silicide, and has a thickness approximately equal to that of the second upper electrode 16b.

On the sidewalls of the gate electrode 57, sidewall spacers SW are left which were used for ion implantation for forming the drain region 53D and source region 53S. The LDD drain region 54a and LDD source region 54b are positioned under the sidewall spacers SW.

Contact plugs P5 and P6 are buried in the contact hole CH9 for the source region 53S and the contact hole CH10 for the drain region 53D shown in FIG. 2, respectively.

The source region 53S is connected to an upper wiring line 95 formed on the interlayer insulating film 80 via the contact plug P5 buried in the contact hole CH9. The drain region 53D is connected to the upper wiring line 94 formed on the interlayer insulating film 80 via the contact plug P6 buried in the contact hole CH10. The upper wiring line 94 electrically connects the drain region 43D and drain region 53D.

The resistor 60 is formed on the element isolation insulating film 5. The resistor 60 is made of the same material as that of the lower electrode 12, e.g., n-type polysilicon, and has a thickness approximately equal to that of the lower electrode 12. The upper surface of the resistor 60 is covered with a dielectric layer 65 made of the same material as that of the capacitor insulating film 14. A thickness of the dielectric layer 65 is approximately equal to that of the capacitor insulating film 14.

A contact plug P7 is buried in the contact hole CH13 for the resistor 60 shown in FIG. 2. The resistor 60 is connected to an upper wiring line 96 formed on the interlayer insulating film 80 via the contact plug P7.

The wiring line 70 has a two-layer structure of a first wiring layer 72 formed on the element isolation insulating film 5 and a second wiring layer 74 formed on the first wiring layer. The first wiring layer 72 is made of the same material as that of the lower electrode 12, e.g., n-type polysilicon, and the second wiring layer 74 is made of the same material as that of the second upper electrode 16b, metal or metal silicide. A thickness of the first wiring layer 72 is approximately equal to that of the lower electrode 12, and a thickness of the second wiring layer 74 is approximately equal to that of the second upper electrode 16b. The wiring line 59 shown in FIG. 1 has the lamination structure similar to that of the wiring line 70.

A contact plug P8 is buried in the contact hole CH15 for the wiring line 70 shown in FIG. 2. The wiring line 70 is connected to an upper wiring line 97 formed on the interlayer insulating film 80 via the contact plug P8.

In order to reliably ensure the electric isolation from the p-type semiconductor substrate 1, it is preferable as shown in FIG. 2 to form n-type wells NW1 to NW4 in the p-type semiconductor substrate 1 under the capacitor 10, first and second fuses 20 and 30 and resistor 60.

Between the lower electrode 12 of the capacitor 10 and the p-type semiconductor substrate 1, a very small capacitance is formed by using the element isolation insulating film 5 as the capacitor insulating film. As the n-type well NW1 is formed under the capacitor 10, it is possible to prevent charges (holes) in the p-type semiconductor substrate 1 from moving into the region under the lower electrode 12.

As the n-type wells NW2 and NW3 are formed under the first and second fuses 20 and 30, respectively, it is possible to prevent unnecessary substrate leak current from flowing, even if the element isolation insulating film 5 is damaged by heat generation upon breakdown of the first and second fuses 20 and 30.

As described previously, the sidewall spacers SW are formed on the sidewalls of the gate electrodes 47 and 57 in order to form the p-channel MOSFET 42 and n-channel MOSFET 52 having the LDD structure. At this time, sidewall spacers SW are formed also on the side walls of the capacitor 10, first and second fuses 20 and 30, resistor 60 and wiring line 70.

In the semiconductor device 100 having the structure described above, the first fuse 20, second fuse 30, gate electrode 47, gate electrode 57, resistor 60 and wiring line 70 are made of the same material as that of the lower electrode 12, capacitor insulating film 14, first upper electrode 16a or second upper electrode 16b, respectively of the capacitor 10.

It is therefore possible to form the capacitor 10, first fuse 20, second fuse 30, gate electrode 47, gate electrode 57, resistor 60 and wiring line 70 by patterning a predetermined layer by selectively using two types of masks. It is therefore possible to manufacture a subject semiconductor with a small number of processes. A specific manufacture method will be later described.

The line width of the first and second fuses 20 and 30 is generally set to the minimum value of a design rule. Even if the line width of the fuses 20 and 30 is set to the same minimum value, the breakdown characteristics of the fuses can be made different by incorporating the above-described layer structures of the fuses 20 and 30.

For example, by setting the thickness of the first soluble layer 22 of the first fuse 20 different from the thickness of the first soluble layer 32 of the second fuse 30, the breakdown characteristics of the fuses can be made different even if the line width of the fuses 20 and 30 is set to the same minimum value.

If the thickness of the first soluble layer 22 of the first fuse 20 is set to 150 nm and the thickness of the first soluble layer 32 of the second fuse 30 is set to 100 nm and polysilicon of the same composition is used as the material of the fuses, the current necessary for cutting the first fuse 20 becomes larger by about 10 to 15% than the current necessary for cutting the second fuse 30. In this case, it is assumed that the line widths of the first and second fuses 20 and 30 are the same and the thicknesses of the second soluble layers 24 and 34 of the first and second fuses 20 and 30 are the same.

It is easy to form both the fuse having a large breakdown current and the fuse having a small breakdown current.

If the first soluble layers 22 and 32 of the first and second fuses 20 and 30 are made of n-type polysilicon and the second soluble layers 24 and 34 thereof are made of metal silicide, the breakdown characteristics of the fuses 20 and 30 can be made easily different by the following method. Namely, the characteristics of the fuses 20 and 30 can be made easily different, for example, by implanting p-type impurity ions only into one of the first and second fuses by using a mask when the source and drain regions 43S and 43D of the complementary MOSFETs 40 are formed.

As the underlying layer of the second fuse 30 is made of the first and second underlying layers 25 and 26, the second fuse 30 can be preheated by flowing current through the first underlying layer 25. Even if current is flowed through the first underlying layer 25, the first underlying layer 25 and second fuse 30 are maintained electrically isolated because the second underlying layer 26 is made of the dielectric layer.

As the second fuse 30 is preheated, the current or voltage value necessary for cutting the second fuse 30 can be lowered. If the second fuse 30 is to be cut by a pulse current, the number of pulses necessary for breakdown can be reduced. It is possible to shorten the time taken to cut the fuse.

If the size of the first and second underlying layers 25 and 26 as viewed in plan is set sufficiently larger than that of the second fuse 30, heat generated while the second fuse 30 is cut can be absorbed or dissipated. It is therefore possible to mitigate the damages of nearby circuit elements to be caused when the second fuse 30 is cut.

As the second gate electrodes 47b and 57b are made of metal silicide, when impurity ions are implanted into the n-type well 45 and p-type well 55 of MOSFETs 42 and 52, these impurity ions are hard to be penetrated through the second gate electrodes 47b and 57b, so that the gate electrodes 47 and 57 having desired electric characteristics can be obtained easily.

As the second wiring layer 74 of the wiring line 70 is made of metal silicide, the wiring line 70 having a low electric resistance can be formed and the semiconductor device 100 capable of operating at high speed can be manufactured.

Next, the semiconductor manufacture method of the embodiment will be described with reference to FIGS. 3A to 3L. In the following, the manufacture method for the semiconductor device 100 shown in FIGS. 1 and 2 will be described by quoting the reference numerals and symbols used with FIG. 2.

FIGS. 3A to 3L illustrate main processes of the manufacture method for the semiconductor device 100. Similar constituent elements in FIGS. 3A to 3L to those shown in FIG. 2 are represented by using identical reference numerals and symbols and the description thereof is omitted.

First, a p-type silicon substrate is prepared as the p-type semiconductor substrate 1. On one surface of the p-type silicon substrate, the above-described n-type wells NW1 to NW4, n-type well 45 and p-type well 55 are formed. Each well can be formed by implanting n- or p-type impurity ions and thereafter by activating the impurities through thermal diffusion.

Next, a buffer silicon oxide film of about 50 nm in thickness is formed on the whole surface of the substrate on the side where the wells were formed. For example, the silicon oxide film is formed by thermal oxidation.

If necessary, after or before the silicon oxide film is formed, desired impurities may be doped, for example, by ion implantation into the regions where the channels of the p-type MOSFET 42 and n-channel MOSFET 52 are to be formed. With this impurity doping, the final threshold voltages of the p-channel MOSFET 42 and n-channel MOSFET 52 can be adjusted. The impurity doping process for the threshold voltage adjustment may be executed after the process of forming gate oxide films 46 and 56 to be later described.

Next, as shown in FIG. 3A, on the surface of the p-type semiconductor substrate 1, the element isolation insulating film 5 of about 500 nm in thickness and thin gate insulating films 46 and 56 are formed.

For example, the element isolation insulating film 5 is formed through local oxidation of silicon (LOCOS) using a mask having an oxygen shielding function. For example, a silicon nitride film of about 150 nm in thickness is formed on the buffer silicon oxide film to form a mask having a predetermined pattern, and the p-type semiconductor substrate 1 is subjected to a high temperature thermal oxidation process. The p-type semiconductor substrate (p-type silicon substrate) 1 not covered with the mask is further oxidized so that the element isolation insulating film 5 can be formed. The silicon nitride film used as the mask is thereafter removed by using hot phosphoric acid or the like.

Next, the silicon oxide film left as having a thickness approximately equal to that of the buffer silicon oxide film is removed by using, for example, dilute hydrofluoric acid. Thereafter, the p-type semiconductor substrate 1 is again subjected to a high temperature thermal oxidation process to obtain pure gate insulating films 45 and 56.

The element isolation insulating film 5 may be formed through shallow trench isolation (STI) suitable for miniaturization.

Next, as shown in FIG. 3B, a first conductive layer 111 is formed covering the element isolation insulating film 5 and gate insulating films 46 and 56. The first conductive layer 111 is made of, for example, n-type polysilicon or amorphous silicon and has the shape conformal to the underlying layer.

If the first conductive layer 111 is to be made of n-type polysilicon, first a polysilicon layer is formed by chemical vapor deposition (CVD). Then, n-type impurities such as phosphorus are doped in the polysilicon layer. FIG. 3B and following drawings show the first conductive layer 111 made of n-type polysilicon.

The polysilicon layer can be formed by CVD by using mixed gas of monosilane ($SiH_4$) and nitrogen ($N_2$) at a ratio of 2:8 as the source gas under the conditions of a flow rate of 200 sccm, an atmosphere pressure of 30 Pa during growth and a substrate temperature of 600° C. As the substrate temperature is set low, amorphous silicon can be formed. By heating amorphous silicon to about 600° C., polysilicon can be formed.

A thickness of the polysilicon layer can be set as desired. The polysilicon layer is preferably made thick in order to lower the sheet resistance of the conductive layer 111. From the viewpoint of micro patterning, it is preferable that the conductive layer is thin. Therefore, the thickness is set preferably in the range of 50 to 1000 nm, and more preferably in the range of 100 to 300 nm. The concentration of impurities doped in the polysilicon layer is, for example, about $1 \times 10^{20}$ $cm^{-3}$.

Next, as shown in FIG. 3C, a dielectric layer 113 is formed on the first conductive layer 111. The dielectric layer 113 is made of a single silicon oxide film or silicon oxynitride film, a lamination of a silicon oxide film and a silicon nitride film or silicon oxynitride film, or a lamination of a silicon oxide film, a silicon nitride film and a silicon oxide film, and is formed conformal to the underlying layer. The dielectric layer 113 may be a lamination of a tantalum oxide film and a silicon oxide film or silicon nitride film, or a lamination of a tantalum oxide film sandwiched between a silicon oxide films or silicon nitride films.

In place of the silicon oxide film of the dielectric layer 113, a phosphosilicate glass (PSG) film or a borophosphosilicate glass (BPSG) film formed by plasma enhanced CVD may be used. In place of the tantalum oxide film, a ferroelectric film may be used. In place of the silicon nitride film, a silicon oxynitride film may be used.

The layer structure, thickness and material quality of the dielectric layer 113 are properly select so as to obtain a desired electrostatic capacitance of the capacitor having the dielectric layer 113 sandwiched between a pair of electrodes. The following layer structures (1) to (5) may be used for the dielectric layer 112. The order of layers described in the structures (2) to (5) starts from the uppermost layer to the lowermost layer of the dielectric layer.

(1) silicon oxide film
(2) silicon nitride film/silicon oxide film
(3) silicon oxide film or silicon oxynitride film/silicon nitride film/silicon oxide film or silicon oxynitride film
(4) silicon oxide film or silicon oxynitride film/tantalum oxide ($Ta_2O_5$) film/silicon oxide film
(5) tantalum oxide ($Ta_2O_5$) film/silicon oxide film or silicon oxynitride film The silicon oxide film can be formed by plasma enhanced CVD using mixed gas of tetraethylorthosilicate (hereinafter abbreviated to "TEOS") and ozone ($O_3$) as source gas, or by CVD using electron cyclotron resonance (hereinafter abbreviated to "ECR") plasma. The silicon oxide layer may be formed by thermal oxidation or spin-on-glass.

The silicon nitride film and silicon oxynitride film can be formed by plasma enhanced CVD using mixed gas of TEOS and oxygen ($O_2$), or ozone ($O_3$) and nitrogen oxide ($NO_x$), or by CVD using ECR plasma.

Next, as shown in FIG. 3D, a second conductive layer 115 is formed on the dielectric layer 113. For example, the second conductive layer 115 is made of polysilicon doped with n-type impurities and formed conformal to the underlying layer. Examples of the polysilicon layer forming method have been described for the first conductive layer 111, and the description thereof is not duplicated. Impurities of the n-type are doped when the polysilicon layer is formed or after the polysilicon layer is formed.

A thickness of the second conductive layer 115 of n-type polysilicon can be set as desired. The second conductive layer 15 is preferably made thick in order to lower the sheet resistance thereof. From the viewpoint of micro patterning, it is preferable that the conductive layer is thin. Therefore, the thickness is set preferably in the range of 20 to 1000 nm, and more preferably in the range of 80 to 300 nm. Since there is a later process of patterning both the first and second conductive layers 111 and 115 at the same time, it is important that the thicknesses of the layers 111 and 115 are nearly equal or have a difference in the range of several %. The concentration of n-type impurities such as phosphorus diffused in the second conductive layer 115 is, for example, about $1 \times 10^{20}$ $cm^{-3}$. The impurity concentrations of the first and second conductive layers 111 and 115 are preferably nearly equal in order to present similar patterning performances.

If necessary, prior to forming the second conductive layer 115, the p-type semiconductor substrate 1 may be subjected to heat treatment. The heat treatment makes dense the dielectric layer 113 so that the electric and physical properties thereof can be improved. During heat treatment to be performed after the second conductive layer 115 is formed, degassing and a stress change in the dielectric layer 113 are suppressed and tight adhesion between the dielectric layer 113 and second conductive layer 115 can be improved. The reliability of the finished capacitor 10 can be improved. It is also possible to prevent impurities in the first conductive layer 111 from being diffused again.

The above processes are a preparatory process for the semiconductor device 100. By patterning each layer formed on the substrate including the last conductive layer 115, the target semiconductor device 100 can be formed by a small number of processes.

First, as shown in FIG. 3E, an etching mask 120 having a predetermined pattern is formed on the second conductive layer 115 and the second conductive layer 115 and underlying dielectric layer 113 are patterned by etching.

This patterning leaves a dielectric layer 113A and a second conductive layer 115A in the area where the lower electrode 12 of the capacitor 10 is formed, and also leaves a dielectric layer 113B and a second conductive layer 115B in the area where the second fuse 30 is formed. A dielectric layer 113C and a second conductive layer 115C are also left in the area where the resistor 60 is formed.

For example, the etching mask 120 is formed by coating photoresist such as novolak-based photoresist on the second conductive layer 115, selectively exposing the photoresist layer and developing it to leave the photoresist layer in the areas where the lower electrode 12 of the capacitor 10, the underlying layer of the second fuse 30 and the resistor 60 are formed.

For example, the second conductive layer 115 and dielectric layer 113 are patterned separately. The second conductive layer 115 is first patterned by etching.

The second conductive layer 115 may be patterned by microwave plasma etching (the frequency of a microwave is, for example, 2.45 MHz) or ECR plasma etching by using mixed gas of chlorine ($Cl_2$) and oxygen ($O_2$), tetrafluoromethane ($CF_4$) or sulfur hexafluoride ($SF_6$) as etching gas at an atmosphere pressure of several mTorr (several hundreds mPa). The second conductive layer 115 not covered with the etching mask 120 and exposed is etched and removed.

Thereafter, the dielectric layer 113 is patterned by etching. At this etching of the dielectric layer 113, the first conductive layer 111 to be used later as portions of the gate electrodes 47 and 57 is subjected to surface processing. It is therefore preferable to select an etching method capable of maintaining the surface of the first conductive layer 111 clean and having a high etching selection ratio of the dielectric layer 113 to the first conductive layer 111.

For example, if the dielectric layer 113 is a lamination film having a silicon oxide layer as its lower layer, it is preferable to remove the upper layer of the dielectric layer 113 by dry etching and the lower silicon oxide layer by wet etching.

For example, for dry etching of the silicon oxide film or silicon nitride film of the dielectric layer 113, RF plasma etching is performed by using mixed gas of tetrafluoromethane ($CH_4$) and trifluoromethane ($CHF_3$) under the conditions of an atmosphere pressure of 160 mTorr (about 21 Pa), an RF power of about 700 W and an RF signal frequency of 13.56 MHz.

After the dielectric layer 113 is etched, the etching mask 120 is removed with predetermined remover.

If residues and particles of the silicon oxide film exist after etching the dielectric layer 113, if a damage layer is formed on the first conductive layer by dry etching, or if a natural oxide film is formed, in order to remove these, it is preferable to perform light etching by using etchant such as buffered hydrofluoric acid (mixture of hydrofluoric acid (HF), ammonium fluoride ($NH_4F$) and water ($H_2O$)) or the like. In this case, a third conductive layer to be formed next can be prevented from being peeled off and the conductivity can be prevented from being degraded.

Next, as shown in FIG. 3F, a third conductive layer 125 of metal or metal silicide is formed covering the second conductive layers 115A to 115C, dielectric layers 113A to 113C and first conductive layer 111.

Metal to be used as the third conductive layer 125 may be: refractory metal such as tungsten (W), molybdenum (Mo), titanium (Ti) and tantalum (Ta); transition metal such as cobalt (Co), chromium (Cr), hafnium (Hf), iridium (Ir), niobium (Nb), platinum (Pt) zirconium (Zr) and nickel (Ni); or alloy of any arbitrary set of these metals.

Metal silicide to be used as the third conductive layer 125 may be cobalt silicide, chromium silicide, nickel silicide or the like, and more preferably refractory metal silicide such as tungsten silicide ($WSi_x$), molybdenum silicide ($MoSi_x$), titanium silicide ($TiSi_x$), tantalum silicide ($TaSi_x$) and refractory metal alloy silicide.

A thickness of the third conductive layer 125 can be selected as desired. The thickness of the third conductive layer 125 is preferably in the range of 25 to 500 nm and more preferably in the range of 80 to 200 nm. If the third conductive layer 125 is thinner than these ranges, the resistance of the gate electrode 40 and wiring line 70 increases, whereas if it is thicker than these ranges, workability of the photolithography process and dry etching process is degraded.

The third conductive layer 125 of metal or metal silicide can be formed by sputtering or CVD.

If the third conductive layer 125 of tungsten silicide ($WSi_x$) is formed by a DC magnetron sputtering system, for example, it is formed by using a tungsten silicide target and argon gas (Ar) as sputtering gas under the conditions of an atmosphere pressure of 8 mTorr (about 1 Pa), an argon (Ar) gas flow rate of 30 sccm, a substrate temperature of 180° C. and a power of 2000 W.

Similar conditions may be selected when the third conductive layer 125 of metal silicide having a different composition is formed, by using the same composition of the target as that of the third conductive layer or by using a similar composition.

In the case of the third conductive layer 125 of tungsten silicide ($WSi_2$) formed by CVD, $WSi_2$ is deposited by the reaction represented by the following formula (1) by using, for example, tungsten hexafluoride ($WF_6$) and monosilane ($SiH_4$) as source gas.

$$WF_6 + 2SiH_4 \rightarrow WSi_2 + 6HF + H_2 \qquad (1)$$

If the first conductive layer 111 and/or second conductive layer 115 is made of polysilicon or amorphous silicon, the third conductive layer 125 of metal silicide can be formed by forming a metal layer and then performing heat treatment to react the metal layer with the underlying first conductive layer 111 or second conductive layer 115.

If the third conductive layer 125 is made of metal silicide, it is preferable to perform heat treatment for about 5 to 30 seconds at 600 to 1100° C. in accordance with the composition of the third conductive layer 125, for example, by using a rapid thermal annealing (RTA) system. In the case of the third conductive layer 125 of tungsten silicide ($WSi_x$), it is preferable to perform heat treatment at about 1000° C.

This heat treatment lowers the electric resistance of the upper electrode 16 of the capacitor 10 and the gate electrodes 47 and 57. If the first conductive layer 111 and/or second conductive layer 115 is made of polysilicon, this heat treatment can prevent the third conductive layer 125 from being peeled off from the underlying polysilicon layer during heat treatment for baking and making dense the interlayer insulating film 80. The heat treatment may be performed at any time before the interlayer insulating film 80 is formed.

Next, as shown in FIG. 3G, an etching mask 130 having a predetermined pattern is formed on the third conductive layer 125, and the third conductive layer 125, second conductive layers 115A and 115B and first conductive layer 111 are patterned by etching.

This patterning forms the capacitor 10, first fuse 20, second fuse 30, underlying layer, gate electrodes 47 and 57, wiring line 59, resistor 60 and wiring line 70 shown in FIG. 1 or 2. Upper wiring lines are not formed yet.

For example, the etching mask 130 is formed by coating photoresist on the third conductive layer 125, selectively exposing the photoresist layer and developing it, and leaving the photoresist layer in the area where the upper electrode 16 of the capacitor 10, first and second fuses 20 and 30, gate electrodes 47 and 57, and wiring lines 59 and 70 are to be formed.

This etching may be performed by using an ECR plasma etching system. For example, mixed gas of chlorine ($Cl_2$) and oxygen ($O_2$) respectively at flow rates of 25 sccm and 11 sccm is used as etching gas under the conditions of an atmosphere pressure of about 2 mTorr (about 270 mPa), an RF power of 40 W, an RF signal frequency of 13.56 MHz, a microwave power of 1400 W, a microwave frequency of 2.45 GHz and an electrode temperature of 15 to 20° C.

In this case, although the regions of the dielectric layers 113A to 113C shown in FIG. 3F not covered with the etching mask 130 are slightly thinned by etching, the shapes thereof as viewed plan hardly change. These dielectric layers 113A to 113C function as etching stopper layers. The first conductive layer 111 under the dielectric layers 113A to 113C is patterned in self-alignment with the dielectric layers 113A to 113C.

After the etching, the etching mask 130 is removed with predetermined remover.

Thereafter, impurities are doped in the n-type well 45 and p-type well 55 for the p-channel MOSFET 42 and n-channel MOSFET 52 and activated.

First, as shown in FIG. 3H, a mask 133 having an opening OP1 above the p-channel MOSFET 42 is formed. The mask 133 covers as viewed in plan the most area of the element isolation insulating film 5 and the capacitor 10, first and second fuses 20 and 30, gate insulating film 56, gate electrode 57, wiring line 59, resistor 60 and wiring line 70.

Via the opening OP1, p-type impurity ions (such as boron ions) are implanted into the n-type well 45 to form the p⁻-type low concentration impurity doped regions 144a and 144b. The mask 133 is thereafter removed.

Next, as shown in FIG. 3I, a mask 135 is formed which has an opening OP3 above the n-channel MOSFET 52 region and an opening OP4 above the first and second fuses 20 and 30 and wiring line 70. This mask 135 covers as viewed in plan the most area of the element isolation insulating film 5 and the capacitor 10, gate insulating film 46, gate electrode 47 and resistor 60.

Via the openings OP3 and OP4, n-type impurity ions (such as phosphorus ions) are implanted into the p-type well 55, first and second fuses 20 and 30 and wiring line 70 to form the n⁻-type low concentration impurity doped regions 154a and 154b. The mask 135 is thereafter removed.

Figure 3J:
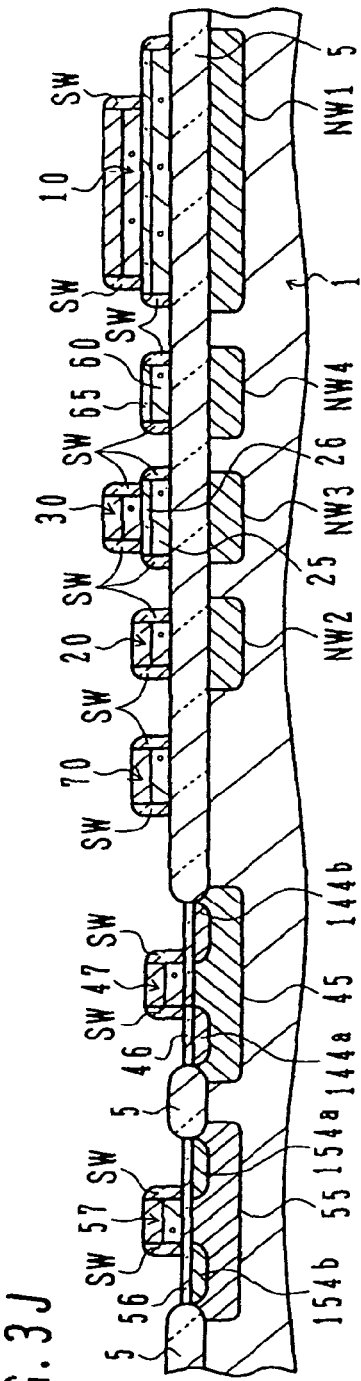

Next, as shown in FIG. 3J, the side wall spacers SW are formed on the sidewalls of the gate electrodes 47 and 57.

For example, the side wall spacers SW are formed by forming an insulating film of silicon oxide or the like on the substrate whole surface and etching back the insulating film by anisotropic etching such as reactive ion etching. At the stage when the insulating film on the flat surface is removed, the insulating film as the sidewall spacers SW is left only on the sidewalls.

The sidewall spacers SW are also formed on the sidewalls of the capacitor 10, first and second fuses 20 and 30, resistor 60 and wiring line 70.

While the sidewall spacers SW are formed, although the dielectric layer 65 on the resistor 60 is etched back in some cases, the resistor 60 (first conductive layer 111) is not etched because it is made of polysilicon. The dielectric layer 65 can be functioned as the etching protective film for the resistor 60, by properly selecting the thickness and quality of the dielectric layer 65 and further the thickness and quality of the dielectric layer 113 (refer to FIG. 3C). If the dielectric layer 65 is made of silicon nitride, the dielectric layer functions as an etching mask for the silicon oxide film.

During the etch-back process of forming the sidewall spacers SW, the gate oxide films 46 and 56 on the source regions 43S and 53S and the gate oxide films 46 and 56 on the drain regions 43D and 53D are generally removed. A natural oxide film is grown thereafter.

In this specification, for the purposes of conveniences, the natural oxide film grown after the gate oxide films 46 and 56 are locally removed while the side wall spacers SW are formed, and the gate oxide films 46 and 56 not removed, are collectively called "gate oxide films 46 and 56" even after the side wall spacers SW are formed.

Figure 3K:
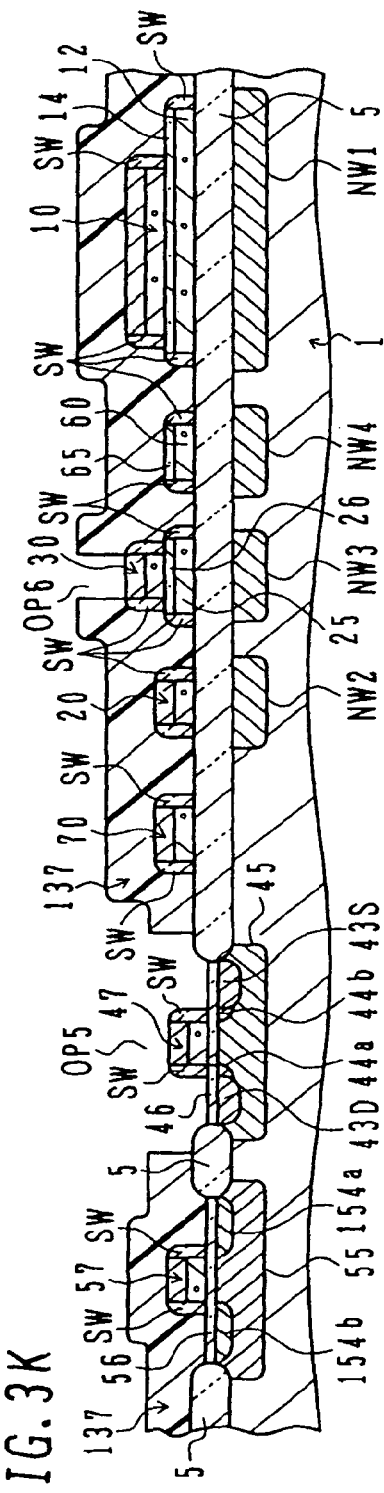

Next, as shown in FIG. 3K, a mask 137 is formed having an opening OP5 above the p-channel MOSFET 42 region. If necessary, an opening above the first fuse 20 or second fuse 30 may be formed through the mask 137. In the example shown in FIG. 3K, an opening OP6 is formed above the second fuse 30.

The mask 137 covers as viewed in plan the most area of the element isolation insulating film 5, the capacitor 10, first fuse 20, gate insulating film 56, gate electrode 57, wiring line 59, resistor 60 and wiring line 70.

Via the opening OP5, p-type impurity ions (such as phosphorus ions) are implanted into the n-type well 45 to form the drain region 43D and source region 43S. In this case, the p-type low concentration impurity doped regions 144a and 144b are narrowed and left only under the sidewall spacers SW on the sidewalls of the gate electrode 47. The low concentration drain region 44a and low concentration source region 44b are therefore formed.

In this case, the p-type impurity ions (such as boron ions) are also implanted into the second fuse 30 via the opening OP6. The electric resistance of the second fuse 30 increases and its breakdown characteristics change. The second fuse 30 becomes hard to be cut.

The mask 137 is thereafter removed and heat treatment is performed to activate the p-type impurities in the drain region 43D, source region 43S and second fuse 30.

Doping the p-type impurities in the second fuse 30 is not essential for forming the semiconductor device 100 shown in FIG. 2. The p-type impurities may be doped into the first fuse 20 instead of the second fuse 30. Impurities may be doped into both the first and second fuses 20 and 30. If impurities are doped neither into the first fuse 20 nor into the second fuse 30, only one opening OP5 is formed through the mask 137.

Figure 3L:
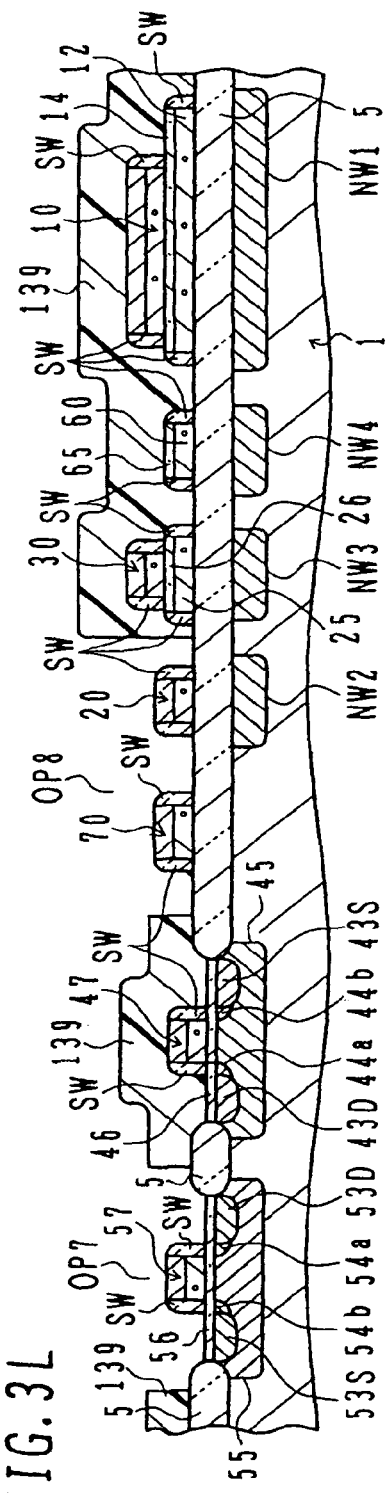

Next, as shown in FIG. 3L, a mask 139 is formed which has an opening OP7 above the n-channel MOSFET region 52 and an opening OP8 above the first fuse 20 and wiring line 70. The mask 139 covers as viewed in plan the most area of the element isolation insulating film 5, the capacitor 10, second fuse 30, gate insulating film 46, gate electrode 47 and resistor 60.

Via the openings OP7 and OP8, n-type impurity ions (such as phosphorus ions) are implanted into the p-type well 55, first fuse 20 and wiring line 70 to form the drain region 53D and source region 53S in the p-type well 55. The n⁻-type low concentration impurity doped regions 154a and 154b are left only under the sidewall spacers SW on the sidewalls of the gate electrode 57. The low concentration drain region 54a and low concentration source region 54b are therefore obtained.

The mask 139 is thereafter removed, and thermal treatment is performed to activate the impurity ions implanted until then.

The interlayer insulating film 80 (refer to FIG. 2) is formed after the impurity doped regions constituting the p-channel MOSFET 42 and n-channel MOSFET 52 are formed.

The interlayer insulating film 80 is formed by depositing by CVD or the like a silicon oxide film, a doped silicon oxide film such as a PSG film and a BPSG film or a lamination film thereof, which is a relatively thick insulating film having a thickness of about 300 to 1500 nm, or preferably about 500 to 1000 nm.

Next, contact holes such as the contact holes CH1 to CH15 shown in FIG. 1 or 2, are formed through the interlayer insulating film 80 at predetermined positions. For example, the contact holes CH1 to CH15 can be formed by forming an etching mask having a predetermined pattern and etching the regions exposed in the etching mask.

A liner metal lamination film such as Ti/TiN(TiON) is formed on the inner wall of each contact hole and then a conductive member such as tungsten (W), aluminum (or aluminum alloy) and copper (or copper alloy) is buried in the contact hole to form a contact plug. Thereafter, a metal layer for upper wiring lines is formed on the interlayer insulating film 80. An etching mask having a predetermined pattern is formed on the metal layer.

The regions of the metal layer exposed in the etching mask are etched and removed to obtain upper wiring lines of a desired shape and complete the semiconductor device 100 shown in FIGS. 1 and 2. The plug in the contact hole, or the plug and wiring line may be formed by a damascene process or a dual damascene process.

According to the manufacture method described above, by selectively using two types of masks (etching masks 120 and 130) to pattern each layer, the capacitor 10, first and second fuses 20 and 30, gate electrodes 47 and 57, resistor 60 and wiring line 70 can be formed on the p-type semiconductor substrate 1. The semiconductor device 100 having the above-described various advantages can be manufactured with a small number of processes.

Next, modifications of the semiconductor device 100 of the first embodiment will be described with reference to FIGS. 4A to 8B.

Figure 4A:
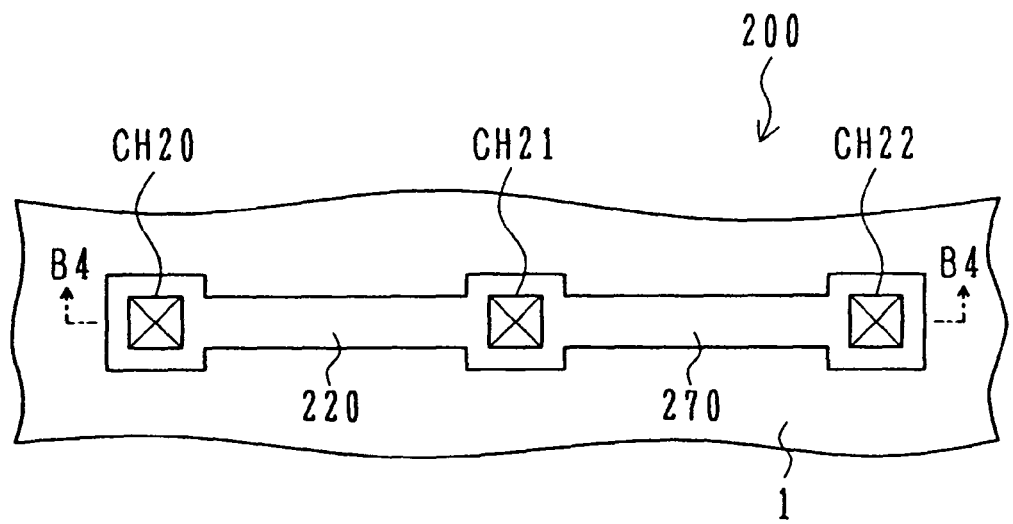
FIG. 4A is a schematic diagram showing the plan layout of a first fuse and a wiring line of a semiconductor device according to a first modification of the first embodiment.

FIG. 4A is a schematic diagram showing the plan layout of a first fuse 220 and a wiring line 270 as the constituent elements of a semiconductor device 200 according to a first modification.

Figure 4B:
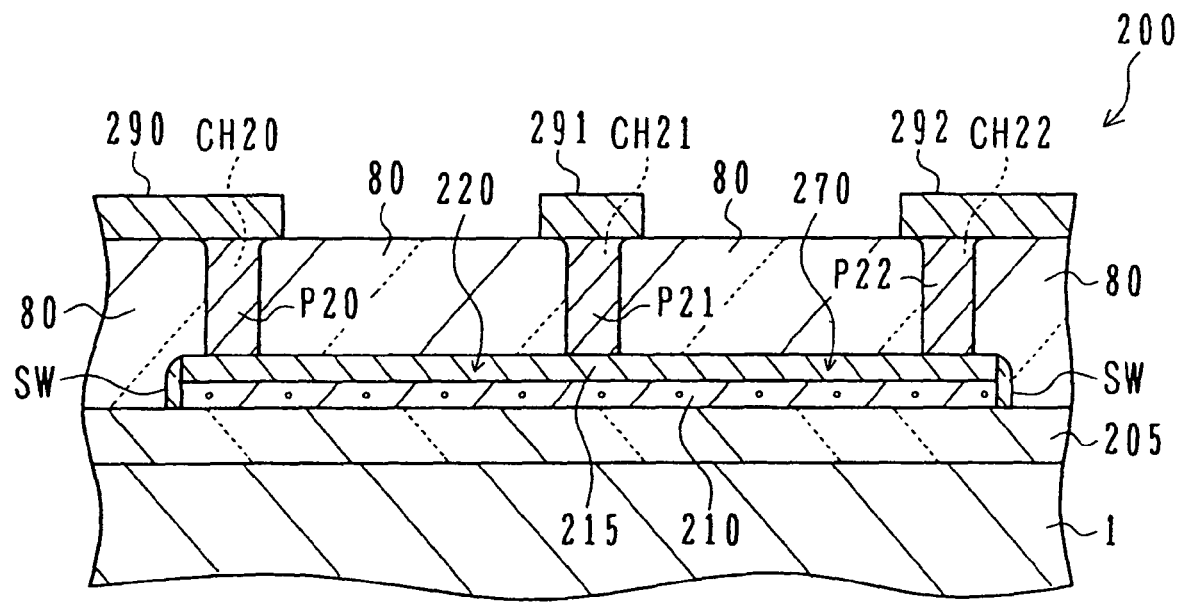
FIG. 4B is a schematic cross sectional view showing a portion of the semiconductor device shown in FIG. 4A cut along line B4-B4 of FIG. 4A.

FIG. 4B is a schematic cross sectional view showing a portion of the semiconductor device taken along line B4-B4 of FIG. 4A.

As shown in FIG. 4A, instead of the first fuse 20 and wiring line 70 shown in FIG. 1, the first fuse 220 and wiring line 270 of the semiconductor device 200 are formed on one surface of a semiconductor substrate 1. The first fuse 220 and wiring line 270 are serially connected and three contact holes CH20, CH21 and CH22 are provided for the first fuse 220 and wiring line 270. The other circuit structure is similar to that of the semiconductor device 100.

As shown in FIG. 4B, a first soluble layer of the first fuse 220 and a first wiring layer of the wiring line 270 are made of a conductive layer 210 formed on an element isolation insulating film 205. A second soluble layer of the first fuse 220 and a second wiring layer of the wiring line 270 are made of a conductive layer 215 formed on the first conductive layer 210.

An n-type well (not shown) is formed under the first fuse 220 similar to the semiconductor device 100. Sidewall spacers SW are formed on the sidewalls of the first fuse 220 and wiring line 270.

The semiconductor device 200 having this structure can be manufactured by a small number of processes similar to the semiconductor device 100, by forming the conductive layer 210 by using the first conductive layer 111 shown in FIG. 3F and forming the conductive layer 215 by using the third conductive layer 125 shown in FIG. 3F.

Three contact holes CH20 to CH22 are formed through an interlayer insulating film 80 (refer to FIG. 4B) and contact plugs P20, P21 and P22 are buried in these contact holes respectively to electrically connect the first fuse 220 to upper wiring lines 290 and 291, and the wiring line 270 to the upper wiring line 291 and an upper wiring line 292.

An area occupied by the circuit having a desired function can be reduced and the semiconductor device 200 can be made compact correspondingly.

Next, a semiconductor device according to a second modification will be described with reference to FIGS. 5A to 5B.

Figure 5A:
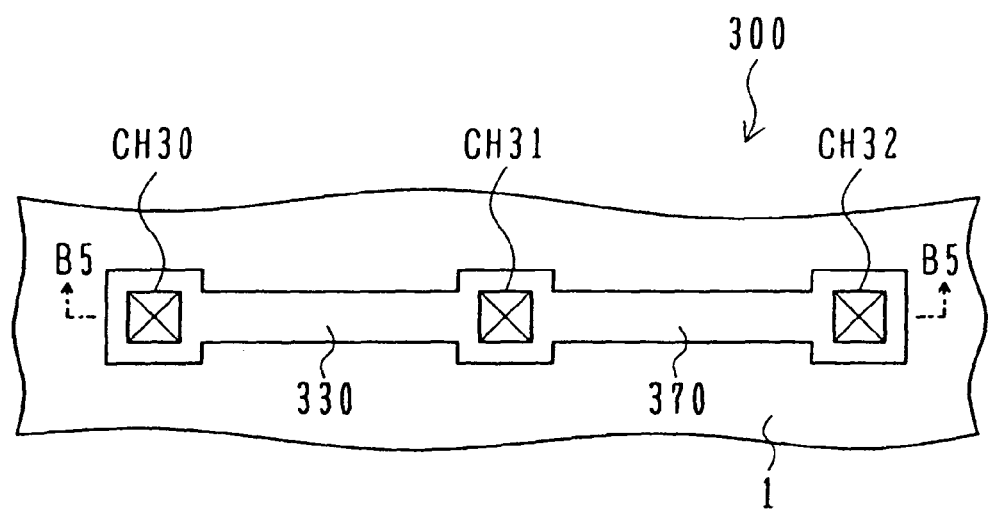
FIG. 5A is a schematic diagram showing the plan layout of a first fuse and a wiring line of a semiconductor device according to a second modification of the first embodiment.

FIG. 5A is a schematic diagram showing the plan layout of a second fuse 330 and a wiring line 370 as the constituent elements of a semiconductor device 300 according to the second modification.

Figure 5B:
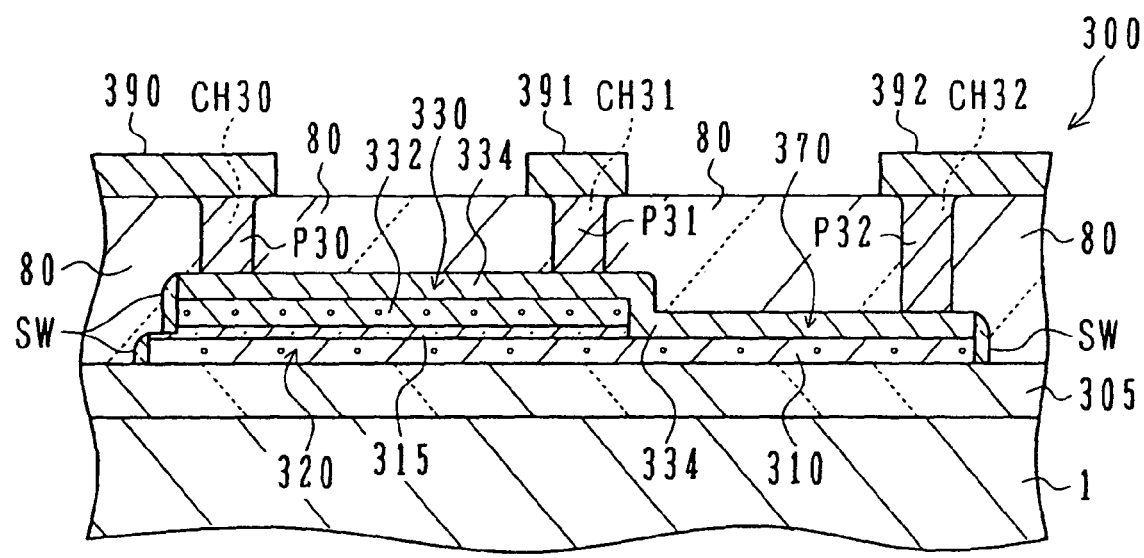
FIG. 5B is a schematic cross sectional view showing a portion of the semiconductor device shown in FIG. 5A cut along line B5-B5 of FIG. 5A.

FIG. 5B is a schematic cross sectional view showing a portion of the semiconductor device 300 taken along line B5-B5 of FIG. 5A.

As shown in FIG. 5A, instead of the second fuse 30 and wiring line 70 shown in FIG. 1, the second fuse 330 and wiring line 370 of the semiconductor device 300 are formed on one surface of a semiconductor substrate 1. The second fuse 330 and wiring line 370 are serially connected and three contact holes CH30, CH31 and CH32 are provided for the second fuse 330 and wiring line 370. The other circuit structure is similar to that of the semiconductor device 100.

As shown in FIG. 5B, the second fuse 330 is formed on an insulating film 315 formed on an underlying layer 320. A first underlying layer constituting the underlying layer 320 and a first wiring layer of the wiring line 370 are made of a conductive layer 310 formed on an element isolation insulating film 305.

A second underlying layer 315 is formed on the first underlying layer (conductive layer) 310, and on this second underlying layer, a first soluble layer 332 and a second soluble layer of the second fuse 330 are stacked in this order. The second soluble layer and a second wiring layer of the wiring line 370 are made of a conductive layer 334 extending from the upper surface of the first soluble layer 332 to the upper surface of the conductive layer 310.

An n-type well (not shown) is formed under the second fuse 330 similar to the semiconductor device 100. Sidewall spacers SW are formed on the sidewalls of the second fuse 330 and wiring line 370.

In the semiconductor device 200 having this structure, the conductive layer 310 can be formed by using the first conductive layer 111 shown in FIG. 3D and the second underlying layer 315 can be formed by using the dielectric layer 113 shown in FIG. 3D. The first soluble layer 332 can be formed by using the second conductive layer 115 show in FIG. 3D and the conductive layer 334 can be formed by using the third conductive layer 125 shown in FIG. 3F.

The semiconductor device 300 can be manufactured by a small number of processes similar to the semiconductor device 100.

Three contact holes CH30 to CH32 are formed through an interlayer insulating film 80 (refer to FIG. 5B) and conductive plugs P30, P31 and P32 are buried in these contact holes respectively to electrically connect the second fuse 330 to upper wiring lines 390 and 391, and the wiring line 370 to the upper wiring line 391 and an upper wiring line 392.

An area occupied by the circuit having a desired function can be reduced and the semiconductor device 300 can be made compact correspondingly.

Next, a semiconductor device according to a third modification will be described with reference to FIGS. 6A to 6B.

Figure 6A:
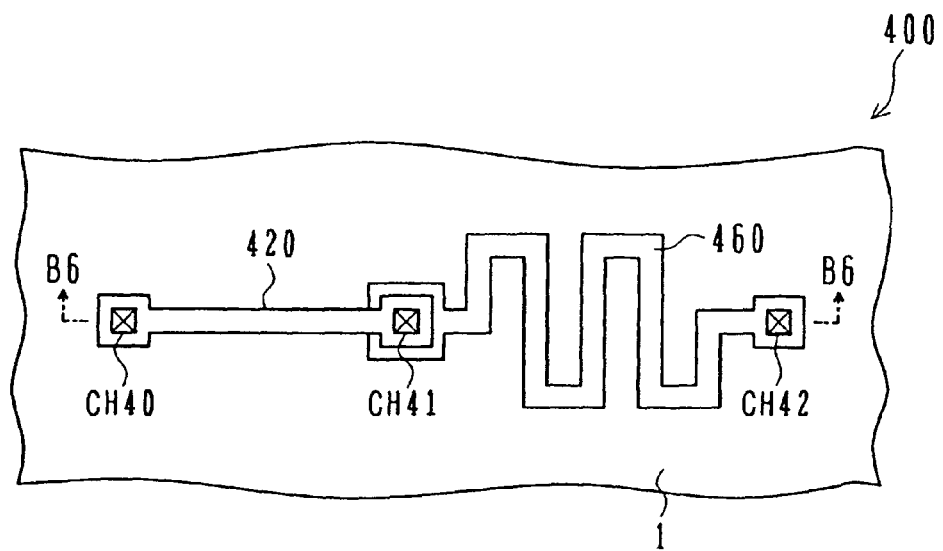
FIG. 6A is a schematic diagram showing the plan layout of a first fuse and a wiring line of a semiconductor device according to a third modification of the first embodiment.

FIG. 6A is a schematic diagram showing the plan layout of a first fuse 420 and a resistor 460 as the constituent elements of a semiconductor device 400 according to the third modification.

Figure 6B:
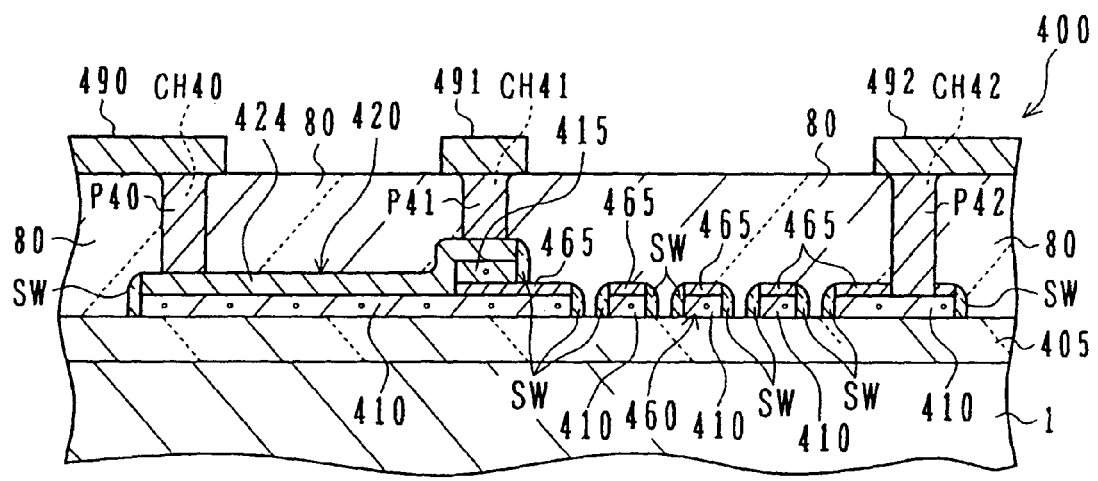
FIG. 6B is a schematic cross sectional view showing a portion of the semiconductor device shown in FIG. 6A cut along line B6-B6 of FIG. 6A.

FIG. 6B is a schematic cross sectional view showing a portion of the semiconductor device 400 taken along line B6-B6 of FIG. 6A.

As shown in FIG. 6A, instead of the first fuse 20 and resistor 60 shown in FIG. 1, the first fuse 420 and resistor 460 of the semiconductor device 400 are formed on one surface of a semiconductor substrate 1. The first fuse 420 and resistor 460 are serially connected and three contact holes CH40, CH41 and CH42 are provided for the first fuse 420 and resistor 460. The other circuit structure is similar to that of the semiconductor device 100.

As shown in FIG. 6B, a first soluble layer of the first fuse 420 and the resistor 460 are made of a conductive layer 410 formed on an element isolation insulating film 405.

The first fuse 420 has a second soluble layer 424 formed on the conductive layer (first soluble layer) 410, and a dielectric layer 465 is disposed on the resistor 460.

One end of the dielectric layer 465 is positioned under the contact hole CH41, one end of a second conductive layer 415 is positioned on the one end of the dielectric layer 465, and one end of the second soluble layer 424 is positioned on the one end of the second conductive layer 465.

An n-type well (not shown) is formed under the first fuse 420 and resistor 460 similar to the semiconductor device 100. Sidewall spacers SW are formed on the sidewalls of the first fuse 420 and resistor 460.

The semiconductor device 400 having this structure can be manufactured by a small number of processes similar to the semiconductor device 100, by forming the conductive layer 410 by using the first conductive layer 111 shown in FIG. 3F and forming the second soluble layer 424 by using the third conductive layer 125 shown in FIG. 3F.

Three contact holes CH40 to CH42 are formed through an interlayer insulating film 80 (refer to FIG. 6B) and contact plugs P40, P41 and P42 are buried in these contact holes respectively to electrically connect the first fuse 420 to upper wiring lines 490 and 491, and the resistor 460 to the upper wiring line 491 and an upper wiring line 492.

An area occupied by the circuit having a desired function can be reduced and the semiconductor device 400 can be made compact correspondingly.

Next, a semiconductor device according to a fourth modification will be described with reference to FIGS. 7A to 7B.

Figure 7A:
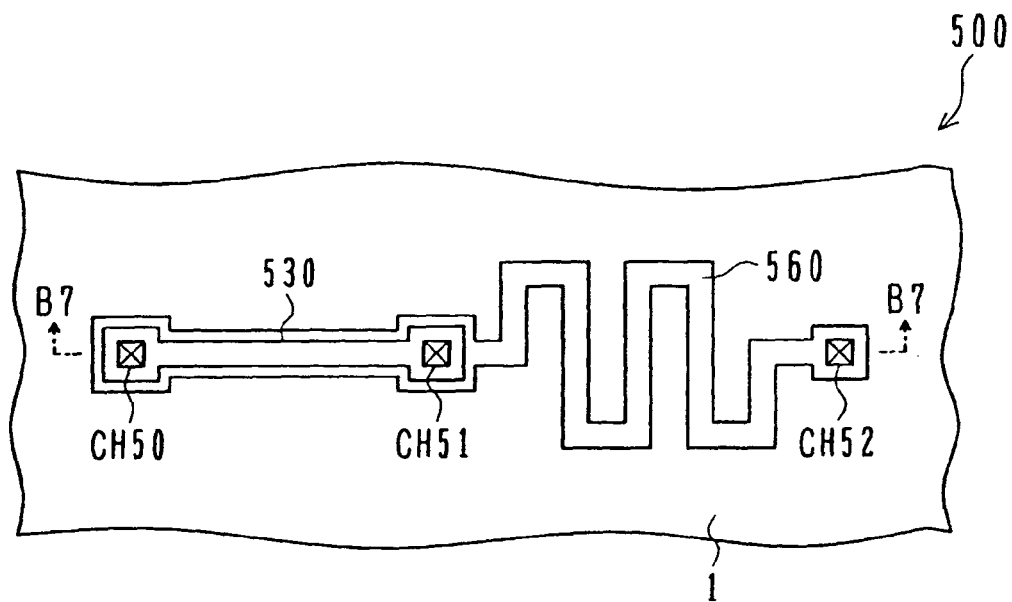
FIG. 7A is a schematic diagram showing the plan layout of a first fuse and a wiring line of a semiconductor device according to a fourth modification of the first embodiment.

FIG. 7A is a schematic diagram showing the plan layout of a second fuse 530 and a resistor 560 as the constituent elements of a semiconductor device 500 according to the fourth modification.

Figure 7B:
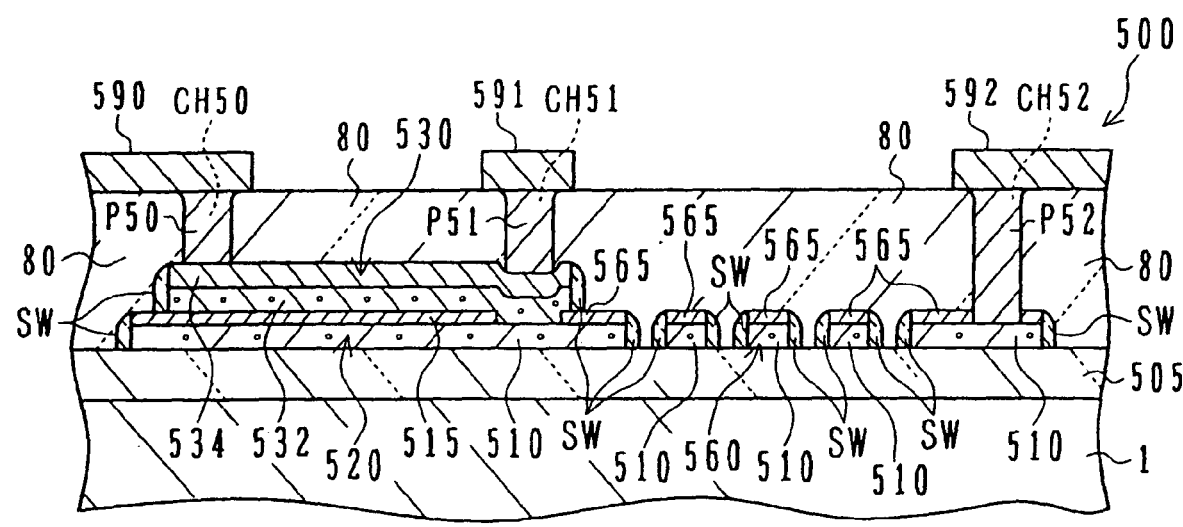
FIG. 7B is a schematic cross sectional view showing a portion of the semiconductor device shown in FIG. 7A cut along line B7-B7 of FIG. 7A.

FIG. 7B is a schematic cross sectional view showing a portion of the semiconductor device 500 taken along line B7-B7 of FIG. 7A.

As shown in FIG. 7A, instead of the second fuse 30 and resistor 60 shown in FIG. 1, the second fuse 530 and resistor 560 of the semiconductor device 500 are formed on one surface of a semiconductor substrate 1. The second fuse 530 and resistor 560 are serially connected and three contact holes CH50, CH51 and CH52 are provided for the second fuse 530 and resistor 560. The other circuit structure is similar to that of the semiconductor device 100.

As shown in FIG. 7B, the second fuse 530 is formed on an underlying layer 520. A first underlying layer constituting the underlying layer 520 and the resistor 560 are made of a conductive layer 510 formed on an element isolation insulating film 505.

A second underlying layer 515 is formed on the first underlying layer (conductive layer) 510, and on this second underlying layer, a first soluble layer 532 and a second soluble layer 534 of the second fuse 530 are stacked in this order. A dielectric layer 565 is disposed on the resistor 560. The dielectric layer 565 and the second underlying layer 515 are made of the same material and can be formed by patterning the same dielectric layer.

Under the contact hole CH51, the first conductive layer 510 and first and second soluble layers 532 and 534 are stacked in this order on the element isolation insulating film 505.

An n-type well (not shown) is formed under the second fuse 530 and resistor 560 similar to the semiconductor device 100. Sidewall spacers SW are formed on the sidewalls of the second fuse 530 and resistor 560.

In the semiconductor device 500 having this structure, the conductive layer 510 can be formed by using the first conductive layer 111 shown in FIG. 3D and the second underlying layer 515 can be formed by using the dielectric layer 113 shown in FIG. 3D. The first soluble layer 532 can be formed by using the second conductive layer 115 show in FIG. 3D and the second soluble layer 534 can be formed by using the third conductive layer 125 shown in FIG. 3F.

The semiconductor device 500 can be manufactured by a small number of processes similar to the semiconductor device 100.

Three contact holes CH50 to CH52 are formed through an interlayer insulating film 80 (refer to FIG. 7B) and contact plugs P50, P51 and P52 are buried in these contact holes respectively to electrically connect the second fuse 530 to upper wiring lines 590 and 591, and the resistor 560 to the upper wiring line 591 and an upper wiring line 592.

An area occupied by the circuit having a desired function can be reduced and the semiconductor device 500 can be made compact correspondingly.

Next, a semiconductor device according to a fifth modification will be described with reference to FIGS. 8A to 8B.

Figure 8A:
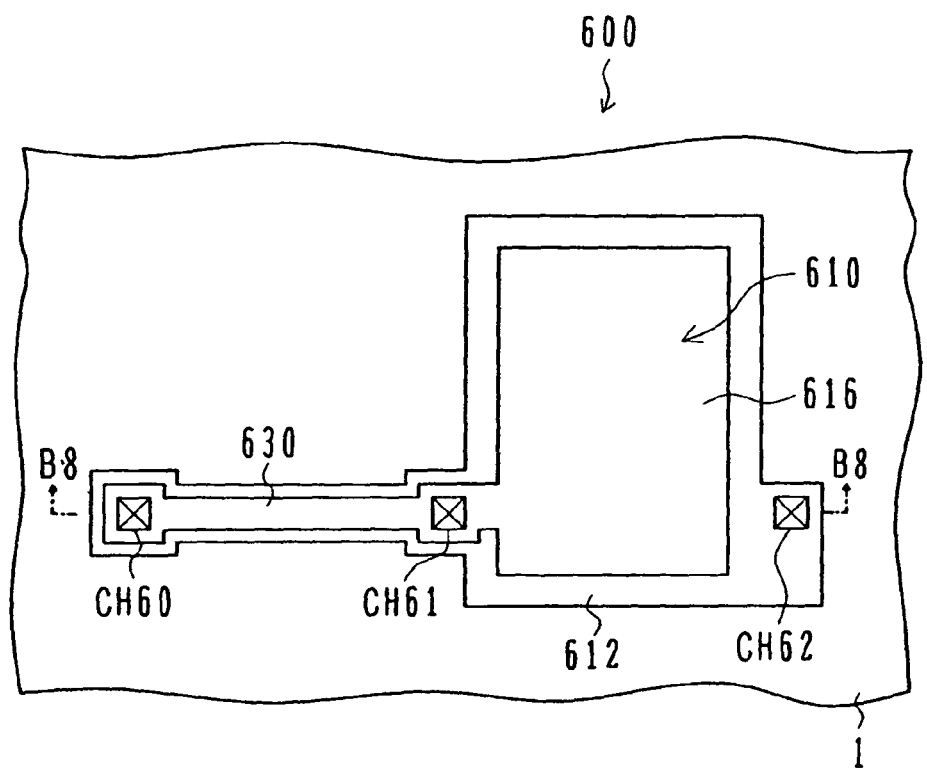
FIG. 8A is a schematic diagram showing the plan layout of a first fuse and a wiring line of a semiconductor device according to a fifth modification of the first embodiment.

FIG. 8A is a schematic diagram showing the plan layout of a capacitor 610 and a second fuse 630 as the constituent elements of a semiconductor device 600 according to the fifth modification.

Figure 8B:
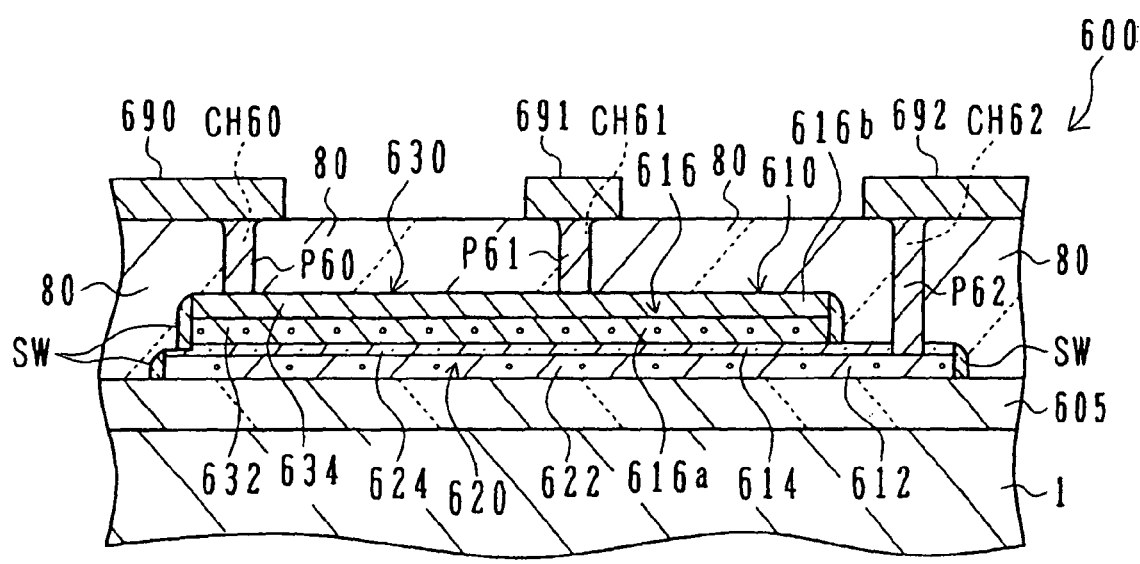
FIG. 8B is a schematic cross sectional view showing a portion of the semiconductor device shown in FIG. 8A cut along line B8-B8 of FIG. 8A.

FIG. 8B is a schematic cross sectional view showing a portion of the semiconductor device 600 taken along line B8-B8 of FIG. 8A.

As shown in FIG. 8A, instead of the capacitor 10 and second fuse 30 shown in FIG. 1, the capacitor 610 and second fuse 630 of the semiconductor device 600 are formed on one surface of a semiconductor substrate 1. The capacitor 610 and second fuse 630 are serially connected. The other circuit structure is similar to that of the semiconductor device 100.

Three contact holes CH60, CH61 and CH62 are provided for the capacitor 610 and second fuse 630. The contact hole CH60 is positioned at one end of the second fuse 630. The contact hole CH61 is positioned at the other end of the second fuse 630 and an upper electrode 616 of the capacitor 610. The contact hole CH62 is positioned at a lower electrode 612 of the capacitor 610.

As shown in FIG. 8B, the capacitor 610 has the lower electrode 612 formed on an element isolation insulating film 605, a capacitor insulating film 614 formed on the lower electrode, and the upper electrode 616 formed on the capacitor insulating film. The upper electrode 616 has a two-layer structure of a first upper electrode 616a formed on the capacitor insulating film 614 and a second upper electrode 616b formed on the first upper electrode.

The second fuse 630 has a first soluble layer 632 formed on an underlying layer 620 and a second soluble layer 634 formed on the first soluble layer. The first soluble layer 632 and the first upper electrode 616a of the capacitor 610 are formed by patterning the same conductive film and are continuous with each other. The second soluble layer 634 and the second upper electrode 616b of the capacitor 610 are continuous with each other and can be formed by patterning the same conductive film.

The underlying layer 620 has a first underlying layer 622 formed on the element isolation insulating film 605 and a second underlying layer 624 formed on the first underlying layer. The first underlying layer 622 and the lower electrode 612 of the capacitor 610 are formed by pattering the same conductive film and are continuous with each other. The second underlying layer 624 and the capacitor insulating film 614 of the capacitor 610 are continuous with each other and can be formed by pattering the same dielectric layer.

An n-type well (not shown) is formed under the capacitor 610 and second fuse 630 similar to the semiconductor device 100. Sidewall spacers SW are formed on the sidewalls of the capacitor 610 and second fuse 630.

In the semiconductor device 600 having this structure, the lower electrode 612 and first underlying layer 622 can be formed by using the first conductive layer 111 shown in FIG. 3D, and the capacitor insulating film 614 and second underlying layer 624 can be formed by using the dielectric layer 113 shown in FIG. 3D. The first upper electrode 616a and first soluble layer 632 can be formed by using the second conductive layer 115 show in FIG. 3D and the second upper electrode 616b and second soluble layer 634 can be formed by using the third conductive layer 125 shown in FIG. 3F.

The semiconductor device 600 can be manufactured by a small number of processes similar to the semiconductor device 100.

Three contact holes CH60 to CH62 are formed through an interlayer insulating film 80 (refer to FIG. 8B) and contact plugs P60, P61 and P62 are buried in these contact holes respectively to electrically connect the second fuse 630 to upper wiring lines 690 and 691, and the capacitor 610 to the upper wiring line 691 and an upper wiring line 692.

An area occupied by the circuit having a desired function can be reduced and the semiconductor device 600 can be made compact correspondingly.

Next, a semiconductor device according to the second embodiment will be described.

Figure 9A:
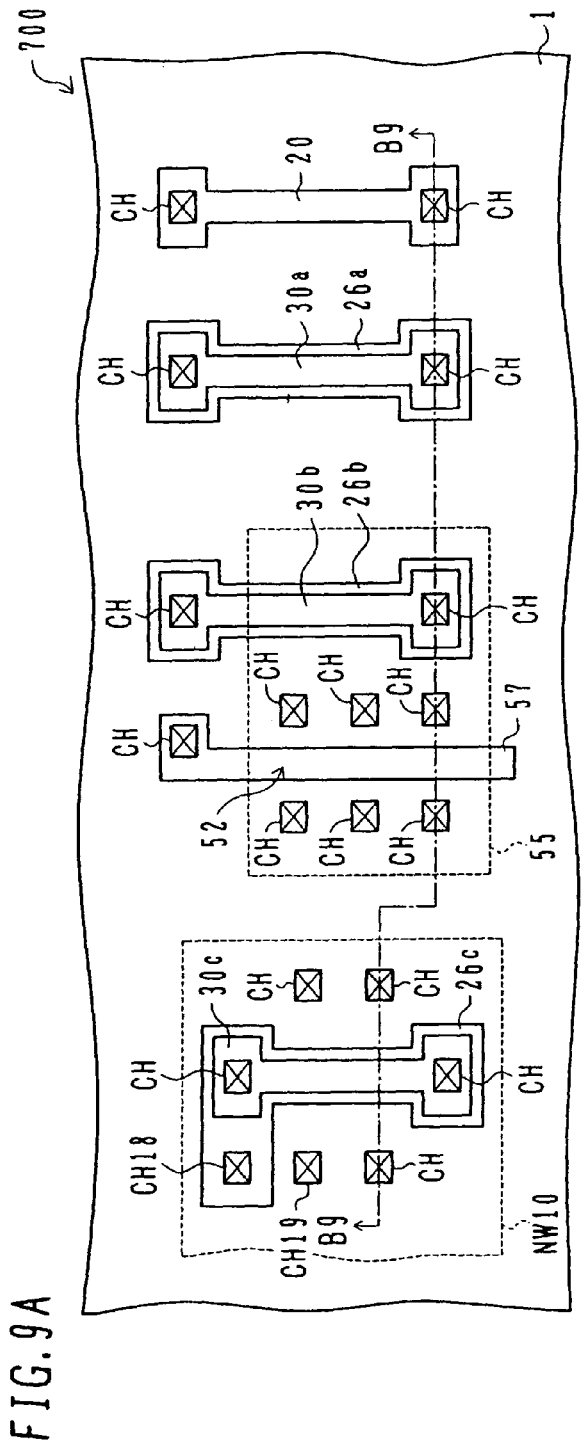
FIG. 9A is a schematic diagram showing the plan layout of circuit elements of a semiconductor device according to a second embodiment.
Figure 9B:
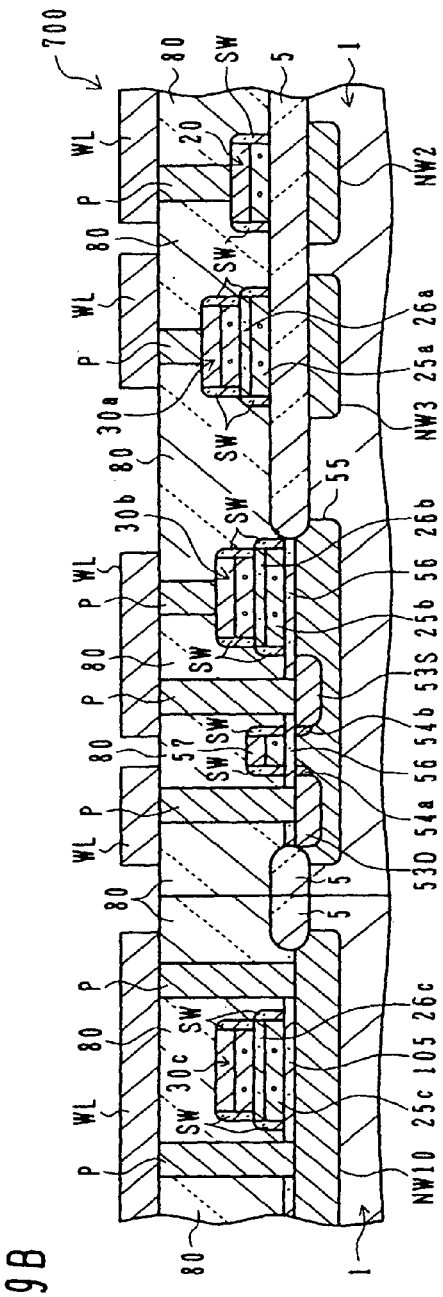
FIG. 9B is a schematic cross sectional view taken along line B9-B9 of FIG. 9A.

FIG. 9A is a schematic diagram showing the plan layout of circuit elements of a semiconductor device 700 according to the second embodiment, and FIG. 9B is a schematic cross sectional view taken along line B9-B9 of FIG. 9A.

The semiconductor device 700 shown in FIGS. 9A and 9B has four fuses and one n-channel MOSFET 52. The structures of circuit elements are similar to those of the first fuse 20, second fuse 30 and n-channel MOSFET 52 shown in FIG. 2.

Similar constituent elements in FIGS. 9A and 9B to those shown in FIG. 2 are represented by using identical reference numerals and symbols and the description thereof is omitted.

Of four fuses, three fuses have the same structure as the second fuse 30 shown in FIG. 2. These three fuses are represented by new reference symbols 30a, 30b and 30c to distinguish one from another. Under each of the three fuses 30a to 30c, a specific underlying layer is disposed which is constituted of first and second underlying layers similar to the second fuse 30 shown in FIG. 2. These underlying layers are represented by new reference symbols 25a, 25b and 25c for the first underlying layers, and 26a, 26b and 26c for the second underlying layers.

The fuse 20 is formed on an element isolation insulating film 5. The fuse 30a is disposed above the element isolation insulating film 5 via the first underlying layer 25a and second underlying layer 26a.

A p-type well 55 constituting a channel region of the n-channel MOSFET 52 extends outside of a source region 53S as viewed in plan, and in this extended area, a gate insulating film 56, the first and second underlying layers 25b and 26b and the fuse 30b are stacked in this order. The electrically insulating film 105 is formed at the same time when a gate insulating film 46 is formed.

An interlayer insulating film 80 covers each circuit element, and a predetermined number of upper wiring lines are formed on the interlayer insulating film. A plurality of contact holes per each circuit element are formed through the interlayer insulating film to connect each upper wiring line to a corresponding circuit element under the wiring line. A contact plug is buried in each contact hole CH.

In FIG. 9A, twenty contact holes are illustratively shown. For the purposes of simplicity, these contact holes are represented by the same reference symbol CH, excepting two contact holes CH18 and CH19.

In FIG. 9B, although the upper wiring lines are electrically separated, they are represented by the same reference symbols WL for the purposes of simplicity. The contact plugs are represented by the same reference symbols P for the same reason.

In the semiconductor device 700 shown in FIGS. 9A and 9B, although any potential can be set to the first underlying layers 25b and 25c, it is preferable that the first underlying layer 25b is set to a ground potential or the same potential as that of the source region 53S and the first underlying layer 25c is set to the ground potential or the same potential as that of the n-type well NW10.

For example, the fuse 30c and n-type well NW10 are electrically connected by the contact plug buried in the contact hole CH18 shown in FIG. 9A, the contact plug buried in the contact hole CH19 shown in FIG. 9A and a predetermined upper wiring line interconnecting these contact plugs. The potential of the first underlying layer 25c can therefore be set to the same potential as that of the n-type well NW10.

The semiconductor device 700 having the structure described above has the technical advantages similar to the semiconductor device 100 of the first embodiment from the same reason described earlier.

Next, a modification of the semiconductor device 700 of the second embodiment will be described.

Figure 10A:
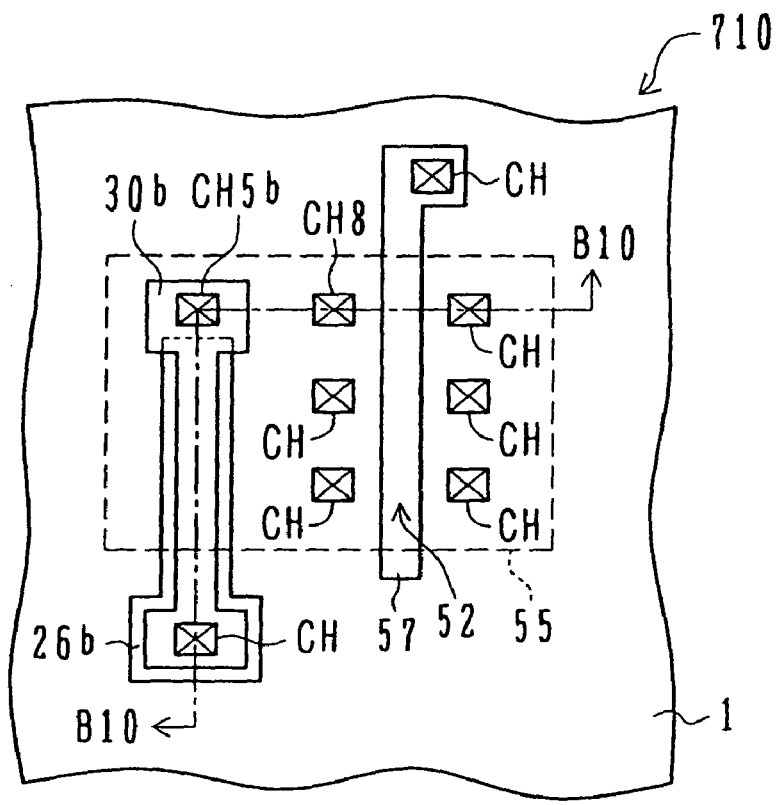
FIG. 10A is a schematic diagram showing the plan layout of a p-channel MOSFET and a fuse of a semiconductor device according to a modification of the second embodiment.
Figure 10B:
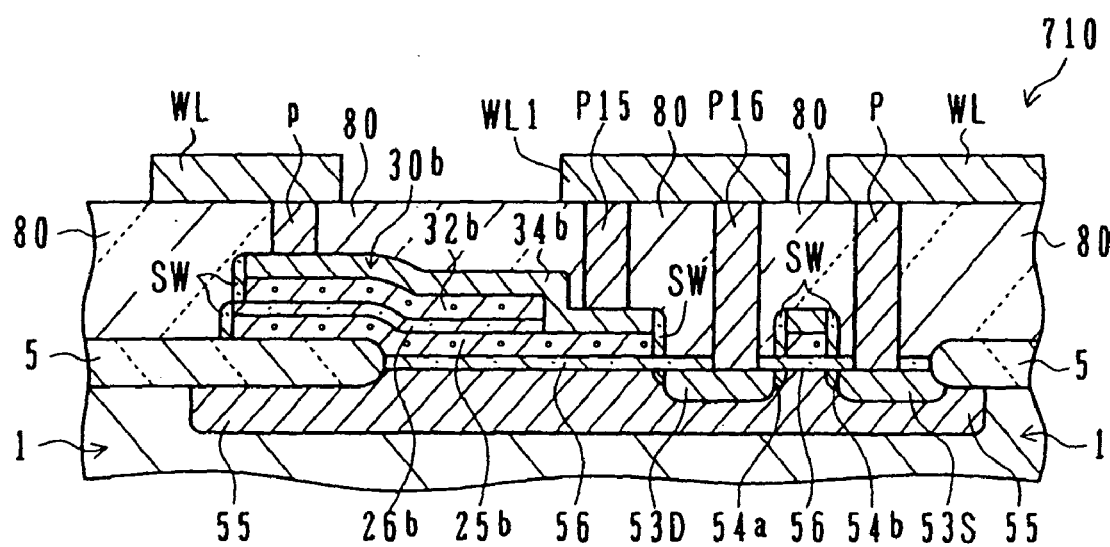
FIG. 10B is a schematic cross sectional view taken along line B10-B10 of FIG. 10A.

FIG. 10A is a schematic diagram showing the plan layout of an n-channel MOSFET 52 and a fuse 30b constituting a semiconductor device 710 according to the modification, and FIG. 10B is a schematic cross sectional view taken along line B10-B10 of FIG. 10A.

In the semiconductor device 710 shown in FIGS. 10A and 10B, a drain region 53D of the n-channel MOSFET 52 is disposed to the left of a gate electrode 57. The fuse 30b is disposed outside of the drain region 53D as viewed in plan.

The other structure is similar to that of the semiconductor device 700 of the second embodiment, and the description and drawing thereof are omitted. Similar constituent elements in FIGS. 10A and 10B to those shown in FIGS. 9A and 9B are represented by using identical reference numerals and symbols.

In the semiconductor device 710 shown in FIGS. 10A and 10B, a first underlying layer 25b under the fuse 30b is disposed extending over the whole length of the fuse 30b. A second underlying layer 26b is disposed on the first underlying layer 25b, excluding the area under one end portion of the fuse 30b under a contact hole CH5b.

A first soluble layer 32b constituting the fuse 30b is formed only on a second underlying layer 26b. A first conductive layer 32 is not formed in the end portion under the contact hole CH5b. A second soluble layer 34b constituting the fuse 30b extends over the whole length of the fuse 30b. The first underlying layer 25b and second soluble layer 34b contact each other in the end portion under the contact hole CH5b.

The first underlying layer 25b and drain region 53D are electrically connected by the second soluble layer 34b, a contact plug P15 in the contact hole CH5b, an upper wiring line WL1 and a contact plug P16 in a contact hole CH8. The potential of the first underlying layer 25b is the same as that of the drain region 53D.

Nine contact holes are shown in FIG. 10A. These contact holes are represented by the identical reference symbol CH for the purposes of simplicity, excepting the contact holes CH5b and CH8.

Three upper wiring lines and four contact plugs are shown in FIG. 10B. For the purposes of simplicity, the upper wiring lines are represented by the same reference symbol WL excepting one upper wiring line WL1 and the contact plugs are represented by the same reference symbol P excepting the contact plugs P15 and P16.

The semiconductor device 710 having the structure described above has the technical advantages similar to the semiconductor device 100 of the first embodiment from the same reason described earlier.

Even if the first underlying layer 25b and drain region 53D are set to the same potential, the potential is prevented from being applied directly to the substrate 1 because of the shadowing effect of the underlying layer 25b of the fuse 30b. The underlying layer 25b can prevent heat generated upon fuse breakdown from directly propagating to the substrate side.

Since the first underlying layer 25b and the second soluble layer 34b of the fuse 30b are in direct contact, the size of the first underlying layer 25b can be made smaller than the first underlying layer 25c shown in FIG. 9B even if the potential of the first underlying layer 25b is set to the same potential as that of the drain region 53D. The total area of the fuse 30b and underlying layer can be reduced.

The embodiments of the semiconductor device and manufacture method and the modifications of the semiconductor devices have been described above. The invention is not limited only to the embodiments and modifications.

For example, the conductivity type of the semiconductor substrate of the semiconductor device is not limited to the p-type.

In addition to silicon substrates, various semiconductor substrates of a single layer structure or a multi-layer structure may be used.

The semiconductor device has at least a capacitor, a MOSFET and a fuse. The fuse of the semiconductor device may be the first fuse 20 shown in FIG. 2 or the second fuse 30 shown in FIG. 2.

The circuit structure of the semiconductor device as well as the layout of circuit elements may be selected as desired in accordance with the target application field of each semiconductor device. Various circuits may be used including a memory circuit, a trimming circuit, a defect relieving circuit and the like.

The first to third conductive layers described in the semiconductor manufacture method may be patterned to be a conductive layer commonly used by circuit elements including a gate electrode, in addition to the first to fifth modifications.

The film forming conditions and film etching conditions for each layer formed on a semiconductor substrate of a semiconductor device are not limited only to those described in the embodiment manufacture methods.

For example, if n-type polysilicon is used for forming the lower electrode 12 of the capacitor 10 and the first soluble layer 22 of the first fuse 20 shown in FIG. 2, p-type polysilicon may be used if necessary for forming the first gate electrode 47a of the p-channel MOSFET 42 and the first gate electrode 57a of the n-channel MOSFET 52. In this case, for example, the first conductive layer 111 shown in FIG. 3B is formed by forming a non-doped polysilicon film and implanting n-type impurities into a predetermined region and implanting p-type impurities such as boron into another predetermined region.

In place of the above-described gate insulating film, a metal silicide film may be formed if necessary on the source and drain regions of MOSFET.

FIGS. 11A and 11B illustrate a process of forming a metal silicide film on the source and drain regions.

Prior to executing the process shown in FIG. 11A, the processes up to the process shown in FIG. 3L are executed and thereafter the mask 139 shown in FIG. 3L is removed. The gate oxide films (natural oxide films) 46 and 56 formed on the source regions 43S and 53S and drain regions 43D and 53D are removed, for example, with dilute hydrofluoric acid (e.g., 500:1 HF).

Next, as shown in FIG. 11A, metal such as titanium (Ti), nickel (Ni), cobalt (Co) and tungsten (W) or alloy of these metals is deposited on the whole surface of the semiconductor substrate 1 by sputtering, CVD or the like to form a metal or alloy thin film 140.

All the constituent elements shown in FIG. 11A excepting the metal or alloy thin film 140 are shown in FIG. 3L, and these elements are represented by using identical reference symbols to those shown in FIG. 3L and the description thereof is omitted.

The metal thin film 140 is subjected to heat treatment by using a rapid thermal annealing (RTA) system or the like to silicidate the metal thin film 140. For example, the silicidation heat treatment is performed in an inert gas atmosphere such as nitrogen gas and argon gas under the conditions of 650° C. and 10 seconds.

Silicidation of the metal thin film 140 occurs only in the region where silicon and the metal thin film 140 contact directly. Namely, silicidation of the metal thin film 140 occurs on the source regions 43S and 53S and drain regions 43D and 53D, and will not occur in other regions. Silicidation will not occur on the surface of the resistor (wiring line) 60 because the insulating film 65 made of a dielectric layer 113 covers the resistor and the high resistance film remains in a self alignment manner. A resistor having a high resistance can therefore be formed by a more simple method.

Thereafter, the metal thin film 140 not silicidated is washed out.

As shown in FIG. 11B, a metal silicide film 142 is left on the source regions 43S and 53S and drain regions 43D and 53D. The metal silicide film 142 is formed in a self alignment manner only on the source regions 43S and 53S and drain regions 43D and 53D.

Thereafter, if necessary, the metal silicide film 142 is subjected to heat treatment by using an RTA system or the like. For example, the heat treatment is performed in an inert gas atmosphere such as nitrogen gas and argon gas under the conditions of 850° C. and 10 seconds. With this heat treatment, for example, MSi (M indicates a metal element constituting the metal thin film 140) changes to $MSi_2$ so that the conductivity of the metal silicide film 142 can be improved.

Since the thickness of the metal silicide film 142 can be set as desired, it is easy to thicken the metal silicide film so that the electric resistance of MOSFET can be lowered easily.

At the same time when the heat treatment for the metal silicide film 142 is completed, the heat treatment can be completed also for the second upper electrode 16b of the capacitor 10, the second soluble layer 24 of the first fuse 20, the second soluble layer 34 of the second fuse 30, the second gate electrode 47b of the gate electrode 47, the second gate electrode 57b of the gate electrode 57, and the second conductive layer 74.

FIGS. 12A and 12B illustrate a process of forming other electrodes or layers at the same time when the metal silicide film 142 shown in FIG. 11B is formed.

Prior to executing the process shown in FIG. 12A, the processes shown in FIGS. 3G to 3L are sequentially executed without forming the third conductive layer 125 shown in FIG. 3F, and thereafter the mask 139 shown in FIG. 3L is removed. The gate oxide films (natural oxide films) 46 and 56 formed on the source regions 43S and 53S and drain regions 43D and 53D are removed in the manner described above.

Next, as shown in FIG. 12A, metal such as titanium (Ti), nickel (Ni), cobalt (Co) and tungsten (W) or alloy of these metals is deposited on the whole surface of the semiconductor substrate 1 by sputtering, CVD or the like to form a metal or alloy thin film 140.

All the constituent elements shown in FIG. 12A excepting the metal or alloy thin film 140 are shown in FIG. 3G or 3L, and these elements are represented by using identical reference symbols to those shown in FIG. 3G or 3L and the description thereof is omitted.

The metal thin film 140 is subjected to heat treatment in the manner described above to silicidate the metal thin film 140. With this silicidation, a metal silicide film is formed on the first upper electrode 16a, first soluble layers 22 and 32, source regions 43S and 53S, drain regions 43D and 53D, first gate electrodes 47a and 57a and first conductive layer 72. Silicidation of the metal thin film 140 will not occur in other regions because silicon is not exposed.

Thereafter, the metal thin film 140 not silicidated is washed out.

As shown in FIG. 12B, a metal silicide film is left in a self alignment manner on the first upper electrode 16a, first soluble layers 22 and 32, first gate electrodes 47a and 57a and first conductive layer 72. The second upper electrode 16b, second soluble layers 24 and 34, second gate electrodes 47b and 57b and second conductive layer 74 are therefore formed.

Further, a metal silicide film 142 is left in a self alignment manner on the source regions 43S and 53S, drain regions 43D and 53D.

Thereafter, if necessary, the metal silicide film 142 is subjected to heat treatment by using an RTA system or the like. With this heat treatment, the conductivity of the metal silicide film can be improved.

As a modification and application of these processes, the insulating film 14 around the contact hole CH1 of the capacitor lower electrode and the insulating film 65 around the contact holes CH12 and CH13 of the high resistance resistor may be removed and a silicide film is formed on the contact area of the capacitor lower electrode and high resistance resistor in a self alignment manner to lower the contact resistance.

Figure 13:
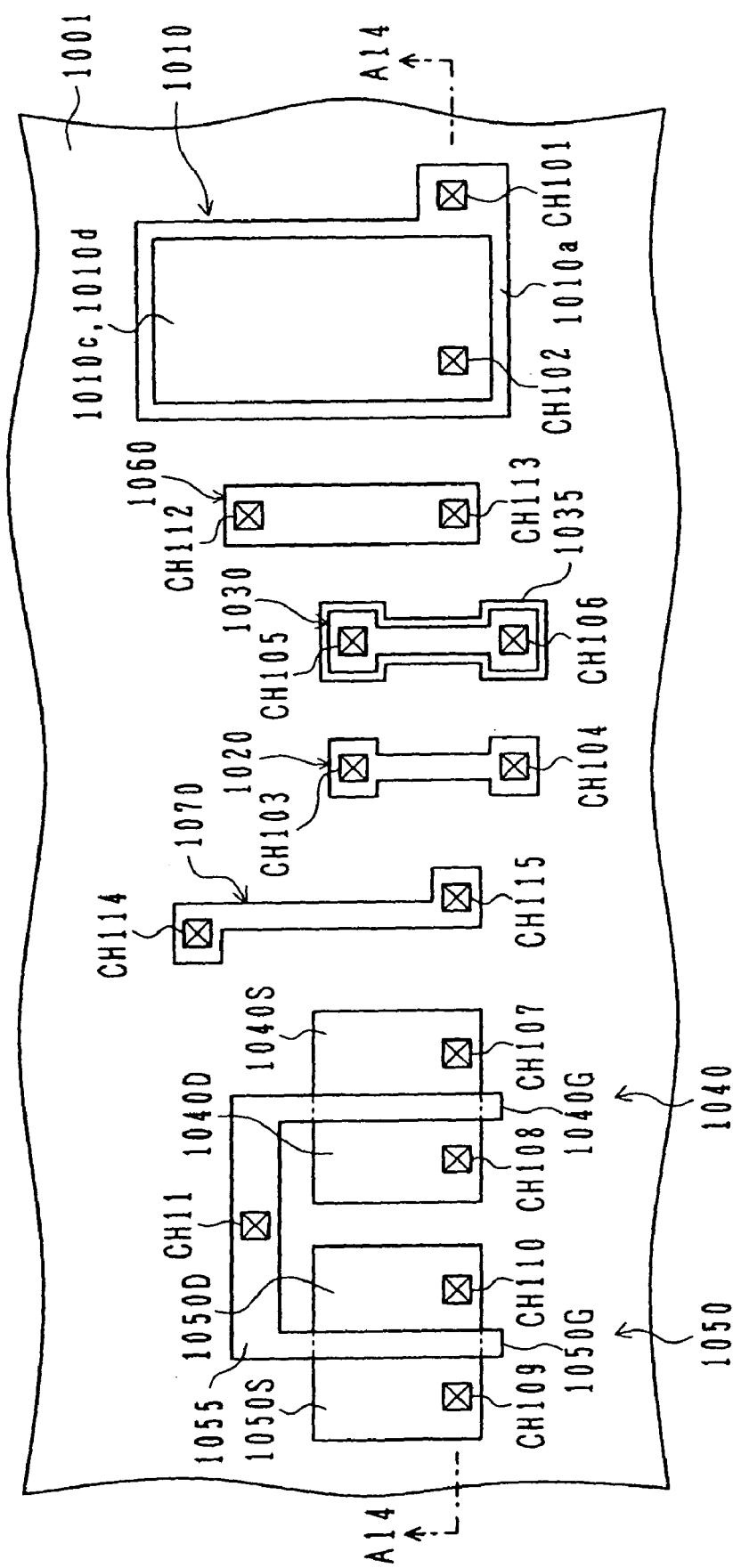
FIG. 13 is a plan view of a semiconductor device according to a third embodiment.

FIG. 13 is a plan view partially showing a semiconductor device according to the third embodiment. An NMOSFET 1050, a PMOSFET 1040, a wiring line 1070, a first fuse 1020, a second fuse 1030, a resistor 1060 and a capacitor 1010 are disposed in this order from the left to right in FIG. 13. A gate electrode 1050G of NMOSFET 1050 traverses an active region, and a gate electrode 1040G of PMOSFET 1040 traverses another active region. A source region 1050S and a drain region 1050D of NMOSFET 1050 are defined on both sides of the gate electrode 1050G, and a source region 1040S and a drain region 1040D of PMOSFET 1040 are defined on both sides of the gate electrode 1040G. The gate electrode 1050G is continuous with the gate electrode 1040G via a wiring line 1055. The second fuse 1030 is disposed in an inner area of a platform 1035.

Inside of the source region 1040S, drain region 1040D, source region 1050S and drain region 1050D, contact holes CH107, CH108, CH109 and CH10 are disposed.

Contact holes CH114 and CH115 are disposed in opposite end portions of the wiring line 1070. Contact holes CH103 and CH104 are disposed in opposite end portions of the first fuse 1020. Contact holes CH105 and CH106 are disposed in opposite end portions of the second fuse 1030. Contact holes CH112 and CH113 are disposed in opposite end portions of the resistor 1060.

The capacitor 1010 includes a lower electrode 1010a and upper electrodes 1010c and 1010d formed in an inner area of the lower electrode. A contact hole CH101 is disposed in the inner area of the lower electrode 1010a and in an outer area of the upper electrodes 1010c and 1010d, and a contact hole CH102 is disposed in the inner area of the upper electrodes 1010c and 1010d.

Figure 14:
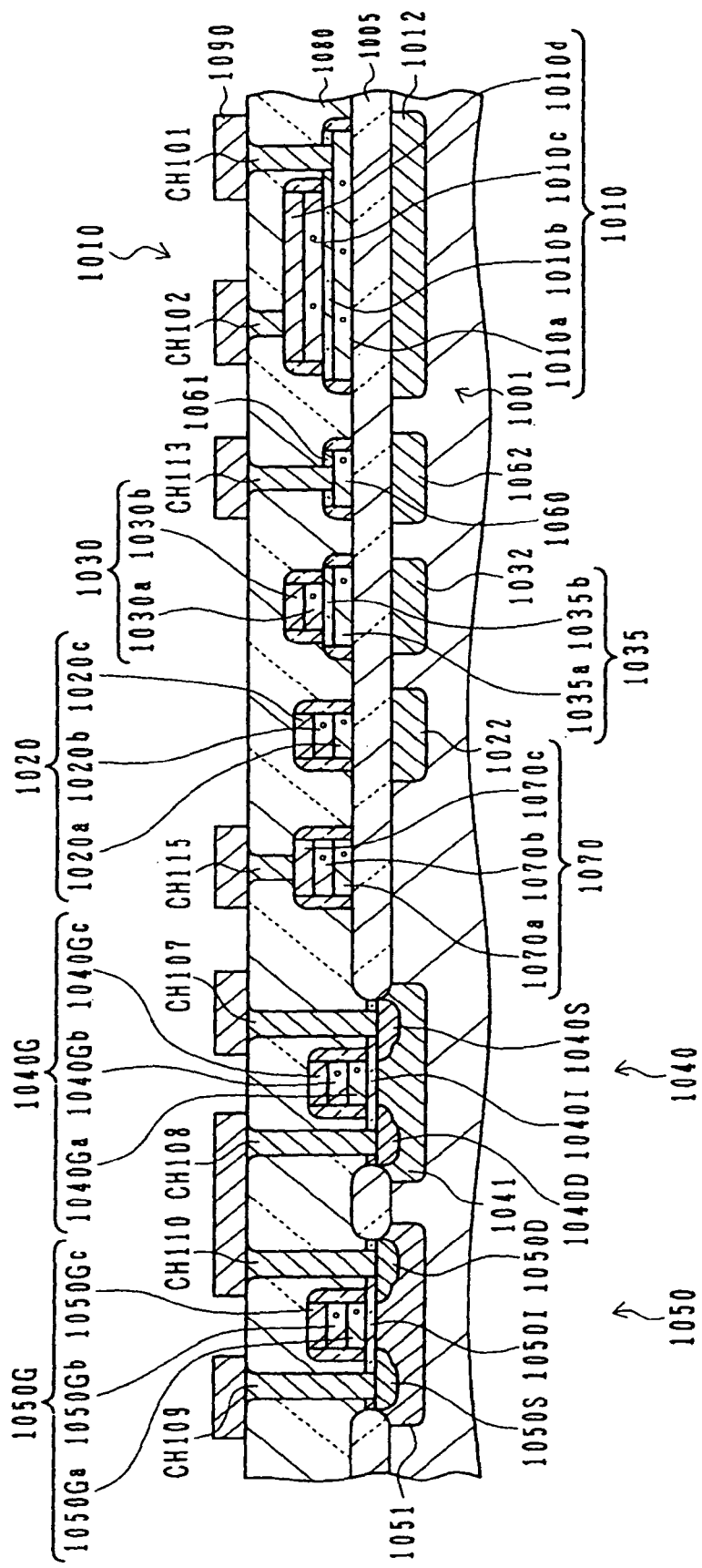
FIG. 14 is a cross sectional view of the semiconductor device of the third embodiment.

FIG. 14 is a cross sectional view taken along one-dot chain line A14-A14 of FIG. 13. A partial surface of a semiconductor substrate 1001 made of p-type silicon is covered with an element isolation insulating film (field oxide film) 1005 which surrounds and defines a plurality of active regions. One active region is disposed in a p-type well 1051 and another active region is disposed in an n-type well 1041. The NMOSFET 1050 is disposed in the active region inside the p-type well 1051, and the PMOSFET 1040 is disposed in the active region inside the n-type well 1041. Disposed on the element isolation insulating film 1005 are the wiring line 1070, first fuse 1020, second fuse 1030, resistor 1060 and capacitor 1010. In the surface layer in contact with the bottom of the element isolation insulating film 1005, n-type wells 1022, 1032, 1062, and 1012 are formed under the first fuse 1020, second fuse 1030, resistor 1060 and capacitor 1010.

The NMOSFET 1050 is constituted of the source region 1050S, drain region 1050D, a gate insulating film 10501 and the gate electrode 1050G. The PMOSFET 1040 is constituted of the source region 1040S, drain region 1040D, a gate insulating film 1040I and the gate electrode 1040G. The source and drain regions of the NMOSFET 1050 and PMOSFET 1040 have a lightly doped drain (LDD) structure. The gate electrode 1050G has a three-layer structure including a lower layer 1050Ga and a middle layer 1050Gb of polysilicon and an upper layer 105Gc of metal silicide, and the gate electrode 1040G also has a three-layer structure including a lower layer 1040Ga and a middle layer 1040Gb of polysilicon, and an upper layer 1040Gc of metal silicide.

The wiring line 1070 has a three-layer structure including a lower layer 1070a and a middle layer 1070b of polysilicon, and an upper layer 1070c of metal silicide. The first fuse 1020 has a three-layer structure including a lower layer 1020a and a middle layer 1020b of polysilicon, and an upper layer 1020c of metal silicide. The second fuse 1030 is disposed on the platform 1035 formed on the element isolation insulating film 1005. As viewed along a line of view parallel to a substrate normal, the second fuse 1030 is disposed in an inner area of the platform 1035. The platform 1035 has a two-layer structure including a lower layer 1035a of polysilicon and an upper layer 1035b of dielectric material. The second fuse 1030 has a two-layer structure including a lower layer 1030a of polysilicon and an upper layer 1030b of metal silicide. The resistor 1060 is made of a single polysilicon layer and its upper surface is covered with an insulating film 1061.

The capacitor 1010 has a lamination structure including the lower electrode 1010a of polysilicon, a capacitor dielectric film 1010b, the first upper electrode 1010c of polysilicon and the second upper electrode 1010d of metal silicide, respectively stacked in this order. The lower electrode 1010a has the same plan pattern as that of the capacitor dielectric film 1010b. The first upper electrode 1010c has the same plan pattern as that of the second upper electrode 1010d. As viewed along a line of view parallel to the substrate normal, the first upper electrode 1010c and second upper electrode 1010d are disposed in an inner area of the lower electrode 1010a.

An interlayer insulating film 1080 is formed on the semiconductor substrate 1001, covering the above-described elements.

The contact holes CH101 to CH115 shown in FIG. 13 are formed through the interlayer insulating film 1080. In the cross sectional view shown in FIG. 14, the contact holes CH101, CH102, CH107 to CH110, CH113 and CH115 appear. The contact hole CH101 reaches the second upper electrode 1010d. The contact hole CH113 reaches the resistor 1060. The contact hole CH115 reaches the upper layer 1070c of the wiring line 1070. The contact holes CH107 and CH108 reach the source region 1040S and drain region 1040D, respectively. The contact holes CH109 and CH110 reach the source region 1050S and drain region 1050D, respectively. In these contact holes CH101 to CH115, a conductive plug made of tungsten or the like is filled. A plurality of upper wiring lines 1090 are formed on the interlayer insulating film 1080. Each of the upper wiring lines 1090 is connected to the underlying element via the conductive plug filled in the contact hole.

Next, description will be made on a semiconductor manufacture method according to the third embodiment.

As shown in FIG. 15A, in the surface layer of the semiconductor substrate 1001 made of p-type silicon, the p-type well 1051, n-type well 1041 and n-type wells 1012, 1022, 1032 and 1062 are formed by ion implantation. In a partial surface area of the substrate 1001, the element isolation insulating film 1005 of about 500 nm in thickness is formed by LOCOS. The element isolation insulating film 1005 defines active regions. The element isolation insulating film 1005 may be formed by shallow trench isolation (STI). If necessary, impurity ions are implanted into a surface layer of the active region where MOSFET is formed, in order to adjust a channel impurity concentration. After the surfaces of the active regions are exposed to dilute hydrofluoric acid, the gate insulating films 1040I and 1050I of silicon oxide are formed by thermal oxidation.

As shown in FIG. 15B, a first conductive layer 1111 of polysilicon is formed on the element isolation insulating film 1005 and gate insulating films 1040I and 1050I. For example, the first conductive film 1111 is formed by chemical vapor deposition (CVD) using silane ($SH_4$) and nitrogen ($N_2$). A thickness of the first conductive layer 1111 is preferably in the range of 50 to 1000 nm, more preferably in the range of 100 to 300 nm, and much more preferably in the range of 150 to 200 nm. Phosphorus (P) is diffused into the first conductive layer 1111 to set the impurity concentration to about $1 \times 10^{16}$ $cm^{-3}$ to $1 \times 10^{20}$ $cm^{-3}$ and preferably to about $1 \times 10^{20}$ $cm^{-3}$.

A dielectric layer 1113 is formed on the first conductive layer 1111. The dielectric layer 1113 may be a single layer structure of silicon oxide, a single layer structure of silicon oxynitride, a two-layer structure of a silicon oxide film and a silicon nitride film, a two-layer structure of a silicon oxide film and a silicon oxynitride film, a three-layer structure of a silicon nitride film sandwiched between silicon oxide films, a two-layer structure of a tantalum oxide film and a silicon oxide film, a two-layer structure of a tantalum oxide film and a silicon nitride film, a three-layer structure of a tantalum oxide film sandwiched between silicon oxide films or silicon nitride films, or the like. These films can be formed by plasma enhanced CVD, CVD using electron cyclotron resonance (ECR) plasma, or the like. The silicon oxide film is formed by using as source gas, for example, tetraethylorthosilicate (TEOS) and ozone ($O_3$). The silicon nitride and silicon oxynitride films are formed by using as source gas, for example, mixed gas of TEOS, oxygen or ozone, and oxynitride ($NO_x$).

Instead of the silicon oxide film, a phosphosilicate glass (PSG) film or a borophosphosilicate glass (BPSG) film may be used. The PSG film or BPSG film can be formed, for example, plasma enhanced CVD or CVD using ECR plasma.

The dielectric layer 1113 is used as the capacitor dielectric film of the capacitor. Therefore, the thickness of the dielectric layer 1113 is determined from an electrostatic capacitance necessary for the capacitor. A resist pattern 1120 is formed on the dielectric layer 1113. The resist pattern 1120 corresponds to the plan pattern of the lower electrode 1010a of the capacitor 1010, second fuse 1030 and resistor 1060 shown in FIG. 13. By using the resist pattern 1120 as a mask, the dielectric layer 1113 is etched. After this etching, the resist pattern 1120 is removed.

Figure 15C:
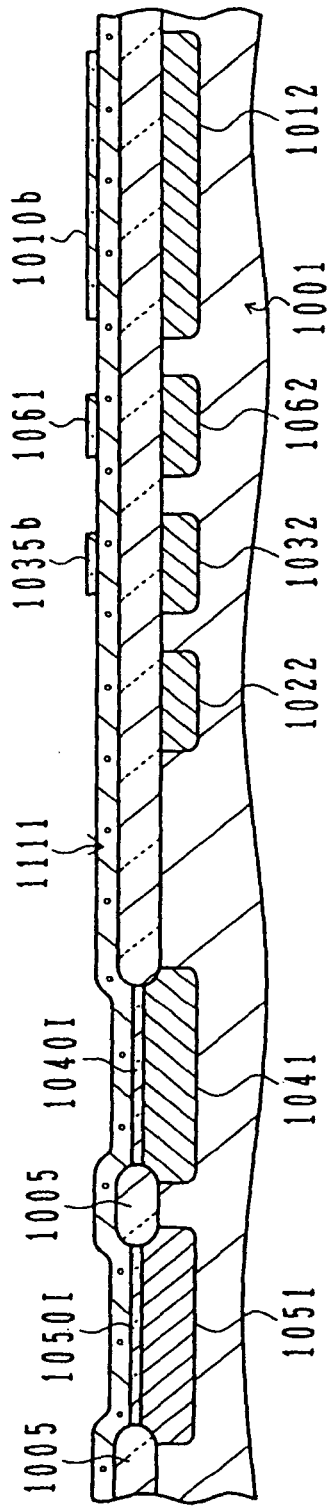

As shown in FIG. 15C, the capacitor dielectric film 1010b is left in the area where the capacitor is to be formed, the dielectric film 1061 is left in the area where the resistor is to be formed, and the dielectric film 1035b is left in the area where the second fuse is to be formed.

Figure 15D:
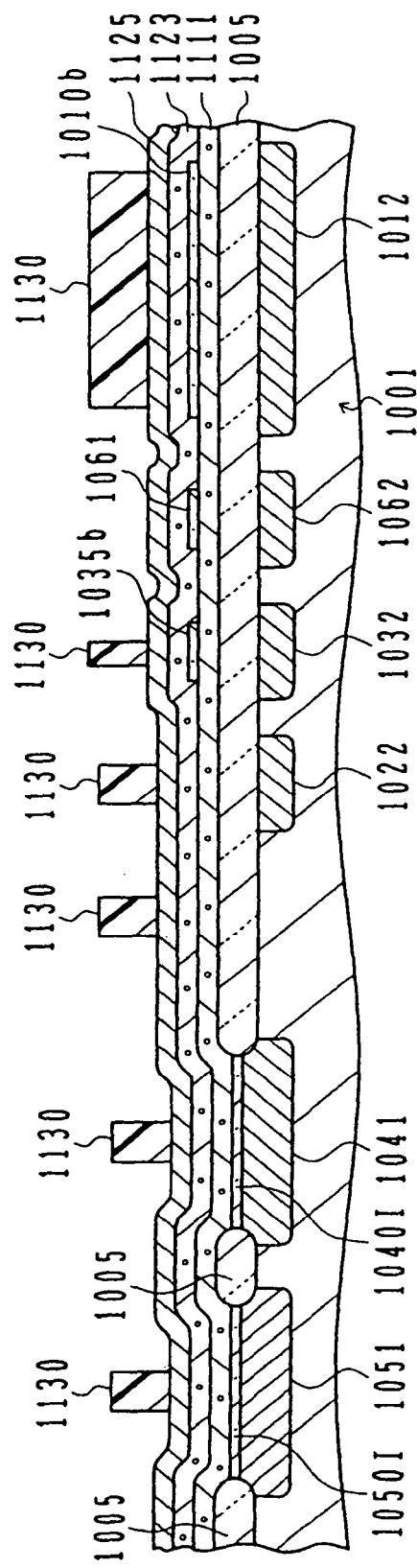

As shown in FIG. 15D, a second conductive layer 1123 of polysilicon is formed on the first conductive layer 1111, covering the capacitor dielectric film 1010b, dielectric films 1061 and 1035. The method and conditions of forming the second conductive layer 1123 are the same as those for the first conductive layer 1111. A thickness of the second conductive layer 1123 is preferably in the range of 20 to 1000 nm, more preferably in the range of 80 to 300 nm, and much more preferably in the range of 100 to 150 nm. Phosphorus is diffused into the second conductive layer 1123 to set the impurity concentration to about $1 \times 10^{16}$ $cm^{-3}$ to $1 \times 10^{20}$ $cm^3$, and preferably to about $1 \times 10^{20}$ $cm^{-3}$.

A thermal diffusion method or an ion implantation method can be used as a method for doping phosphorus into the first conductive layer 1111 and the second conductive layer 1123. When the ion implantation method is used, an impurity concentration of the first conductive layer 1111 and the second conductive layer 1123 can be controlled with high accuracy. In the result, the resistance of elements having the first conductive layer 1111 and the second conductive layer 1123 can be controlled with high accuracy. Both of the thermal diffusion method and the ion implantation method may be used.

It is preferable that the impurity concentration of the first conductive layer 1111 as the lower electrode and the impurity concentration of the second conductive layer 1123 as the upper electrode are equal to each other in order to ensure symmetry of electrical characteristic of the capacitance even if the polarity of voltage applied to the capacitance is reversed. Especially, it is preferable that impurity concentrations of surface layers contacting to the dielectric layer 1113, of the first conductive layer 1111 and the second conductive layer 1123, are equal to each other.

Heat treatment may be performed before the second conductive layer 1123 is formed. This heat treatment improves the electric and physical characteristics of the capacitor dielectric film 1010b. During the heat treatment, the capacitor dielectric film 1010b is degassed so that the second conductive layer 1123 to be formed thereon becomes hard to be peeled off. Adhesion at the interface between the capacitor dielectric film 1010b and second conductive layer 1123 is enhanced. The reliability of the finished capacitor can therefore be improved.

A third conductive layer 1125 of refractory metal silicide, e.g., tungsten silicide ($WSi_x$), is formed on the second conductive layer 1123. For example, the third conductive layer 1125 is formed by DC magnetron sputtering by using Ar as sputtering gas and a $WSi_x$ plate as a target. A thickness of the third conductive layer 1125 is preferably in the range of 25 to 500 nm, and more preferably in the range of 80 to 200 nm.

The third conductive layer 1125 may be formed by CVD using $WF_6$ and $SiH_4$ as source gas. The third conductive layer 1125 may also be formed by forming a metal layer capable of silicidating with silicon on the second conductive layer 1123 and performing heat treatment to conduct a silicidation reaction.

In addition to $WSi_x$, the third conductive layer 1125 may be made of material having a lower resistivity than the second conductive layer 1123. For example, refractory metal other than $WSi_x$ such as $MoSi_x$, $TiSi_x$, and $TaSi_x$ may be used. In addition, Mo, Ti, Ta, W, Co, Cr, Hf, Ir, Nb, Pt, Zr, Ni or alloy of these may be used. Ni and Co among others facilitate relatively low temperature silicidation so that the resistance of a silicide film can be lowered. From the viewpoint of low resistance, it is preferable to select NiSi or CoSi as the material of the third conductive layer 1135. Since the melting point of NiSi and CoSi is relatively low, it is relatively easy to break a fuse.

A resist pattern 1130 is formed on the third conductive layer 1125. The resist pattern 1130 covers the area where the gate electrodes 1050G and 1040G, wiring lines 1055 and 1070, first and second fuses 1020 and 1030 and upper electrodes 1010c and 1010d are to be formed. By using the resist pattern 1130 as a mask, the third conductive layer 1125 and second conductive layer 1123 are etched. While the second conductive layer 1123 is etched, the dielectric film 1035b, dielectric film 1061 and capacitor dielectric film 1010b are partially exposed. Even after these dielectric films are partially exposed, the etching is continued. The exposed dielectric films function as a mask and the first conductive layer 1111 is etched. After this etching, the resist pattern 1130 is removed. For example, this etching is performed by ECR plasma etching using mixed gas of $Cl_2$ and $O_2$.

Figure 15E:
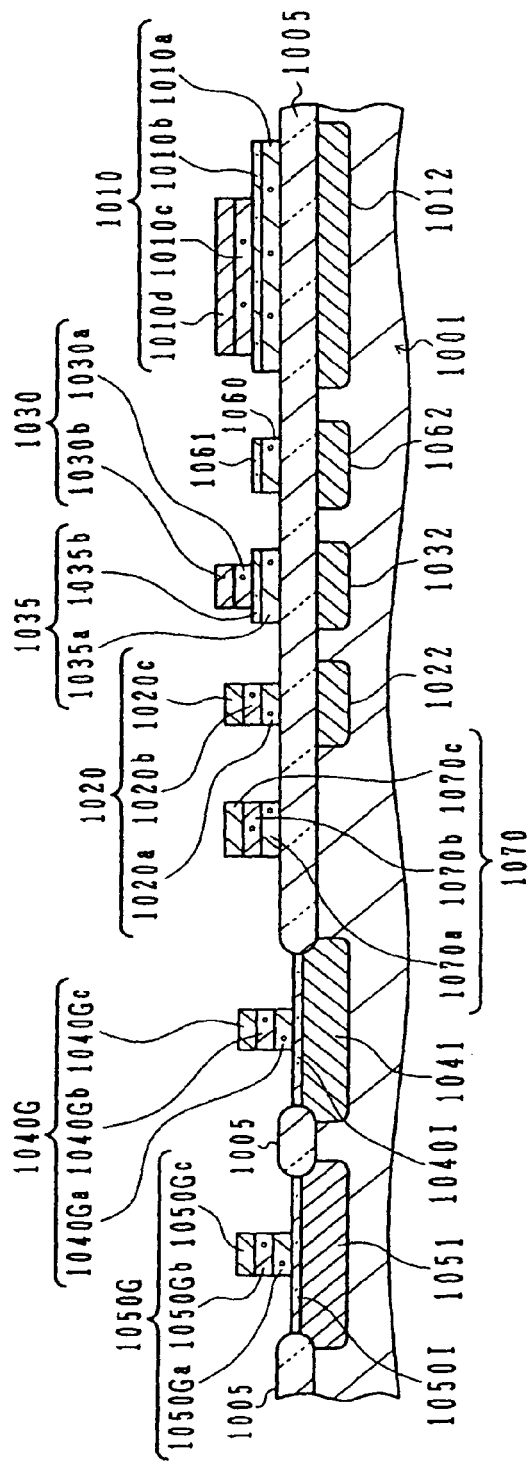

As shown in FIG. 15E, the lower electrode 1010a made of the first conductive layer 1111 is left under the capacitor dielectric film 1010b. The first upper electrode 1010c made of the second conductive layer 1123 and the second upper electrode 1010d made of the third conductive layer 1125 are left on a partial area of the capacitor dielectric film 1010b. The capacitor 1010 is constituted of the lower electrode 1010a, capacitor dielectric film 1010b, first upper electrode 1010c and second upper electrode 1010d.

The resistor 1060 made of the first conductive layer 1111 is left under the dielectric film 1061. The lower layer 1035a made of the first dielectric layer 1111 is left under the dielectric film 1035b. The platform 1035 is constituted of the lower layer 1035a and dielectric film (upper layer) 1035b. The lower layer 1030a made of the second conductive layer 1123 is left on the platform 1035. The upper layer 1030b made of the third conductive layer 1125 is left on the second conductive layer 1123. The second fuse 1030 is constituted of the lower layer 1030a and upper layer 1030b.

Also the first fuse 1020, wiring line 1070 and gate electrodes 1040G and 1050G are formed. The first fuse 1020 has the three-layer structure including the lower layer 1020a made of the first wiring layer wiring layer 1111, the middle layer 1020b made of the second wiring layer 1123, and the upper layer 1020c made of the third wiring layer 1125. Similarly, the wiring line 1070 has the three-layer structure including the lower layer 1070a made of the first wiring layer 1125, the middle layer 1070b made of the second wiring layer 1123, and the upper layer 1070c made of the third wiring layer 1125. The gate electrode 1040G has the three-layer structure including the lower layer 1040Ga made of the first wiring layer 1111, the middle layer 1040Gb made of the second wiring layer 1123, and the upper layer 1040Gc made of the third wiring layer 1125. The gate electrode 1050G has the three-layer structure including the lower layer 1050Ga made of the first wiring layer 1111, the middle layer 1050Gb made of the second wiring layer 1123, and the upper layer 1050Gc made of the third wiring layer 1125.

Figure 15F:
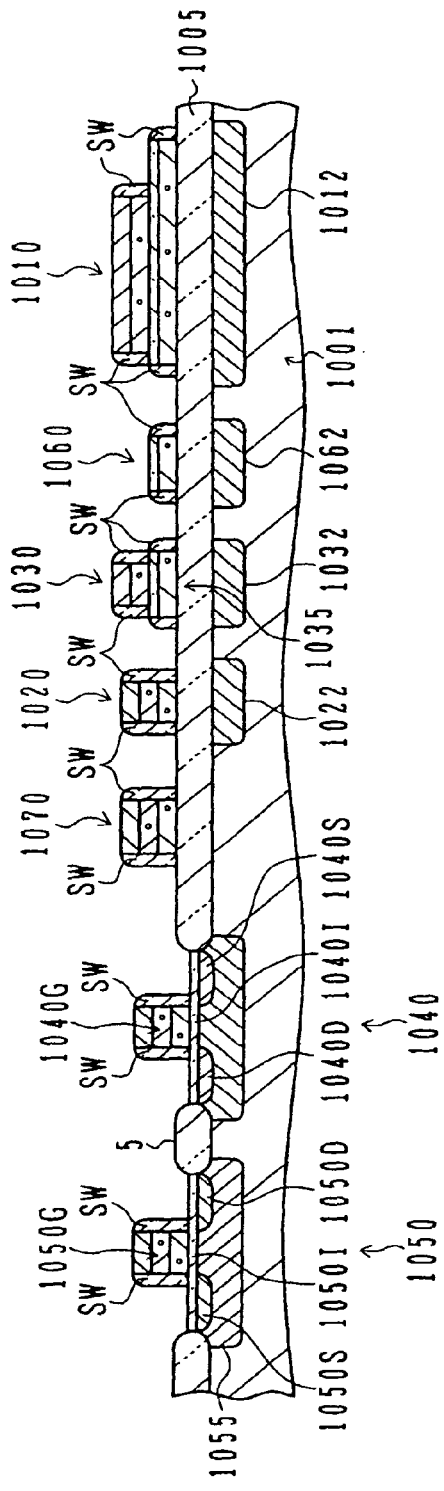

As shown in FIG. 15F, the source and drain regions having the LDD structure are formed by a well-known method. A method of forming the source and drain regions will be described briefly hereinunder. By using a resist pattern having an opening in an area corresponding to the PMOSFET 1040, ion implantation is executed for forming low concentration regions. Next, by using a resist pattern having an opening in an area corresponding to the NMOSFET 1050, ion implantation is executed for forming low concentration regions. Sidewall spacers SW of silicon oxide are formed on the sidewalls of the gate electrodes 1040G and 1050G. In this case, sidewall spacers SW are also formed on the sidewalls of the first fuse 1020, second fuse 1030, platform 1035, wiring line 1070 and capacitor 1010.

By using a resist pattern having an opening in an area corresponding to the PMOSFET 1040 and the sidewall spacers SW as a mask, ion implantation is executed for forming high concentration regions. Next, by using a resist pattern having an opening in an area corresponding to the NMOSFET 1050 and the sidewall spacers SW as a mask, ion implantation is executed for forming high concentration regions. With these processes, the source regions 1040S and 1050S and drain regions 1040D and 1050D are formed. After ion implantation, annealing for activation is executed.

As shown in FIG. 14, after the interlayer insulating film 1080 is formed, the processes of forming the contact holes CH101 to CH115, filling conductive plugs and forming the upper wiring lines 1090 are executed to obtain the semiconductor device of the first embodiment.

In the third embodiment, a single film forming process forms the lower electrode 1010a of the capacitor 1010, the lower layer 1020a of the first fuse 1020, the lower layer 1035a of the platform 1035, the resistor 1060, the lower layer 1070a of the wiring line 1070, the lower layer 1040Ga of the gate electrode 1040G and the lower layer 1050Ga of the gate electrode 1050G. Therefore, these films are made of the same material and have the same thickness. Similarly, the first upper electrode 1010c of the capacitor 1010, the middle layer 1020b of the first fuse 1020, the lower layer 1030a of the second fuse 1030, the middle layer 1070b of the wiring line 1070, the middle layer 1040Gb of the gate electrode 1040G and the middle layer 1050Gb of the gate electrode 1050G are made of the same material and have the same thickness. The second upper electrode 1010d of the capacitor 1010, the upper layer 1020c of the first fuse 1020, the upper layer 1030b of the second fuse 1030, the upper layer 1070c of the wiring line 1070, the upper layer 1040Gc of the gate electrode 1040G and the upper layer 1050Gc of the gate electrode 1050G are made of the same material and have the same thickness. The upper layer 1035b of the platform 1035 and the capacitor dielectric film 1010b are made of the same material and have the same thickness.

In the third embodiment, the first fuse 1020 having the three-layer structure and the second fuse 1030 having the two-layer structure are formed. A difference between the three-layer and two-layer structures results from whether the subject area is covered with the resist pattern 1120 in the process shown in FIG. 15B. Two types of fuses having different breakdown characteristics can be formed without increasing the number of processes. Since the first fuse 1020 has the three-layer structure, its resistance can be lowered easier than the second fuse 1030. In contrast, since the second fuse 1030 has the two-layer structure, it can be broken with a smaller current. For example, the first and second fuses 1020 and 1030 may be combined in such a manner that the first fuse is broken under a first current/voltage condition and will not be broken under a second current/voltage condition, whereas the second fuse is broken also under the second current/voltage condition. The three-layer structure and two-layer structure can be properly selected depending upon the breakdown and electric characteristics necessary for fuses.

The resist pattern 1120 shown in FIG. 15B is used as the mask when the capacitor dielectric film 1010b of the capacitor 1010 is formed. The resist pattern 1130 shown in FIG. 15D is used as the mask when the upper electrodes 1010c and 1010d of the capacitor 1010 are formed. Therefore, two types of the fuses 1020 and 1030 can be formed without increasing the two photolithography processes used for the capacitor 1010.

In the semiconductor device of the third embodiment, the n-type wells 1022 and 1032 are formed under the fuses 1020 and 1030. Even if the substrate is damaged by heat generated upon breakdown of the fuse, unnecessary leak current to the substrate can be prevented from being generated, because of the existence of the n-type wells 1022 and 1032. The n-type wells 1062 and 1012 under the resistor 1060 and capacitor 1010 have the function of reducing parasitic capacitance between the substrate 1001 and the resistor 1060 and capacitor 1010. If a semiconductor substrate of n-type silicon is used, the n-type wells 1012, 1022, 1032 and 1062 are replaced with p-type wells.

Figure 16A:
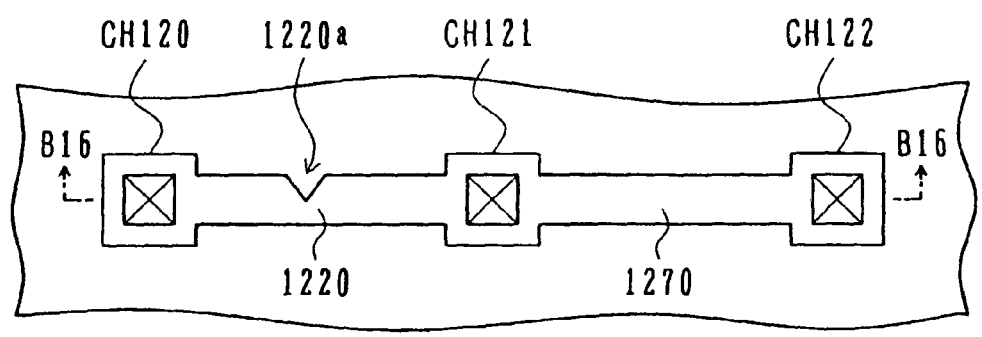
FIG. 16A is a plan view of a semiconductor device according to a fourth embodiment.

FIG. 16A is a plan view of a semiconductor device according to the fourth embodiment. A fuse 1220 and a wiring line 1270 are disposed on a semiconductor substrate. One end of the fuse 1220 is connected to one end of the wiring line 1270. At this interconnection point, a contact hole CH121 is disposed. A contact hole CH120 is disposed at the other end of the fuse 1220, and a contact hole CH122 is disposed at the other end of the wiring line 1270.

A recess 1220a is formed on one side of the fuse 1220. This recess forms a current concentration so that the fuse 1220 becomes easy to be broken.

Figure 16B:
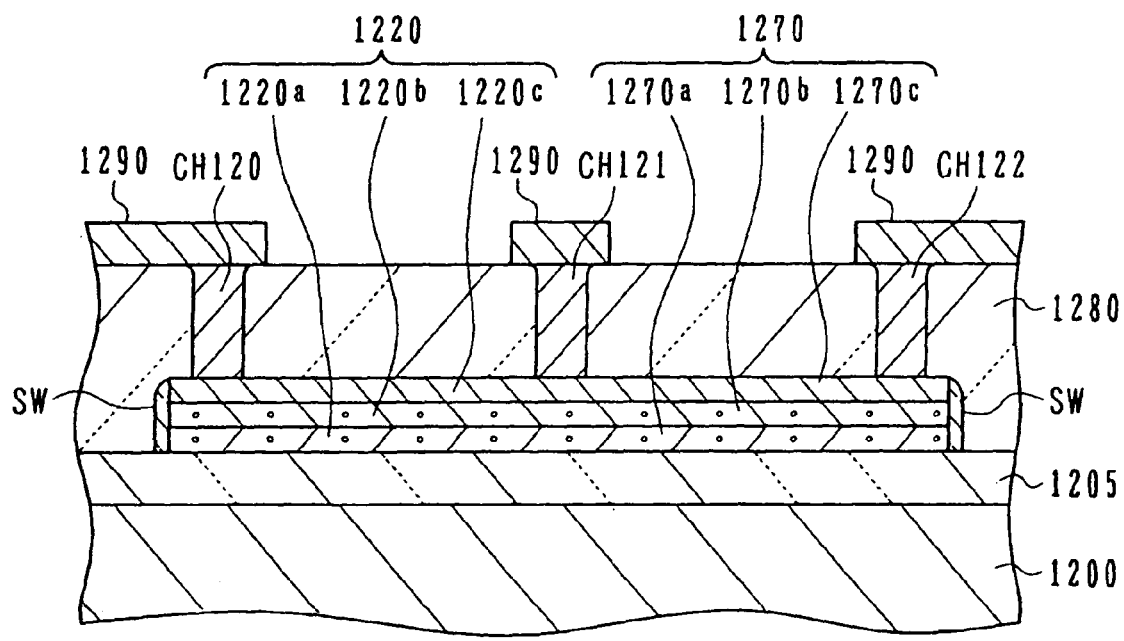
FIG. 16B is a cross sectional view thereof.

FIG. 16B is a cross sectional view taken along one-dot chain line B16-B16 of FIG. 16A. On the surface of a semiconductor substrate 1200 of silicon, an element isolation insulating film 1205 is formed. The fuse 1220 and wiring line 1270 are formed on the element isolation insulating film 1205. The fuse 1220 and wiring line 1270 have the same lamination structures as those of the fuse 1020 and wiring line 1070 of the semiconductor device of the third embodiment shown in FIG. 14. Namely, the fuse 1220 has the three-layer structure stacking a lower layer 1220a and a middle layer 1220b of polysilicon, and an upper layer 1220c of metal silicide. The wiring line 1270 has also the three-layer structure stacking a lower layer 1270a and a middle layer 1270b of polysilicon, and an upper layer 1270c of metal silicide.

The lower layer 1220a of the fuse 1220 and the lower layer 1270a of the wiring layer 1270 are made of a single continuous polysilicon layer. Similarly, the middle layers of the fuse 1220 and wiring line 1270 are made of a single continuous metal silicide layer. An interlayer insulating film 1280 is formed on the semiconductor substrate 1200, covering the fuse 1220 and wiring line 1270. Contact holes CH120 to CH122 are formed through the interlayer insulating film 1280. A conductive plug is filled in each of the contact holes CH120 to CH122. Upper wiring lines 1029 are formed on the interlayer insulating film 1280.

When the fuse 1220 is to be broken, a predetermined voltage is applied across the conductive plug in the contact hole CH120 and the conductive plug in the contact hole CH121 to flow current through the fuse 1220.

Figure 17A:
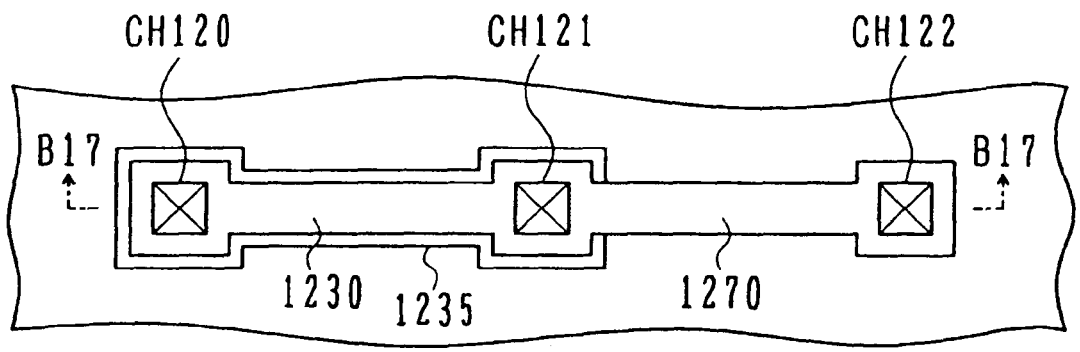
FIGS. 17A and 17B are a plan view and a cross sectional view of a semiconductor device according to a fifth embodiment.
Figure 17B:
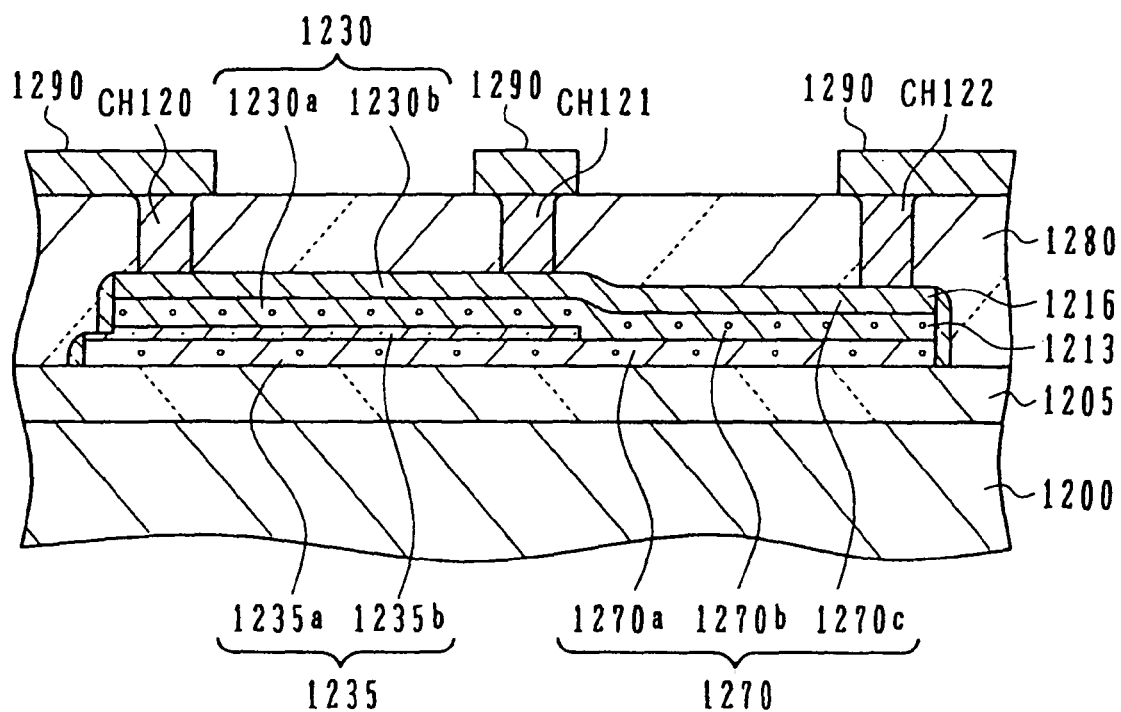

FIGS. 17A and 17B are a plan view and a cross sectional view of a semiconductor device according to the fifth embodiment. FIG. 17B is the cross sectional view taken along one-dot chain line B17-B17 shown in FIG. 17A. The semiconductor device of the fifth embodiment has a fuse 1230 having a different structure from that of the fuse 1220 of the semiconductor device of the fourth embodiment shown in FIG. 16A. In the fifth embodiment, the fuse 1230 has a two-layer structure similar to that of the second fuse 1030 of the semiconductor device of the third embodiment shown in FIG. 14A. A platform 1235 is disposed under the fuse 1230 having the two-layer structure. The fuse 1230 is constituted of a lower layer 1230a of polysilicon and an upper layer 1230b of metal silicide. The platform 1235 is constituted of a lower layer 1235a of polysilicon and an upper layer 1235b of dielectric material.

The lower layer 1235a of the platform 1235 and the lower layer 1270a of the wiring line 1270 are made of a single continuous polysilicon layer. The lower layer 1230a of the fuse 1230 and the middle layer 1270b of the wiring line 1270 are made of a single continuous polysilicon layer. The upper layer 1230c of the fuse 1230 and the upper layer 1270c of the wiring line 1270 are made of a single continuous metal silicide layer.

As in the fourth and fifth embodiments, the fuse and wiring line can be connected together in the state that the fuse and wiring layer are closed in the wiring layer in which the fuse is formed.

Figure 18A:
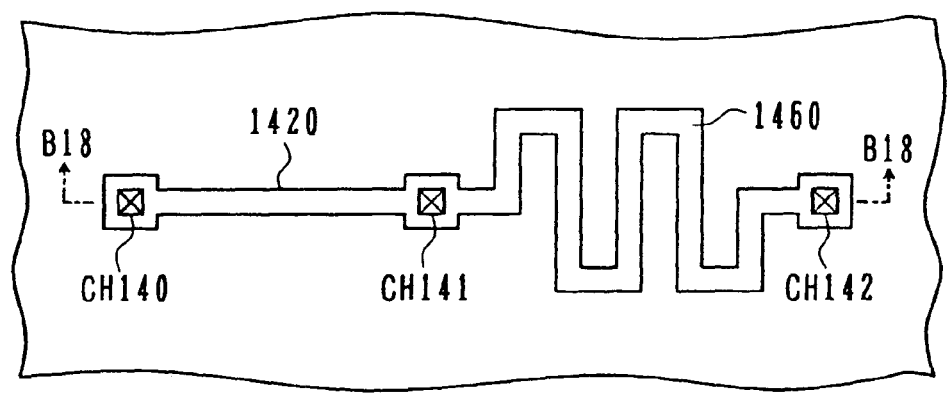
FIG. 18A is a plan view of a semiconductor device according to a sixth embodiment.

FIG. 18A is a plan view of a semiconductor device according to the sixth embodiment. A fuse 1420 and a resistor 1460 are disposed on a semiconductor substrate. One end of the fuse 1420 is connected to one end of the resistor 1460. The resistor 1460 has a pattern bending a plurality of times in order to acquire a desired length. At the interconnection point of the fuse and resistor, a contact hole CH141 is disposed. A contact hole CH140 is disposed at the other end of the fuse 1420, and a contact hole CH142 is disposed at the other end of the resistor 1460.

Figure 18B:
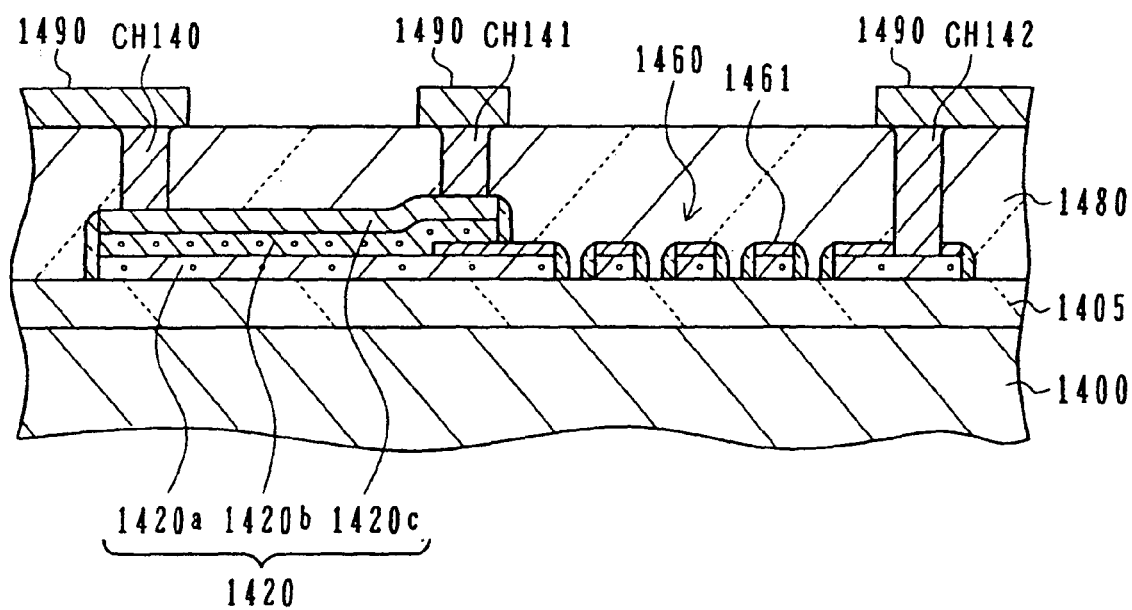
FIG. 18B is a cross sectional view of the semiconductor device of the sixth embodiment.

FIG. 18B is a cross sectional view taken along one-dot chain line B18-B18 of FIG. 17A. On the surface of a semiconductor substrate 1400 of silicon, an element isolation insulating film 1405 is formed. The fuse 1420 and resistor 1460 are formed on the element isolation insulating film 1405. The fuse 1420 has the same lamination structures as that of the first fuse 1020 of the semiconductor device of the third embodiment shown in FIG. 14. Namely, the fuse 1420 has the three-layer structure stacking a lower layer 1420a and a middle layer 1420b of polysilicon, and an upper layer 1420c of metal silicide. The resistor 1460 has a polysilicon single layer structure same as that of the resistor 1060 of the semiconductor device of the third embodiment shown in FIG. 14. The upper surface of the resistor 1460 is covered with a dielectric film 1461. The lower layer 1420a of the fuse 1420 and the resistor 1460 are made of a single continuous polysilicon layer.

An interlayer insulating film 1480 covers the fuse 1420 and resistor 1460. Contact holes CH140 to CH142 are formed through the interlayer insulating film 1480. A conductive plug is filled in each of the contact holes CH140 to CH142. Upper wiring lines 1490 are formed on the interlayer insulating film 1480.

Figure 18C:
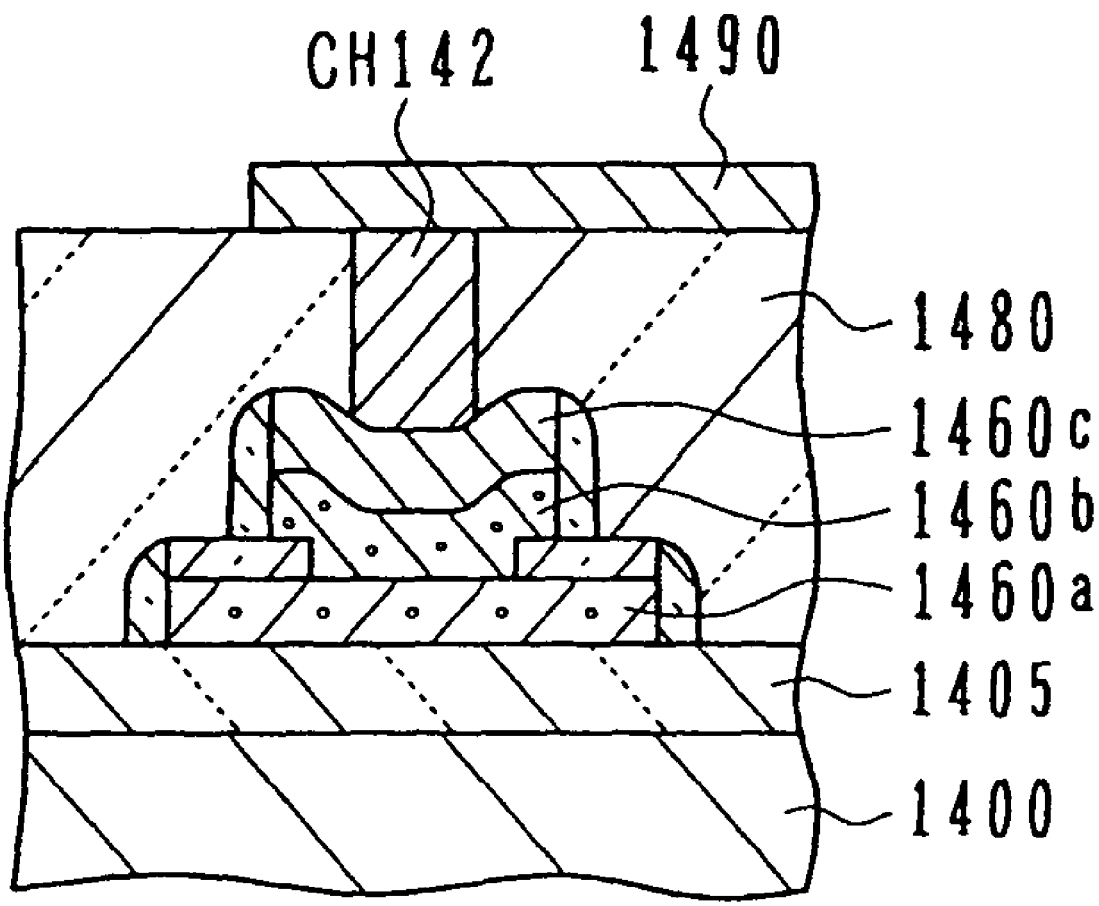
FIG. 18C is a cross sectional view showing an example of another structure of a connection region between an end of a resistor and a contact plug of the semiconductor device of the sixth embodiment.

FIG. 18C shows another example of the structure of the region around the contact hole CH142 shown in FIG. 18B. In the structure shown in FIG. 18B, the conductive plug in the contact hole CH142 contacts the polysilicon layer deposited at the same time when the lower layer 1420a of the fuse 1420 having the three-layer structure is formed. In the structure shown in FIG. 18C, the end portion of the resistor 1460 has the three-layer structure including a lower layer 1460a, a middle layer 1460b and an upper layer 1460c which are formed at the same time when the lower layer 1420a, middle layer 1420b and upper layer 1420c of the fuse 1420 are formed. By disposing the three-layer structure in the end portion of the resistor 1460, it is possible to make the depth of the contact hole CH142 at the end of the resistor 1460 be equal to the depths of the contact holes CH140 and CH141 at opposite ends of the fuse 1420.

Figure 19A:
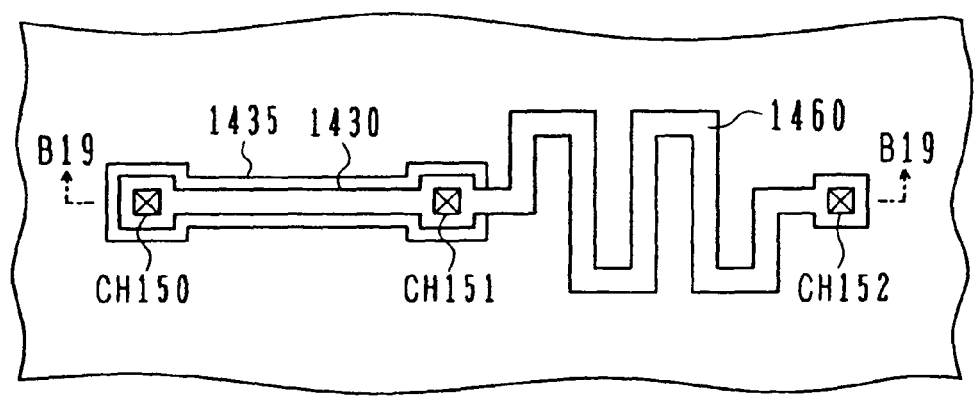
FIGS. 19A and 19B are a plan view and a cross sectional view of a semiconductor device according to a seventh embodiment.
Figure 19B:
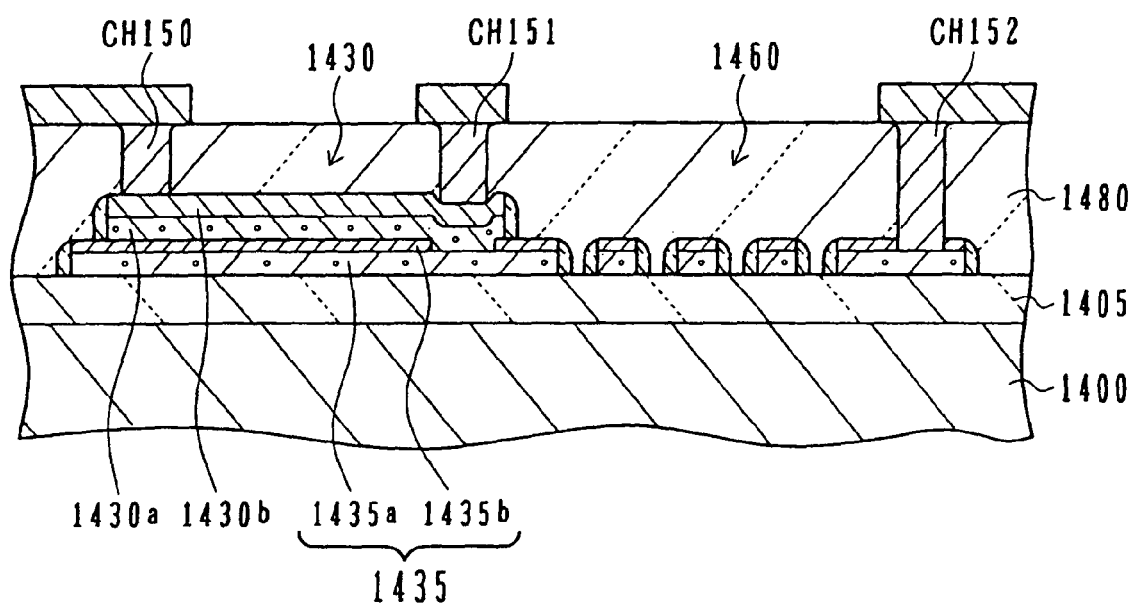

FIGS. 19A and 19B are a plan view and a cross sectional view of a semiconductor device according to the seventh embodiment. FIG. 19B is the cross sectional view taken along one-dot chain line B19-B19 shown in FIG. 19A. In the following, description will be made on the different points from the semiconductor device of the sixth embodiment shown in FIGS. 18A and 18B. In the sixth embodiment, the fuse 1420 has the three-layer structure. In the seventh embodiment, the fuse 1430 has a lamination structure similar to that of the second fuse 1030 of the semiconductor device of the third embodiment shown in FIG. 14. Namely, the fuse 1430 has the two-layer structure stacking a lower layer 1430a of polysilicon and an upper layer 1430b of metal silicide.

A platform 1435 is disposed under the fuse 1430. The platform 1435 has the two-layer structure stacking a lower layer 1435a of polysilicon and an upper layer 1435b of dielectric material. The lower layer 1435a of the platform 1435 and the resistor 1460 are made of a single continuous polysilicon layer. An area where the upper layer 1435b made of dielectric material is not disposed is formed in the end portion of the fuse 1430 on the resistor 1460 side. In this area, the fuse 1430 is electrically connected to the polysilicon layer constituting the lower layer 1435a and resistor 1460.

As in the sixth and seventh embodiments, the fuse and resistor can be connected together without involvement of wiring lines in a layer higher than the interlayer insulating film 1480.

The end portion of the resistor 1560 on the contact hole CH152 side may have the three-layer structure similar to the lamination structure shown in FIG. 18C.

Figure 20A:
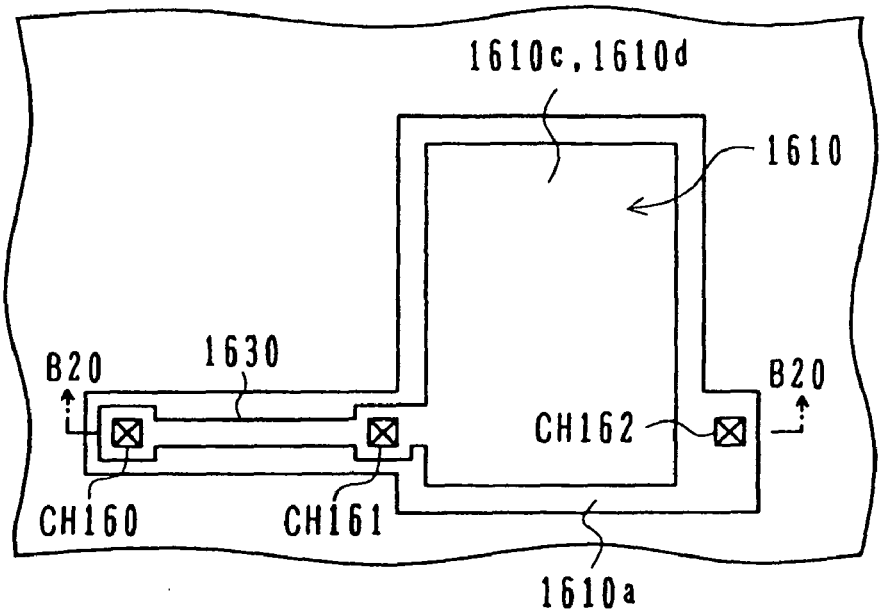
FIG. 20A is a plan view of a semiconductor device according to an eighth embodiment.

FIG. 20A is a plan view of a semiconductor device according to the eighth embodiment. A fuse 1630 and a capacitor 1610 are disposed on a semiconductor substrate. The capacitor 1610 is constituted of a lower electrode 1610a and upper electrodes 1610c and 1610d. One end of the fuse 1630 is connected to the upper electrodes 1610c and 1610d. At the interconnection point of the fuse 1630 and the upper electrodes 1610c and 1610d, a contact hole CH161 is disposed. A contact hole CH160 is disposed at the other end of the fuse 1630. A contact hole CH162 is disposed in the inner area of the lower electrode 1610a and outside the upper electrodes 1610c and 1610d.

Figure 20B:
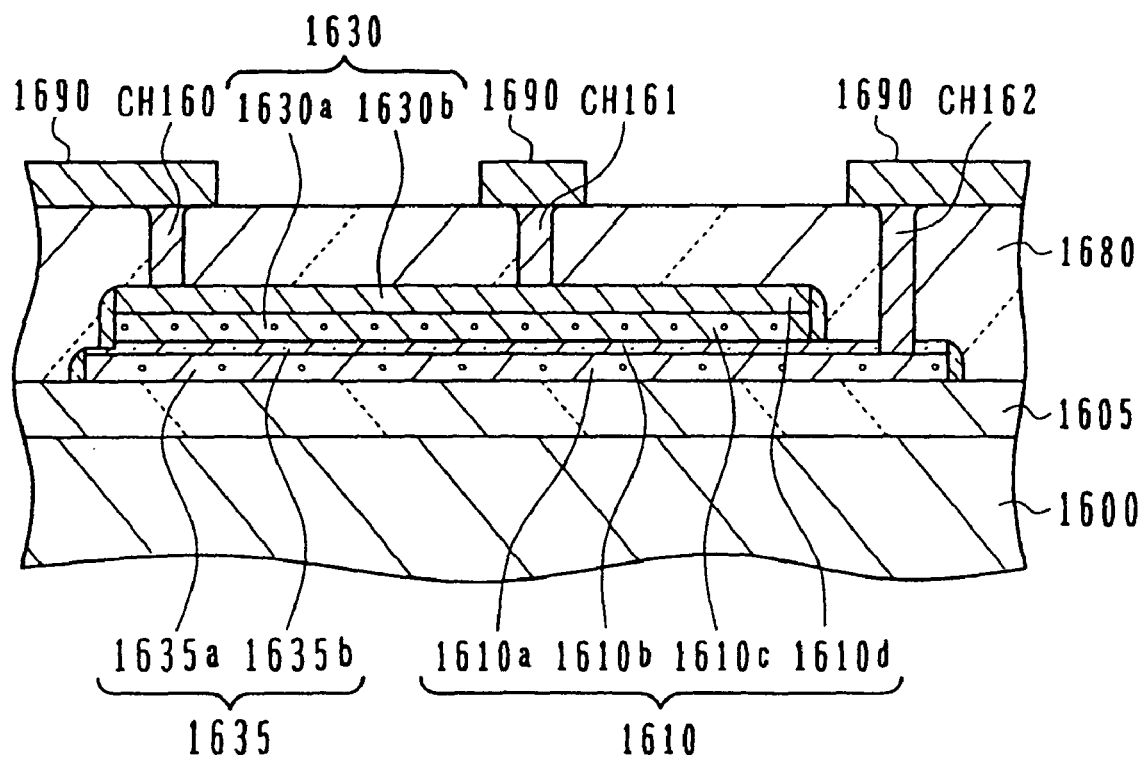
FIG. 20B is a cross sectional view thereof.

FIG. 20B is a cross sectional view taken along one-dot chain line B20-B20 of FIG. 20A. On the surface of a semiconductor substrate 1600, an element isolation insulating film 1605 is formed. The fuse 1630 and capacitor 1610 are formed on the element isolation insulating film 1605 which covers the fuse 1630 and capacitor 1610. The contact holes CH150 to CH162 are formed through the interlayer insulating film 1680 and a conductive plug is filled in each of the contact holes. Upper wiring lines 1690 are formed on the interlayer insulating film 1680.

The fuse 1630 has the same lamination structure as that of the second fuse 1030 of the semiconductor device of the third embodiment shown in FIG. 14. Namely, the fuse 1630 has the two-layer structure including a lower layer 1630a of polysilicon and an upper layer 1630b of metal silicide. A platform 1635 is disposed under the fuse 1630. The platform 1635 has the two-layer structure stacking a lower layer 1635a of polysilicon and an upper layer 1635b of dielectric material.

The fuse 1630 has a similar lamination structure to that of the second fuse 1030 of the semiconductor device of the third embodiment shown in FIG. 14. Namely, the capacitor is constituted of the lower electrode 1610a of polysilicon, a capacitor dielectric film 1610b, the first upper electrode 1610c of polysilicon and the second upper electrode 1610d of metal silicide.

The lower layer 1635a of the platform 1635 and the lower electrode 1610a are made of a single continuous polysilicon layer. The upper layer 1635b of the platform 1635 and the capacitor dielectric film 1610b are made of a single continuous dielectric layer. The lower layer 1630a of the fuse 1630 and the first upper electrode 1610c are made of a signal continuous polysilicon layer. The upper layer 1630b of the fuse 1630 and the second upper electrode 1610d are made of a single continuous metal silicide film. In this manner, the fuse 1630 is connected to the capacitor 1610 in the state that the fuse and capacitor are closed in the wiring layer in which the fuse 1630 is formed.

The conductive plug in the contact hole CH160 is connected to one end of the fuse 1630, and the conductive plug in the contact hole CH161 is connected to the interconnection point between the fuse 1630 and the upper electrodes 1610c and 1610d of the capacitor 1610. At the interconnection point between the conductive plug in the contact hole 162 and the lower electrode 1610a, the polysilicon layer and metal silicide layer formed at the same time when the upper electrodes 1610c and 1610d are formed may be left to provide the three-layer structure similar to that shown in FIG. 18C.

In the embodiments shown in FIGS. 16A to 20B, the fuse is connected to the resistor or capacitor formed in the same wiring layer without involving another wiring layer. Therefore, as compared to connection via an upper wiring line such as an Al wring line, the integration degree can be improved.

Figure 21A:
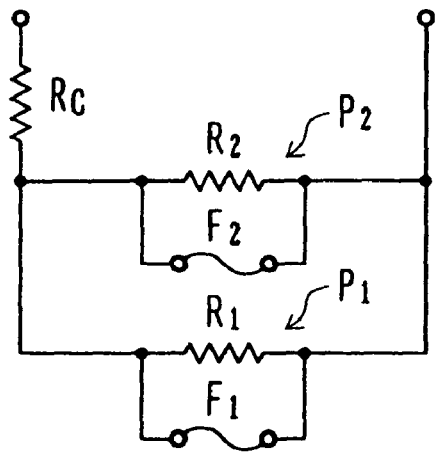
FIGS. 21A to 21C are equivalent circuit diagrams showing examples of the structure of a resistor trimming circuit using the semiconductor device of the embodiment.
Figure 21B:
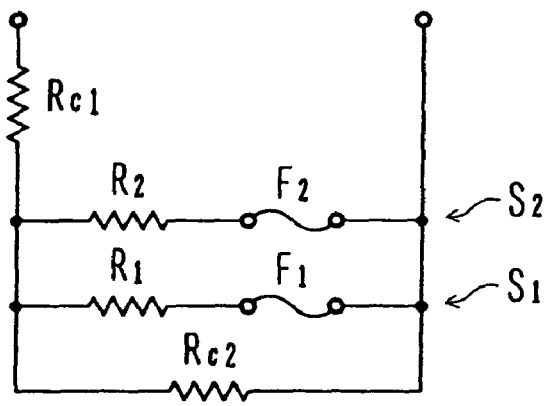
Figure 21C:
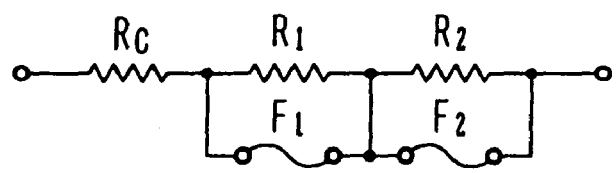

With reference to FIGS. 21A to 21C, description will be made on a resistor trimming circuit using the embodiment fuse described above.

FIG. 21A is a diagram showing an example of the structure of a resistor trimming circuit. A first circuit $P_1$ having a resistor $R_1$ and a fuse $F_1$ connected in parallel and a second circuit $P_2$ having a resistor $R_2$ and a fuse $F_2$ connected in parallel are connected in parallel. Each of the first and second circuits $P_1$ and $P_2$ has a structure similar to that of the semiconductor device, for example, of the embodiments shown in FIGS. 18A to 19. A resistor $R_C$ is connected in parallel to the parallel circuit of the first and second circuits $P_1$ and $P_2$.

The total resistance of this circuit is $R_C+1/((1/R_1)+(1/F_1)+(1/R_2)+(1/F_2))$. The total resistance of this circuit with the fuse $F_1$ being broken is $R_C+1/((1/R_1)+(1/R_2)+(1/F_2))$. The total resistance of this circuit with the two fuses $F_1$ and $F_2$ being broken is $R_C+1/((1/R_1)+(1/R_2))$.

It is assumed that the fuse $F_2$ is broken under a first current/voltage condition and will not be broken under a second current/voltage condition, whereas the other fuse $F_1$ is broken also under the second current/voltage condition. As an electric signal satisfying the second current/voltage condition is applied across the fuses $F_1$ and $F_2$ at the same time, only the fuse $F_1$ can be broken. As an electric signal satisfying the first current/voltage condition is applied across the fuses $F_1$ and $F_2$ at the same time, both the fuses $F_1$ and $F_2$ can be broken. In this manner, without using a fuse select circuit for selectively applying a breaking signal across one of the two fuses, only one of the fuses can be broken and both the fuses $F_1$ and $F_2$ can also be broken by properly selecting the current/voltage condition. Three total resistances can be realized depending upon the fuse broken state.

FIG. 21B shows another resistor trimming circuit. A first circuit $S_1$ having a resistor $R_1$ and a fuse $F_1$ connected serially, a second circuit $S_2$ having a resistor $R_2$ and a fuse $F_2$ connected serially and a resistor $R_{C2}$ are connected in parallel. A resistor $R_{C1}$ is connected in parallel to this parallel circuit.

FIG. 21C shows still another resistor trimming circuit. A first circuit $P_1$ having a resistor $R_1$ and a fuse $F_1$ connected in parallel, a second circuit $P_2$ having a resistor $R_2$ and a fuse $F_2$ connected in parallel and a resistor $R_C$ are connected serially.

Similar to the resistor trimming circuit shown in FIG. 21A, also in the resistor trimming circuits shown in FIGS. 21B and 21C, three total resistances can be realized by properly selecting the current/voltage condition of a breaking signal to be applied across the fuse.

Figure 22A:
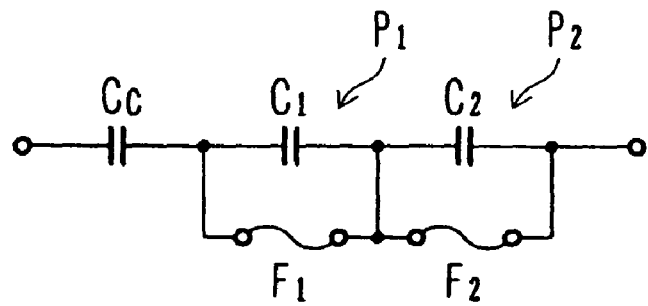
FIGS. 22A to 22C are equivalent circuit diagrams showing examples of the structure of a capacitor trimming circuit using the semiconductor device of the embodiment.
Figure 22B:
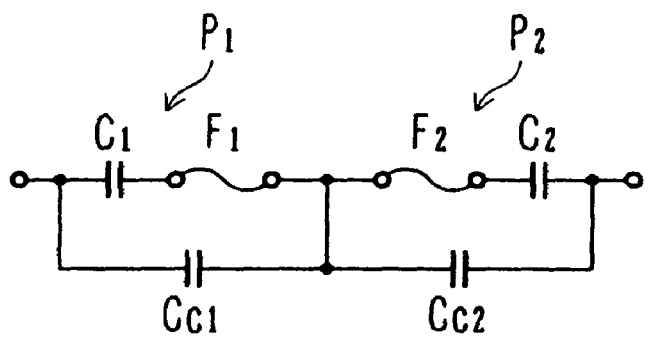
Figure 22C:
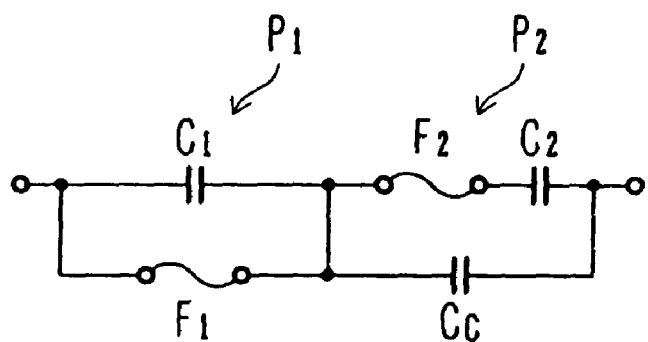

With reference to FIGS. 22A to 22C, description will be made on a capacitor trimming circuit using the embodiment fuse.

FIG. 22A is a diagram showing an example of the structure of a capacitor trimming circuit. A first circuit $P_1$ having a capacitor $C_1$ and a fuse $F_1$ connected in parallel, a second circuit $P_2$ having a capacitor $C_2$ and a fuse $F_2$ connected in parallel and a capacitor $C_C$ are connected in parallel. Each of the first and second circuits $P_1$ and $P_2$ has a structure similar to that of the semiconductor device, for example, of the embodiments shown in FIGS. 18A to 19.

The total capacitance with the fuses $F_1$ and $F_2$ not being broken is $C_C$. The total capacitance with the fuse $F_1$ being broken is $1/((1/C_C)+(1/C_1))$. The total capacitance with both the fuses $F_1$ and $F_2$ being broken is $1/((1/C_C)+(1/C_1)+(1/C_2))$. Three total capacitances can therefore be realized.

FIG. 22B shows another example of the structure of the capacitor trimming circuit. A first circuit $P_1$ is constituted of a circuit having a capacitor $C_1$ and a fuse $F_1$ connected serially and a capacitor $C_{C1}$ connected in parallel to the serial circuit. A second circuit $P_2$ is constituted of a circuit having a capacitor $C_2$ and a fuse $F_2$ connected serially and a capacitor $C_{C2}$ connected in parallel to the serial circuit. The first and second circuits $P_1$ and $P_2$ are connected serially. Each of the serial circuit of the capacitor $C_1$ and fuse $F_1$ and the serial circuit of the capacitor $C_2$ and fuse $F_2$ has a structure similar to that of the semiconductor device shown, for example, in FIGS. 20A and 20B. Also with this example of the structure, three total capacitances can be realized.

FIG. 22C shows another example of the structure of the capacitor trimming circuit. A first circuit $P_1$ is constituted of a circuit having a capacitor $C_1$ and a fuse $F_1$ connected serially. A second circuit $P_2$ is constituted of a circuit having a capacitor $C_2$ and a fuse $F_2$ connected serially, and a capacitor $C_C$ connected in parallel to the serial circuit. The first and second circuits $P_1$ and $P_2$ are connected serially. Each of the parallel circuit of the capacitor $C_1$ and fuse $F_1$ and the serial circuit of the capacitor $C_2$ and fuse $F_2$ has a structure similar to that of the semiconductor device shown, for example, in FIGS. 20A and 20B. If the fuse $F_1$ is broken, the total capacitance becomes small, and if the fuse $F_2$ is also broken, the total capacitance becomes smaller. Also with this example of the structure, three total capacitances can be realized.

Figure 23A:
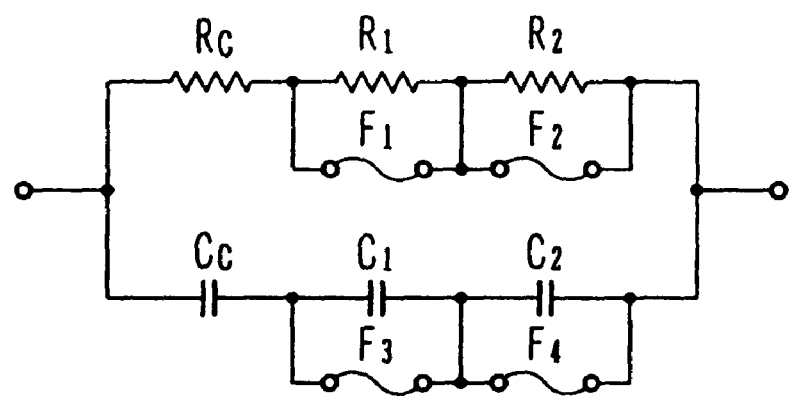
FIGS. 23A and 23B are equivalent circuits showing examples of the structure of a resistor and capacitor trimming circuit.
Figure 23B:
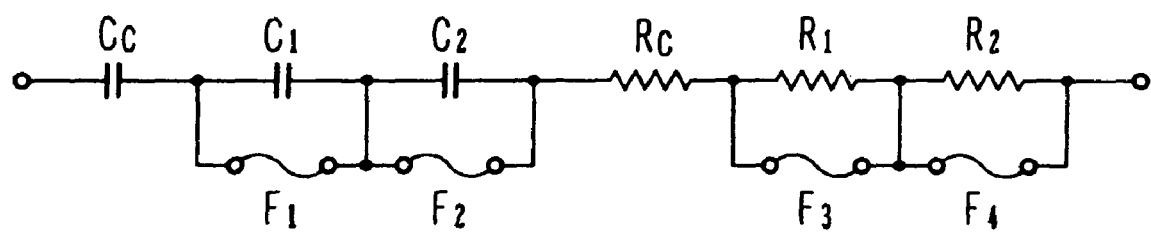

FIGS. 23A and 23B show trimming circuits having the resistor trimming circuit shown in FIG. 21C and the capacitor trimming circuit shown in FIG. 22A, respectively connected in parallel and serially. Various combinations of resistor and capacitor trimming circuits are possible.

A complicated trimming circuit can also be formed by using multiple stages of resistors and fuses by using both a method of selectively breaking a fuse basing upon different breaking conditions and a fuse selector circuit implemented on an integrated circuit.

FIG. 24 is a plan view of a semiconductor device according to the ninth embodiment. Disposed on a semiconductor substrate are a first CMOS circuit 2000, a second CMOS circuit 2100, a first wiring line 2200, a second wiring line 2300, a third wiring line 2400, a first fuse 2500, a second fuse 2600, a third fuse 2700, a fourth fuse 2800, a resistor 2900 and a capacitor 3000, in this order from the left to right in FIG. 24. The first CMOS circuit 2000 is constituted of a first NMOSFET 2010 and a first PMOSFET 2050, and the second CMOS circuit 2100 is constituted of a second NMOSFET 2110 and a second PMOSFET 2150.

Although the plan shape of each of these components is arbitrary, as shown in FIG. 24 each component has a plan shape same as that of the third embodiment shown in FIG. 13.

Figure 25:
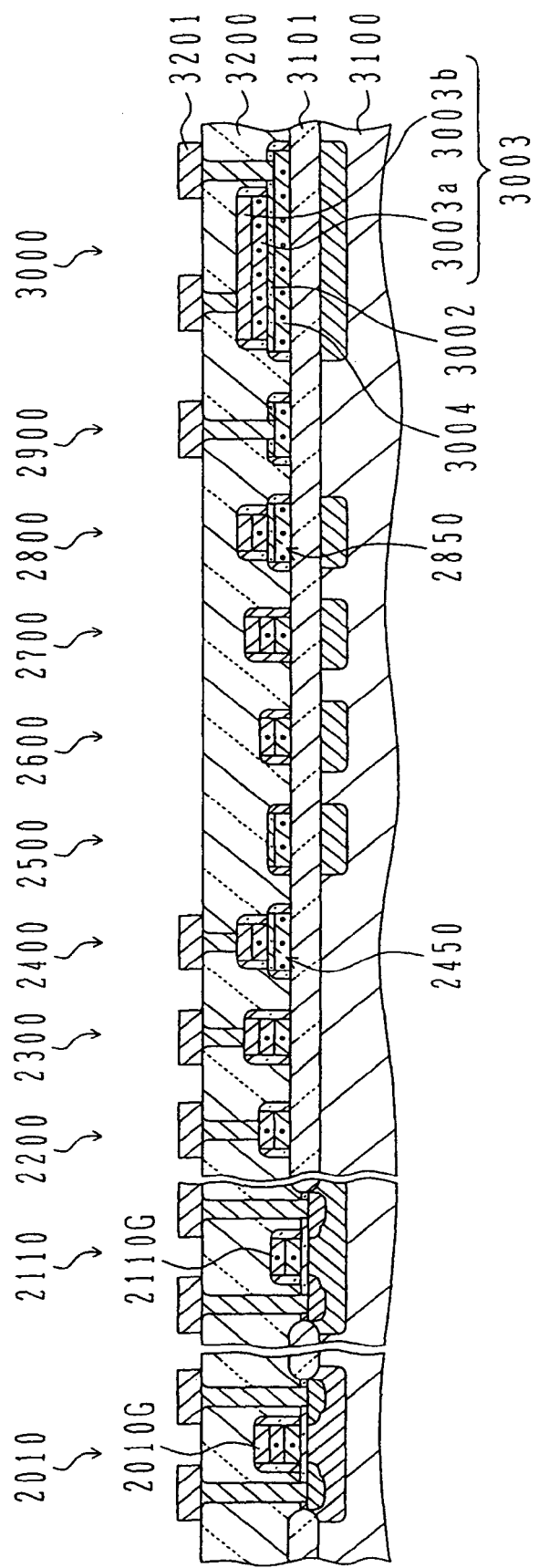
FIG. 25 is a cross sectional view of the semiconductor device of the ninth embodiment.

FIG. 25 is a cross sectional view taken along one-dot chain line A25-A25 shown in FIG. 24. In FIG. 25, the first PMOSFET 2050 and second PMOSFET 2150 are omitted. An element isolating insulating film 3101 partially covers the surface of a semiconductor substrate 3100 of p-type silicon, and a plurality of active regions are defined being surrounded by the element isolation insulating film 3101. Formed in the active regions are the first NMOSFET 2010, first PMOSFET 2050, second NMOSFET 2110 and second PMOSFET 2150. Formed on the element isolation insulating film 3101 are the first to third wiring lines 2200, 2300 and 2400, first to fourth fuses 2500, 2600, 2700 and 2800, resistor 2900 and capacitor 3000.

The first NMOSFET 2010 and first PMOSFET 2050 have the same structures as those of NMOSFET 1050 and PMOSFET 1040 of the third embodiment shown in FIGS. 13 and 14. The second NMOSFET 2110 and second PMOSFET 2150 have the same structures as those of NMOSFET 52 and PMOSFET 42 of the first embodiment shown in FIGS. 1 and 2. The first wiring line 2200 has the same lamination structure as that of the wiring line 70 of the first embodiment, and the second wiring line 2300 has the same lamination structure as that of the wiring line 1070 of the third embodiment. The third wiring line 2400 is disposed on a platform layer 2450. The third and fourth wiring lines 2400 and platform layer 2450 have the same lamination structures as those of the fuse 1030 and platform layer 1035 of the third embodiment shown in FIG. 14.

The first fuse 2500 has the same lamination structure as that of the resistor 1060 of the third embodiment. The second fuse 2600 has the same lamination structure as that of the fuse 20 of the first embodiment shown in FIG. 2. The third fuse 2700 has the same lamination structure as that of the fuse 1020 shown in FIG. 14. The fourth fuse 2800 is disposed on a platform layer 2850. The fourth fuse 2800 and platform layer 2850 have the same lamination structures as those of the fuse 1030 and platform layer 1035 of the third embodiment shown in FIG. 14. The resistor 2900 has the same lamination structure as that of the resistor 1060 of the third embodiment. The capacitor 3000 has the same lamination structure as that of the capacitor 1010 of the third embodiment.

These components are covered with an interlayer insulating film 3200. A plurality of upper level wiring lines 3201 are formed on the interlayer insulating film 3200. The upper level wiring lines 3201 are connected to those components via conductive plugs formed through the interlayer insulating film 3200.

Next, with reference to FIGS. 26A to 26F, description will be made on a method of manufacturing the semiconductor device of the ninth embodiment.

As shown in FIG. 26A, n-type wells 2501, 2601, 2701, 2801 and 3001 are formed in a surface layer of the semiconductor substrate 3100 of p-type silicon in the regions where the first to fourth fuses 2500, 2600, 2700 and 2800 are to be disposed and in the region where the capacitor 3000 is to be disposed. These n-type wells are formed by the same method as that of forming the n-type wells NW1 to NW4 of the first embodiment shown in FIG. 3A.

In the region where the first NMOSFET 2010 is to be disposed and in the region where the second NMOSFET 2110 is to be disposed, p-type wells 2011 and 2111 are formed. In the region where the first and second PMOSFETs 2050 and 2150 (FIG. 24) are to be disposed, n-type wells are formed. These wells are formed by the same method as that of forming the p-type well 55 and n-type well 45 of the first embodiment shown in FIG. 3A. If necessary, impurities are implanted into the channel region of each MOSFET to adjust the threshold value.

The element isolation insulating film 3101 is formed in a partial surface area of the semiconductor substrate 3100. The element isolation insulating film 3101 is formed by the same method as that of forming the element isolation insulating film 5 of the first embodiment shown in FIG. 3A or that of forming the element isolation insulating film 1005 of the third embodiment shown in FIG. 15A. A gate insulating film 1010I is formed on the surface of the active region where the first NMOSFET 2010 is to be disposed, and a gate insulating film 2110I is also formed on the surface of the active region where the second NMOSFET 2110 is to be disposed. Similarly, gate insulating films are formed on the surfaces of the active regions where the first and second PMOSFETs are to be disposed. The gate insulating films are formed by the same method as that of forming the gate insulating films 56 and 46 of the first embodiment shown in FIG. 3A or that of forming the gate insulating films 1050I and 1040I of the third embodiment shown in FIG. 15A.

A first conductive layer 3102 of polysilicon doped with n-type impurities such as phosphorus is formed on the element isolation insulating film 3101 and gate insulating films 2010I and 2110I. A dielectric layer 3103 is formed on the first conductive layer 3102. The first conductive layer 3102 is formed by the same method as that of forming the conductive layer 111 of the first embodiment shown in FIG. 3B or that of forming the first conductive layer 1111 of the third embodiment shown in FIG. 15B. The dielectric layer 3103 is formed by the same method as that of forming the dielectric layer 113 of the first embodiment shown in FIG. 3C or that of forming the dielectric layer 1113 shown in FIG. 15B.

A resist pattern 3104 is formed on a partial surface of the dielectric layer 3103. The resist pattern 3104 covers: the region where the second NMOSFET 2110 is to be disposed; the region (not shown) where the second PMOSFET is to be disposed; the region in which the first wiring line 2200 is to be disposed; the region corresponding to the platform layer 2450 (FIG. 25) of the third wiring line 2400; the region corresponding to the first fuse 2500; the region in which the second fuse 22600 is to be disposed; the region corresponding to the platform layer (FIG. 25) of the fourth fuse 2800; the region corresponding to the resistor 2900; and the region corresponding to the lower electrode of the capacitor 3000. Exposed are the region where the first NMOSFET 2010 is to be disposed, the region corresponding to the second wiring line 2300 and the region corresponding to the third fuse 2700.

By using the resist pattern 3104 as an etching mask, the dielectric layer 3103 is etched. This etching method is the same as that of etching the dielectric layer 113 of the first embodiment shown in FIG. 3E or that of etching the dielectric layer 1113 shown in FIG. 15B. After the dielectric layer 3103 is etched, the resist pattern 3104 is removed.

As shown in FIG. 26B, patterned dielectric layers are therefore left. More specifically, dielectric layers 2112, 2202, 2402, 2502, 2602, 2802, 2902 and 3002 are left in the region where the second NMOSFET 2110 is to be disposed, the region corresponding to the first wiring, the region corresponding to the platform layer of the third wiring line 2400, the regions corresponding to the first and second fuses 2500 and 2600, the region corresponding to the platform layer of the fourth fuse 2800, the region corresponding to the wiring line 2900 and the region corresponding to the lower electrode of the capacitor 3000.

Covering these dielectric layers, a second conductive layer 3105 of n-type polysilicon is formed. The second conductive layer 3105 is formed by the same method as that of forming the second conductive layer 115 of the first embodiment shown in FIG. 3D or that of forming the second conductive layer 1123 of the third embodiment shown in FIG. 15D.

A resist pattern 3106 is formed on a partial surface of the second conductive layer 3105. The resist pattern 3106 covers: the region where the first NMOSFET 2010 and first PMOSFET 2050 (FIG. 24) are to be disposed; the region in which the second wiring line 2300 is to be disposed; and the region in which the third fuse 2700 is to be disposed, and covers the same areas or slightly smaller areas corresponding to the patterned dielectric layers 2402, 2502, 2802, 2902 and 3002.

By using the resist pattern 3106 as an etching mask, the dielectric layer 3105 is etched. The dielectric layers 2112, 2202 and 2602 left at the interface between the first conductive layer 3102 and second conductive layer 3105 are not etched but left as they are. The etching method is the same as that of etching the dielectric layer 115 of the first embodiment shown in FIG. 3E or that of etching the dielectric layer 1123 of the third embodiment shown in FIG. 15D. If an ECR plasma etching system is used, mixed gas of $Cl_2$ and $O_2$ is used as etching gas. For example, the etching conditions are a $Cl_2$ flow rate of 25 sccm, an $O_2$ flow rate of 11 sccm, a pressure of about 2 mTorr (about 0.27 Pa) an RF power of 40 W at 13.56 MHz, a microwave power of 1400 W at 2.45 MHz and an electrode temperature (substrate temperature) of 15 to 20° C.

FIG. 26C shows the state after the second conductive layer 3105 is etched. As shown, over-etch is performed slightly and the surface layer of the first conductive layer 3102 is also etched. Slight over-etch can prevent insufficient etching of the second conductive layer 3103 and can expose the dielectric layers 2112, 2202 and 2602 with good reproductivity. Since the over-etched regions are not associated with component formation, a variation in over-etched depths does not influence the component characteristics.

If the resist pattern 3106 disposed on the patterned dielectric layers 2402, 2502, 2802, 2902 and 3002 is made slightly smaller than the dielectric layers, the borders of the dielectric layers protrude slightly outside of the borders of the upper second conductive layers 3105. Even if these protrusions are formed the later manufacture processes pose no practical problem.

After the second conductive layer 3105 is etched, the resist pattern 3106 is removed. The exposed dielectric layers 2112, 2202 and 2602 are etched and removed. The dielectric layer etching method is the same as that of etching the dielectric layer 113 of the first embodiment shown in FIG. 3E or that of etching the dielectric layer 1113 shown in FIG. 15B.

FIG. 26D shows the state after the exposed dielectric layers are etched and removed. These dielectric layers may be removed before the resist pattern 3106 is removed. However, if the dielectric layers are etched after the resist pattern 3106 is removed, the natural oxide film on the first conductive layer 31001 can be removed so that the adhesion to the upper conductive layer can be improved and the contact resistance can be reduced.

As shown in FIG. 26E, a third conductive layer 3110 of metal or metal silicide is formed on the patterned second conductive layers 3105 and exposed first conductive layer. The method of forming the third conductive layer 3110 is the same as that of forming the third conductive layer 125 of the first embodiment shown in FIG. 3F or that of forming the third conductive layer 1125 of the third embodiment shown in FIG. 15D.

A resist pattern 3111 is formed on a partial surface of the third conductive layer 3110. The resist pattern 3111 covers: the region corresponding to the gate electrode of the first NMOSFET 2010; the region corresponding to the gate electrode of the second NMOSFET 2110; the regions corresponding to the first to third wiring lines 2200, 2300 and 2400; the regions corresponding to the second to first fuses 2600, 2700 and 2800; and the region corresponding to the upper electrode of the capacitor 3000.

By using the resist pattern as an etching mask, the third conductive layer 3110, already patterned second conductive layer 3105, and first conductive layer 3102. The etching method is the same as that of etching the third conductive layer 125, second conductive layer 115 and first conductive layer 111 of the first embodiment shown in FIG. 3G or that of etching the third conductive layer 1125, second conductive layer 1123 and first conductive layer of the third embodiment shown in FIG. 15D. After the etching, the resist pattern 3111 is removed.

As shown in FIG. 26F, in the region where the first fuse 2500 is disposed and in the region where the resistor 2900 is disposed, the patterned dielectric layers 2502 and 2902 function as masks and the first conductive layers 3102 are left under the masks.

In the region where the third wiring line 2400 is disposed, as the etching progresses to the bottom of the second conductive layer 3105 by using the mask pattern 3111 as the etching mask, a portion of the already patterned dielectric layer 2402 is exposed. This dielectric layers 2402 function as masks and the first conductive layer 3102 is etched. Therefore, under the dielectric layers 2402, the first conductive layers 3102 are left. Similarly, in the region where the fourth fuse 2800 is disposed, the first conductive layers 3102 are left under the dielectric layers 2802, and in the region where the capacitor 3000 is disposed, the first conductive layer 3102 is left under the dielectric layer 3002.

Thereafter, similar to the first and third embodiments, the semiconductor device shown in FIG. 25 is formed through the side wall spacer forming process, source/drain high concentration region forming process, interlayer insulating film depositing process, via hole forming process, conductive plug filling process and upper wiring line formed process.

Reverting to FIG. 25, the description continues on the structure of the semiconductor device of the ninth embodiment. Each of the gate electrode 2010G of the first NMOSFET 2010, second wiring line 2300 and third fuse 2700 has a three-layer structure of a lower layer, a middle layer and an upper layer. The lower layer is made of the first conductive layer 3102 deposited by the process of FIG. 26A, the middle layer is made of the second conductive layer 3105 deposited by the process of FIG. 26B, and the upper layer is made of the third conductive layer 3105 by the process of FIG. 26B.

Each of the gate electrode 2110 of the second NMOSFET 2110, first wiring line 2200 and second fuse 2600 has a two-layer structure of a lower layer and an upper layer. The lower layer is made of the first conductive layer, and the upper layer is made of the third conductive layer 3110. The third wiring line 2400, fourth fuse 2800, and the upper electrode 3003 of the capacitor 3000 each have a two-layer structure of a lower layer and an upper layer. The lower layer is made of the second conductive layer and the upper layer is made of the third conductive layer 3110.

The first fuse 2500, resistor 2900 and the lower electrode of the capacitor 3000 each have a single layer structure made of the first conductive layer 3102. The platform layer 2450 of the third wiring line 2400 and the platform layer 2850 of the fourth fuse 2800 has a two-layer structure of a lower layer and an upper layer. The lower layer is made of the first conductive layer 3102 and the upper layer is made of the dielectric layer 3103 deposited by the process of FIG. 26A.

In the ninth embodiment, the fuses of four types having different lamination structures can be formed. It is therefore possible to provide various fuses having different breaking characteristics.

The first to third wiring lines 2200, 2300 and 2400 have the same lamination structures as those of the second to fourth fuses 2600, 2700 and 2800, respectively. These wiring lines are designed, if necessary, to have a plan shape wider than that of the fuses having the same lamination structures, in order to suppress heat generation by excessive current. If the amount of flowing current is small, the wiring lines may have the single layer structure similar to the first fuse 2500. In order to make it easy to break a fuse, the plan shape having a recess similar to the fuse 1220 shown in FIG. 16A.

The three-layer structure like those of the gate electrode 2010G of the first NMOSFET 2010 and the second wiring line 2300 can realize resistance reduction easier than the two-layer structure. In contract, although the two-layer structure like those of the gate electrode 2110G of the second NMOSFET 2110 and the first wiring line 2200 is inferior to the three-layer structure in the term of resistance reduction, it has the advantage that the step is made lower than that of the three-layer structure. What lamination structure is to be adopted, is determined from a necessary conductivity, an allowable step and the like.

In the process shown in FIG. 26E, the first conductive layer 3102 and second conductivity layer 3105 are etched in parallel. For example, after the third conductive layer 3105 is etched, the exposed second conductive layer 3105 left in the region where the capacitor 3000 is to be formed and the exposed first conductive layer 3102 in the region where the second conductive layer 3105 was removed, are etched in parallel. It is therefore preferable that the thicknesses of the first conductive layer 3102 and second conductive layer 3105 are made equal as much as possible. For example, a film thickness difference therebetween is preferable set to several tens % or smaller, or more specifically 20% or smaller than an average film thickness of the first conductive layer 3102 and second conductive layer 3105.

In the region where the third fuse 2700 is to be disposed, after the second conductive layer 3105 is etched, the underlying first conductive layer 33102 is etched. Therefore, although the effects of generally the equal film thickness are small, if a semiconductor device not having the component with the lamination structure like the third fuse 2700 is to be formed, it is very effective that the film thickness of the first conductive layer 3102 is made generally equal to the film thickness of the second conductive layer 3105.

Next, description will be made on the relation among the plan shapes of the resist patterns formed in a plurality of processes.

In the region where the first NMOSFET 2010 is to be disposed, the resist pattern 3106 shown in FIG. 26B covers the region in which the resist pattern 3106 is to be formed. In the process shown in FIG. 26C, the first conductive layer 3102 and second conductive layer 3105 are left in the region where the gate electrode is to be disposed. In the process shown in FIG. 26E, since the resist pattern 3111 covers the region corresponding to the gate electrode, it is possible to leave the gate electrode made of three layers including the first to third conductive layers 3102, 3105 and 3110. Similarly, the second wiring line 2300 and third fuse 2700 have the three-layer structure.

In the region where the second NMOSFET 2110 is to be disposed, the process shown in FIG. 26A covers the region in which the gate electrode is to be disposed, with the resist pattern 3104, and the dielectric layer 2112 is left as shown in FIG. 26B. Since this region is not covered with the resist pattern 3106, the second conductive layer 3105 is removed by the process shown in FIG. 26C. However, since the dielectric layer 2112 is left, the region which becomes the gate electrode of the first conductive layer 3102 will not be over-etched to be left as it is. Therefore, as shown in FIG. 26F, the gate electrode is left which has the two-layer structure of the first conductive layer 3102 and third conductive layer 3110. The first wiring line 2200 and second fuse 2600 also take the two-layer structure.

In the region where the third wiring line 2400 is to be disposed, the process shown in FIG. 26A covers the region corresponding to the platform layer 2450 (FIG. 25) with the resist pattern 3104. Therefore, as shown in FIG. 26D, the second conductive layer 3105 is left on the dielectric layer 3103. Since the process shown in FIG. 26E covers the region corresponding to the third wiring line 2400 with the resist pattern 3111, it is possible to leave the third wiring 2400 on the platform layer, the third wiring having the two-layer structure of the second conductive layer 3105 and third conductive layer 3110. Similarly, the fourth fuse 2800 can take the two-layer structure of the second conductive layer 3105 and third conductive layer 3110.

In the region where the first fuse 2500 is to be disposed, similar to the region where the third wiring line 2400 is to be disposed, the three-layer structure is left as shown in FIG. 26D. Since the process shown in FIG. 26E does not cover the region corresponding to the first fuse 2500 with the resist pattern 3111, the third conductive layer 3110 and second conductive layer 3105 are left. Therefore, the first fuse 2500 takes the single layer structure of the first conductive layer 3102. Similarly, the resistor 2900 also takes the single layer structure.

As described above, a plurality of wiring lines and fuses having different lamination structures can be formed while an increase in the number of photolithography processes is suppressed.

The present invention has been described in connection with the preferred embodiments. The invention is not limited only to the above embodiments. It will be apparent to those skilled in the art that other various modifications, improvements, combinations, and the like can be made.

What we claim are:

1. A method of manufacturing a semiconductor device having at least a capacitor, a fuse and a MOS field effect transistor formed on one surface of a semiconductor substrate, the method comprising:

preparing the semiconductor substrate having an element isolation insulating film and a gate insulating film for the MOS field effect transistor formed on the surface of the semiconductor substrate, the semiconductor substrate including a first conductive layer covering the element isolation insulating film and the gate insulating film, a dielectric layer and a second conductive layer made of a same material as a material of the first conductive layer, stacked in a recited order;

a first patterning step of patterning the dielectric layer and the second conductive layer into a predetermined pattern by using one etching mask, wherein the dielectric layer in an area where the capacitor is to be formed, is left to be a capacitor insulating film of the capacitor, the second conductive layer on the capacitor insulating film is left without etching and the dielectric layer in an area where a first fuse is to be formed, is removed; wherein the first patterning step further leaves the dielectric layer in an area where a second fuse is to be formed, without etching, and leaves also the second conductive layer in the area where the second fuse is to be formed;

a conductive layer forming step of forming a third conductive layer covering the first conductive layer, the dielectric layer and the second conductive layer, the third conductive layer being made of metal or metal silicide being different from a material of the first conductive layer; and a second patterning step of etching each layer over the element isolation insulating film into a predetermined pattern by using one etching mask and utilizing the dielectric layer and the element isolation insulating film as an etching stopper, wherein the second conductive layer on the capacitor insulating film is patterned to be a first upper electrode of the capacitor, the third conductive layer on the first upper electrode is patterned to be a second upper electrode of the capacitor, the first conductive layer under the capacitor insulating film is left to be a lower electrode of the capacitor, the first conductive layer in an area where the first fuse is to be formed, is left to be a first soluble layer of the first fuse, and the third conductive layer on the first soluble layer is left to be a second soluble layer of the first fuse, wherein the second patterning step further patterns the second conductive layer left in the area where the second fuse is to be formed, to be a first soluble layer of the second fuse, and patterns the third conductive layer on the first soluble layer to be a second soluble layer of the second fuse, using the dielectric layer as an etching stopper.

2. The method of manufacturing a semiconductor device according to claim 1, wherein the first and second conductive layers are made of polysilicon.

3. A method of manufacturing a semiconductor device having at least a capacitor, a fuse and a MOS field effect transistor formed on one surface of a semiconductor substrate, the method comprising:

a preparing step of preparing the semiconductor substrate having an element isolation insulating film and a gate insulating film for the MOS field effect transistor formed on the surface of the semiconductor substrate, the semiconductor substrate including a first conductive layer covering the element isolation insulating film and the gate insulating film, a dielectric layer and a second conductive layer made of a same material as a material of the first conductive layer, stacked in a recited order;

a first patterning step of patterning the dielectric layer and the second conductive layer into a predetermined pattern by using one etching mask, wherein the dielectric layer in an area where the capacitor is to be formed, is left to be a capacitor insulating film of the capacitor, the second conductive layer on the capacitor insulating film is left without etching, the dielectric layer in an area where a first fuse is to be formed, is left without etching, and the second conductive layer in the area where the first fuse is to be formed, is left without etching;

a conductive layer forming step of forming a third conductive layer covering the first conductive layer, the dielectric layer and the second conductive layer, the third conductive layer being made of metal or metal silicide being different from a material of the first conductive layer; and a second patterning step of etching each layer over the element isolation insulating film into a predetermined pattern by using one etching mask and utilizing the dielectric layer and the element isolation insulating layer as an etching stopper, wherein the second conductive layer on the capacitor insulating film is patterned to be a first upper electrode of the capacitor, the third conductive layer on the first upper electrode is patterned to be a second upper electrode of the capacitor, the first conductive layer under the capacitor insulating film is left to be a lower electrode of the capacitor, the second conductive layer in the area where the first fuse is to be formed, is patterned to be a first soluble layer of the first fuse, and the third conductive layer on the first soluble layer is left to be a second soluble layer of the first fuse.

4. The method of manufacturing a semiconductor device according to claim 3, wherein:

the first patterning step further removes the second conductive layer and the dielectric layer in an area where a second fuse is to be formed; and the second patterning step further leaves the first conductive layer in the area where the second fuse is to be formed to be a first soluble layer of the second fuse, and leaves the third conductive layer on the first soluble layer to be a second soluble layer of the second fuse.

5. The method of manufacturing a semiconductor device according to claim 3, wherein the first and second conductive layers are made of polysilicon.

* * * * *